United States Patent
Mizukami et al.

(10) Patent No.: US 8,410,545 B2
(45) Date of Patent: Apr. 2, 2013

(54) SEMICONDUCTOR MEMORY AND METHOD OF MANUFACTURING THE SAME

(75) Inventors: Makoto Mizukami, Kawasaki (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 413 days.

(21) Appl. No.: 12/710,172

(22) Filed: Feb. 22, 2010

(65) Prior Publication Data

US 2010/0187594 A1 Jul. 29, 2010

Related U.S. Application Data

(63) Continuation of application No. PCT/JP2008/065039, filed on Aug. 22, 2008.

(30) Foreign Application Priority Data

Aug. 22, 2007 (JP) .................................. 2007-216323

(51) Int. Cl.
 *H01L 29/66* (2006.01)
(52) U.S. Cl. . 257/329; 257/328; 257/621; 257/E21.377; 257/E29.118
(58) Field of Classification Search .................. 257/288, 257/327, 328, 329, 330, 618, 621, 622, 623, 257/E29.118, E21.377
See application file for complete search history.

(56) References Cited

U.S. PATENT DOCUMENTS

| | | | |
|---|---|---|---|
| 7,423,310 B2 * | 9/2008 | Verhoeven .................... | 257/308 |
| 7,432,561 B2 | 10/2008 | Mizukami et al. | |
| 7,459,748 B2 | 12/2008 | Shirota et al. | |
| 7,560,759 B2 * | 7/2009 | Kang et al. .................... | 257/288 |
| 2005/0124120 A1 * | 6/2005 | Du et al. ....................... | 438/283 |
| 2007/0132006 A1 | 6/2007 | Matsuzawa | |
| 2007/0158736 A1 | 7/2007 | Arai et al. | |
| 2008/0073695 A1 | 3/2008 | Mizukami et al. | |
| 2011/0032762 A1 | 2/2011 | Watanabe et al. | |

FOREIGN PATENT DOCUMENTS

| | | |
|---|---|---|
| JP | 4-113655 | 4/1992 |
| JP | 2000-174241 | 6/2000 |
| JP | 2005-243709 | 9/2005 |
| JP | 2006-93215 | 4/2006 |
| JP | 2006-155750 | 6/2006 |
| JP | 2007-110029 | 4/2007 |
| JP | 2007-158232 | 6/2007 |
| JP | 2007-180389 | 7/2007 |

* cited by examiner

*Primary Examiner* — Eduardo A Rodela

(74) *Attorney, Agent, or Firm* — Oblon, Spivak, McClelland, Maier & Neustadt, L.L.P.

(57) ABSTRACT

A semiconductor memory includes a semiconductor substrate, a buried insulating film formed on a part of an upper surface of the semiconductor substrate, and a semiconductor layer formed on another part of the upper surface of the semiconductor substrate. Each of the memory cell transistors comprises a first-conductivity-type source region, a first-conductivity-type drain region, and a first-conductivity-type channel region arranged in the semiconductor layer in the column direction, and a gate portion formed on a side surface of the channel region in the row direction.

14 Claims, 47 Drawing Sheets

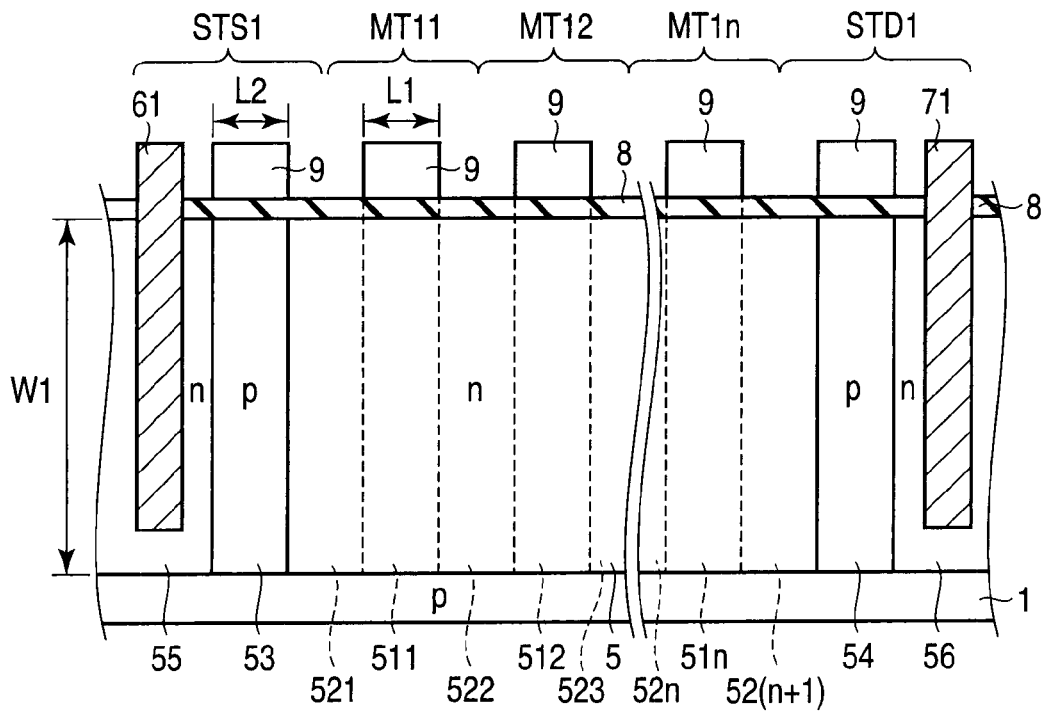
F I G. 2
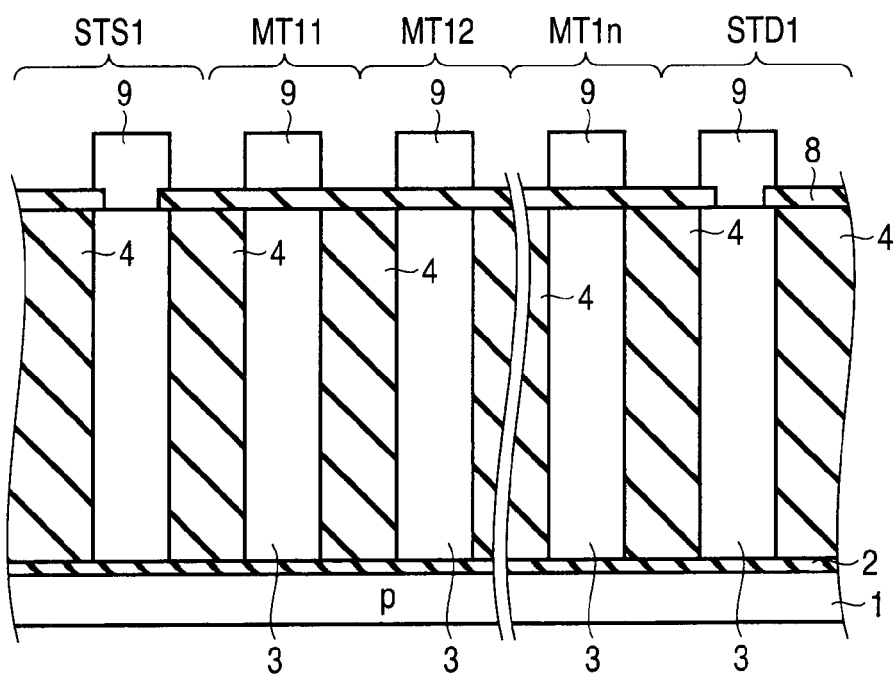
F I G. 3

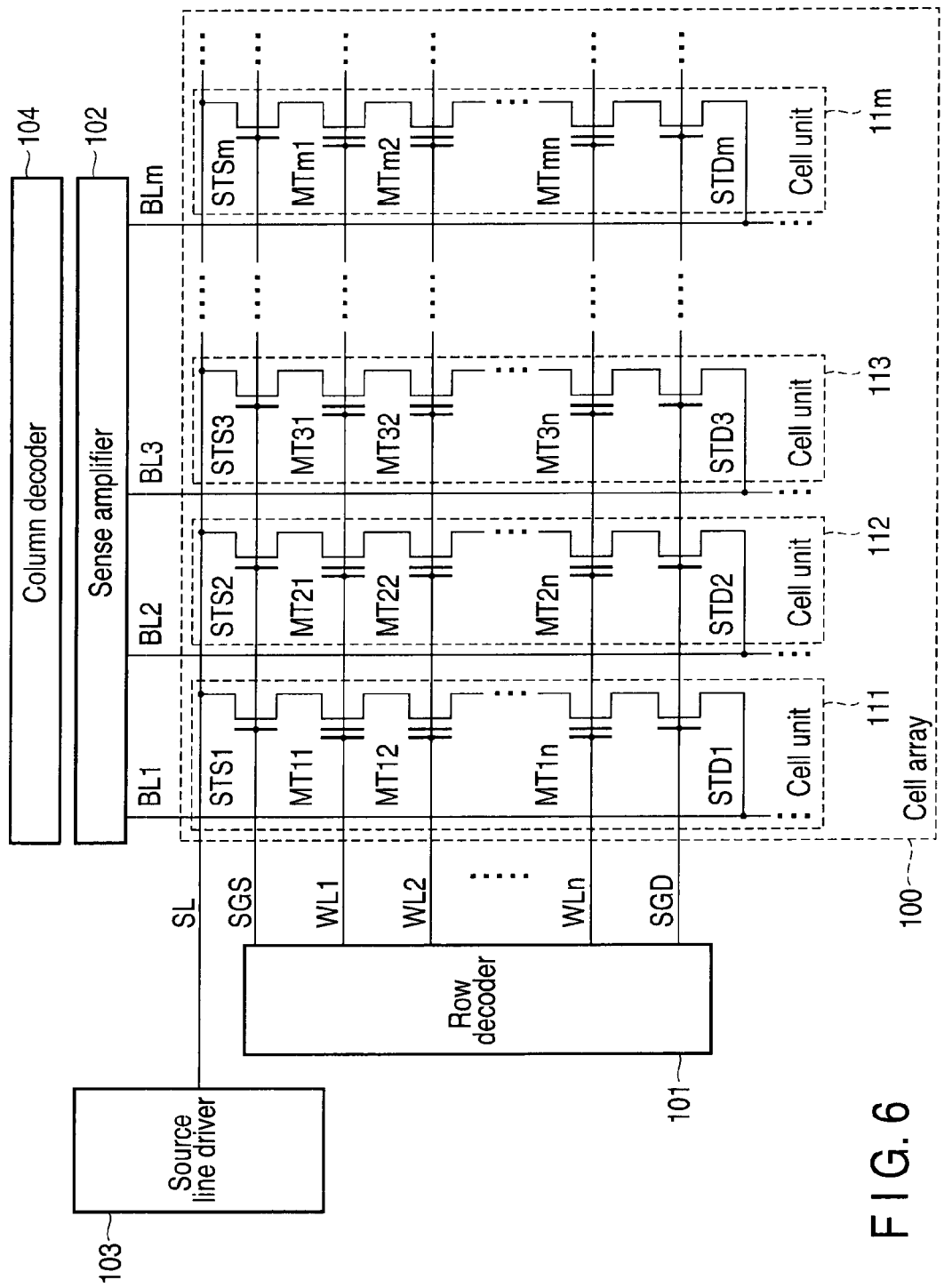
F I G. 6

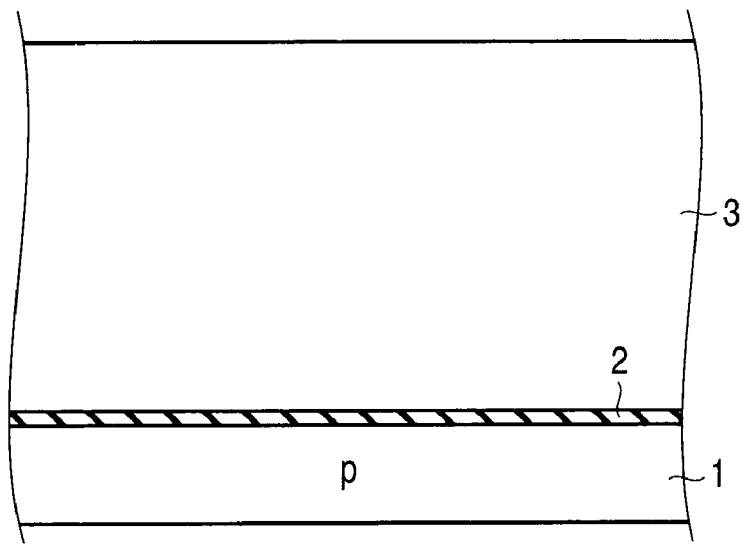
F I G. 9A
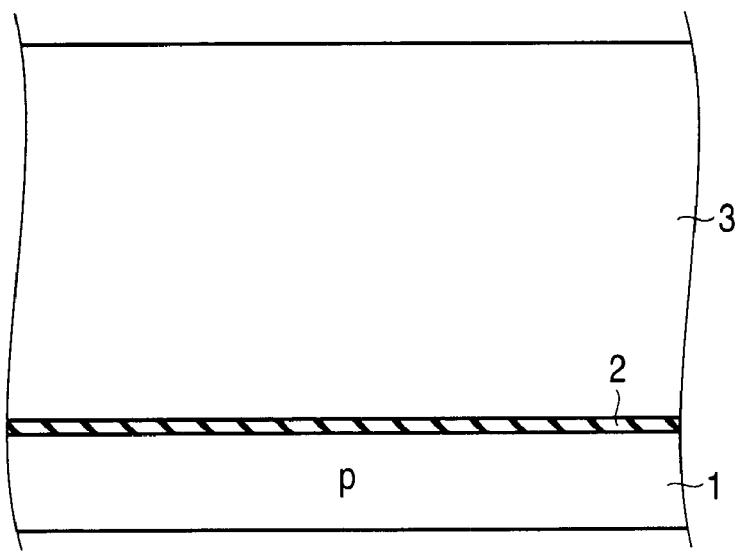
F I G. 9B

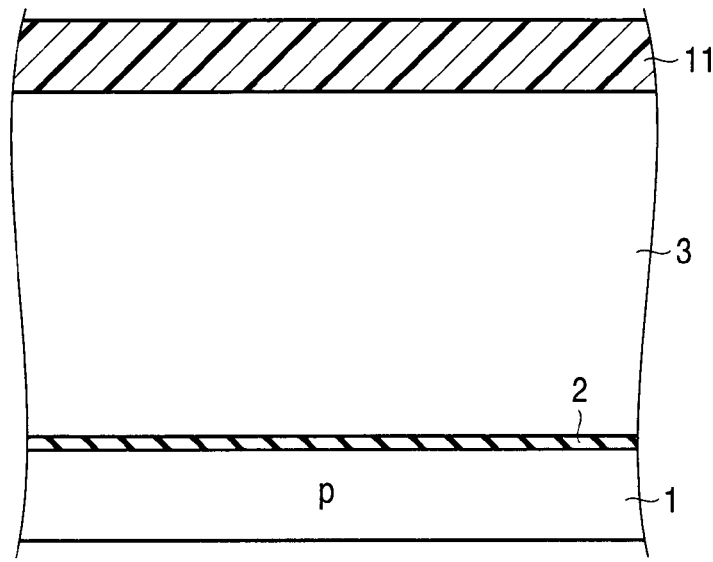
F I G. 10A
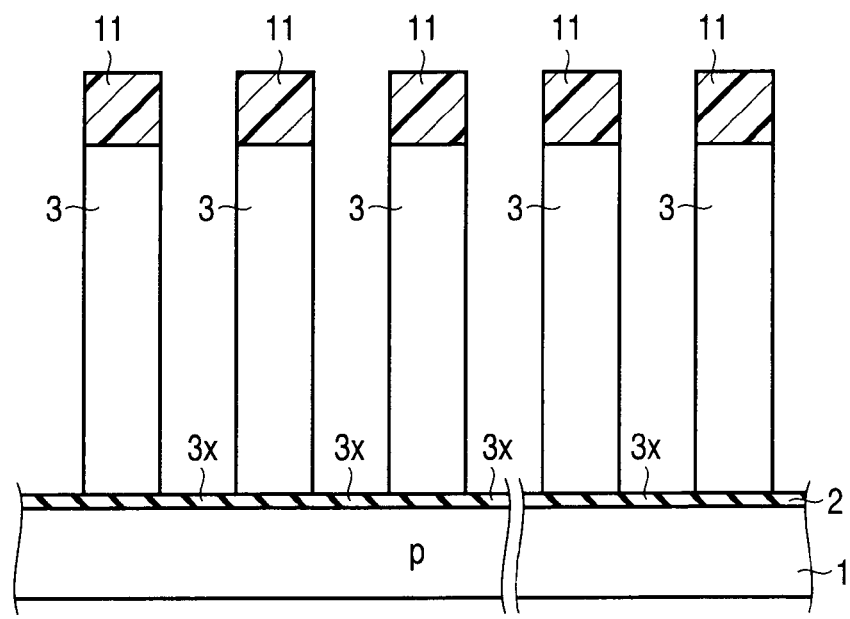
F I G. 10B

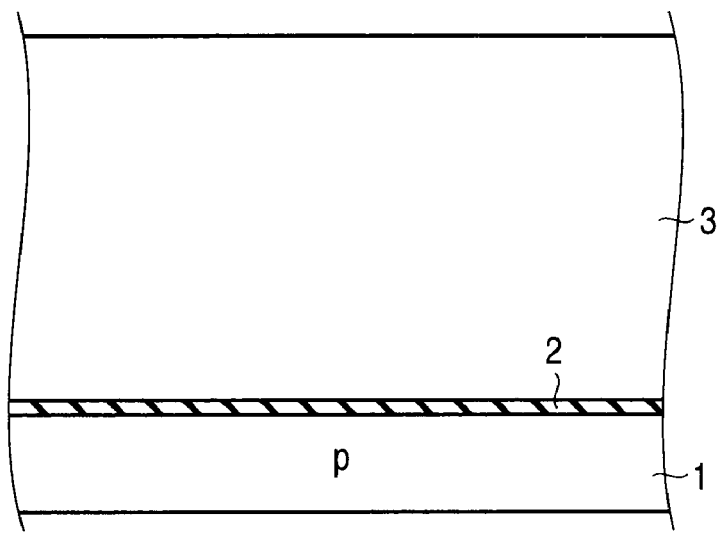
F I G. 11A
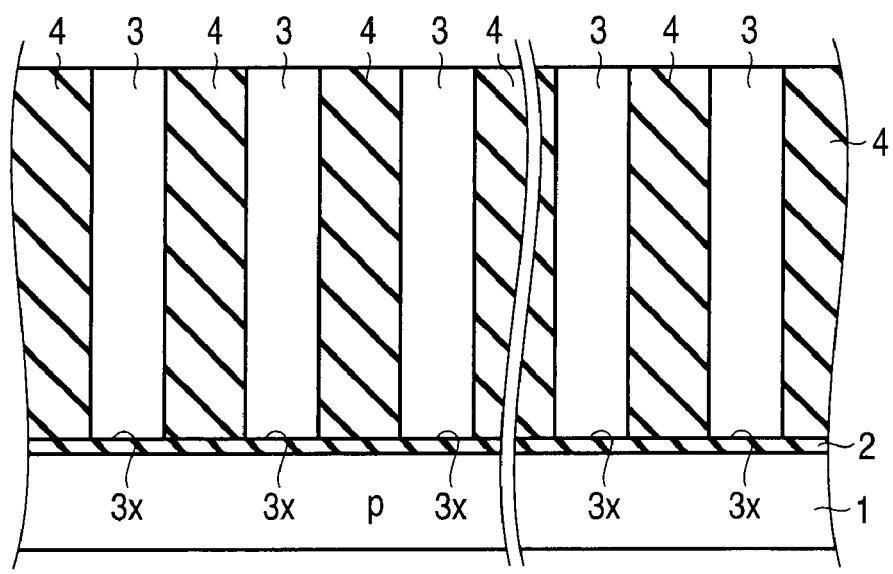
F I G. 11B

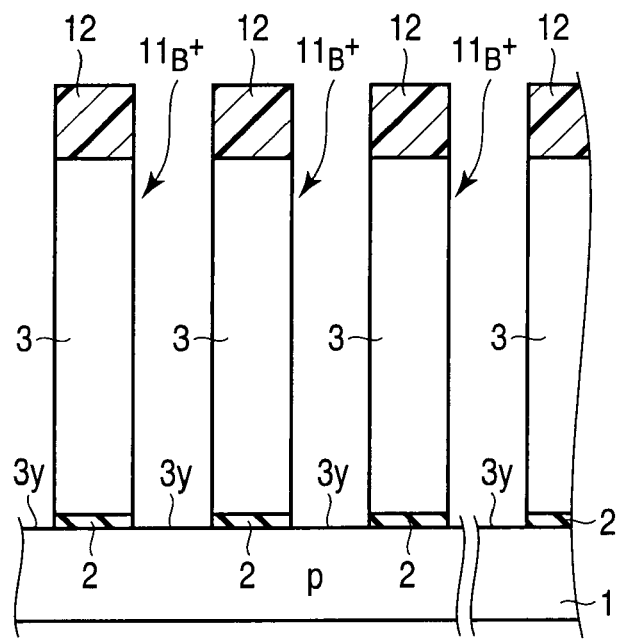
F I G. 13A
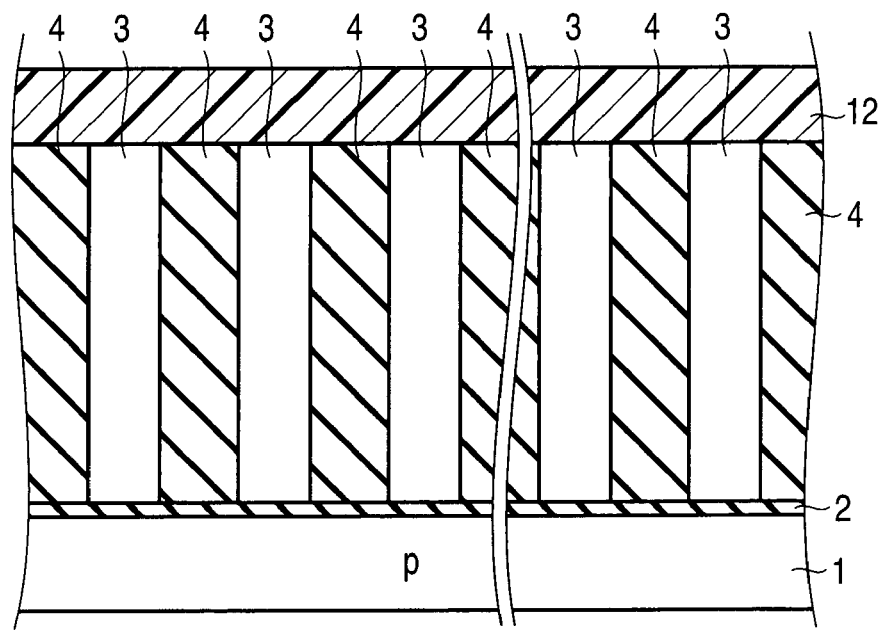
F I G. 13B

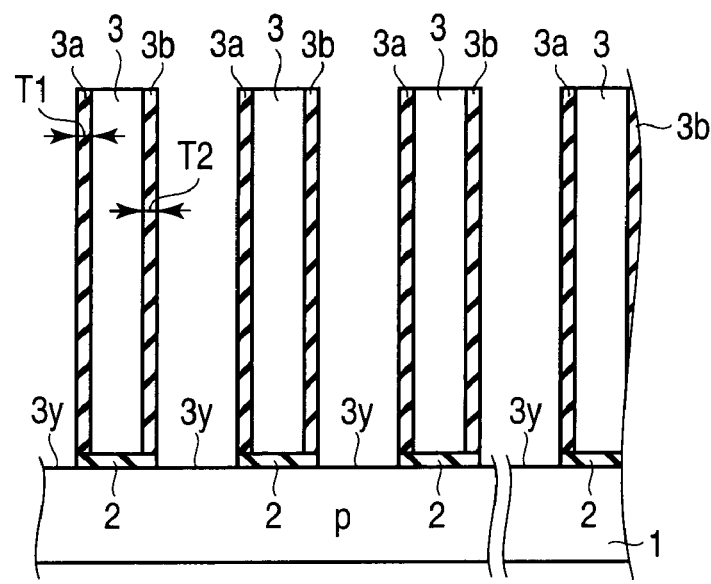
F I G. 14A
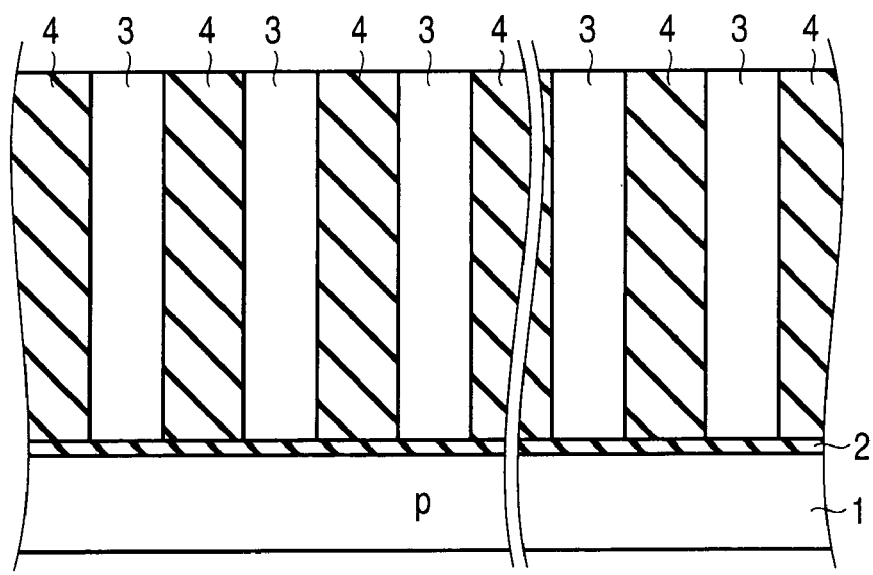
F I G. 14B

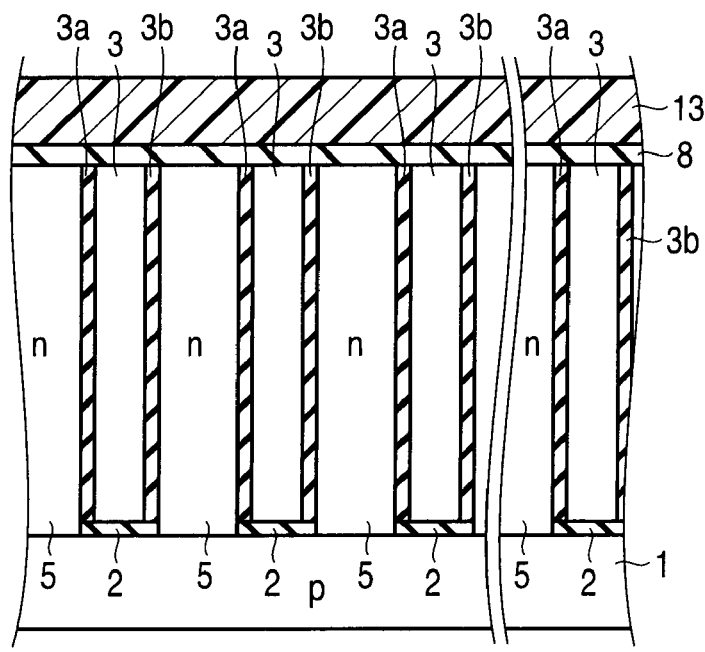
F I G. 16A
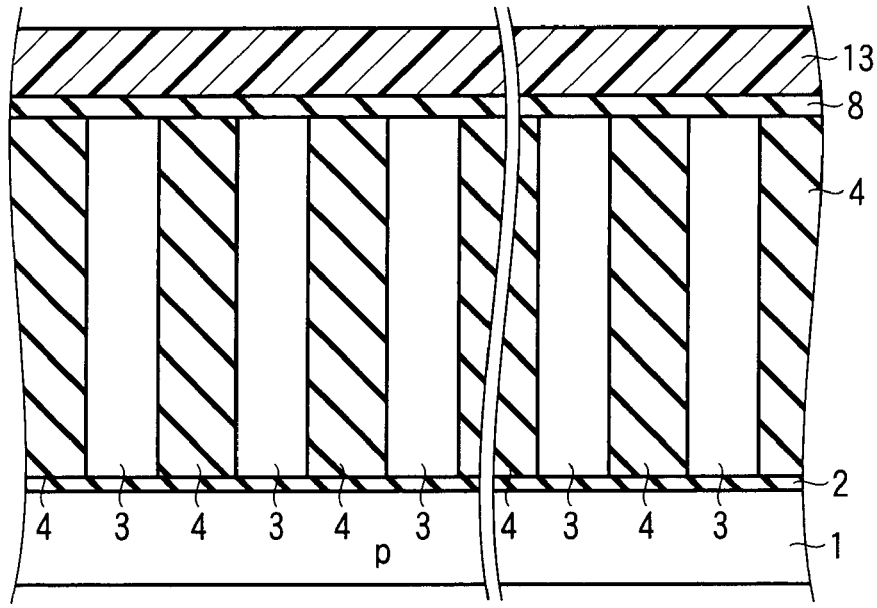
F I G. 16B

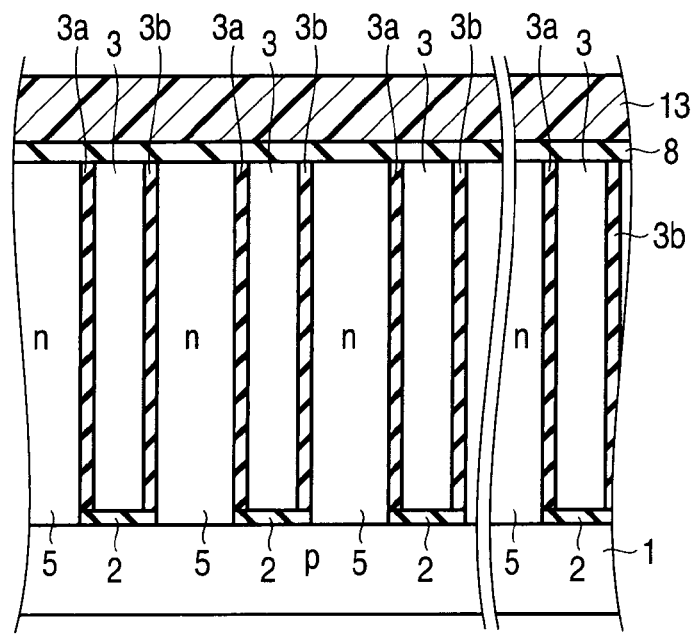
F I G. 17A
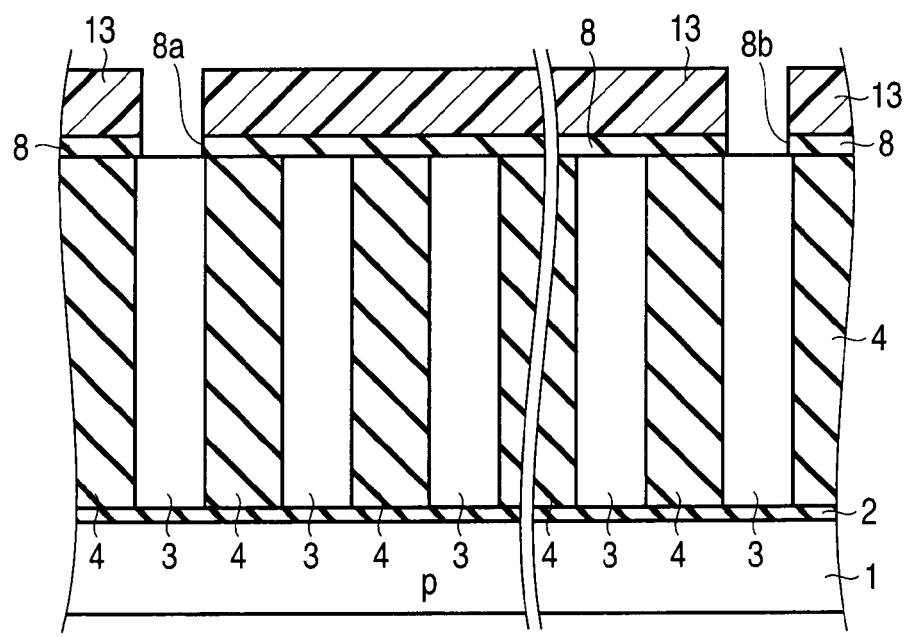
F I G. 17B

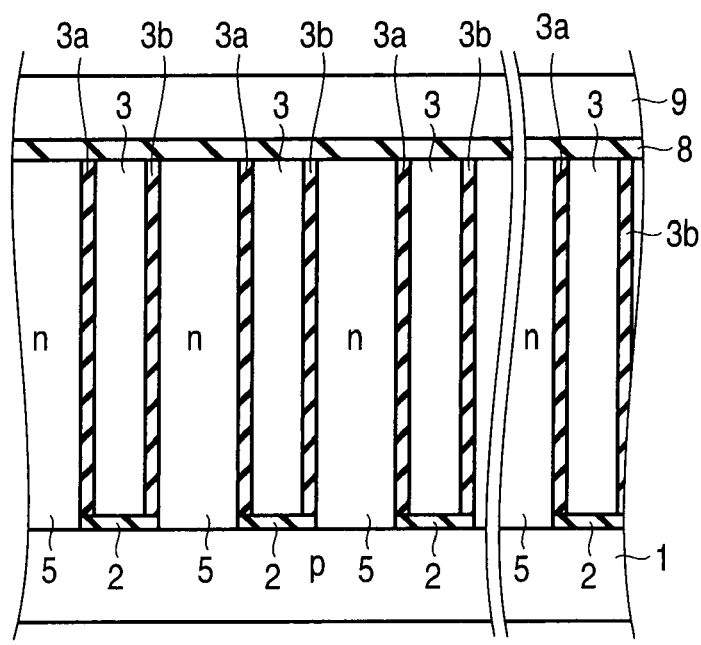
F I G. 18A
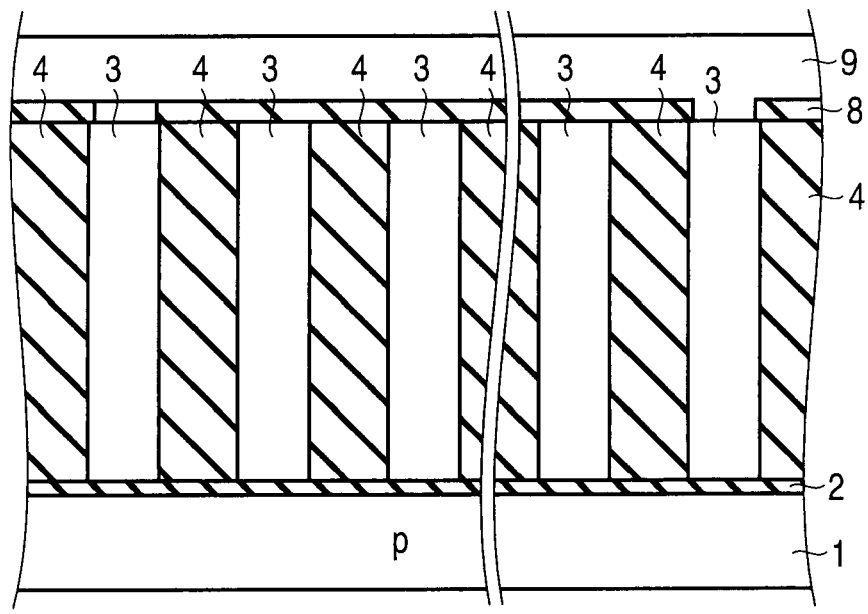
F I G. 18B

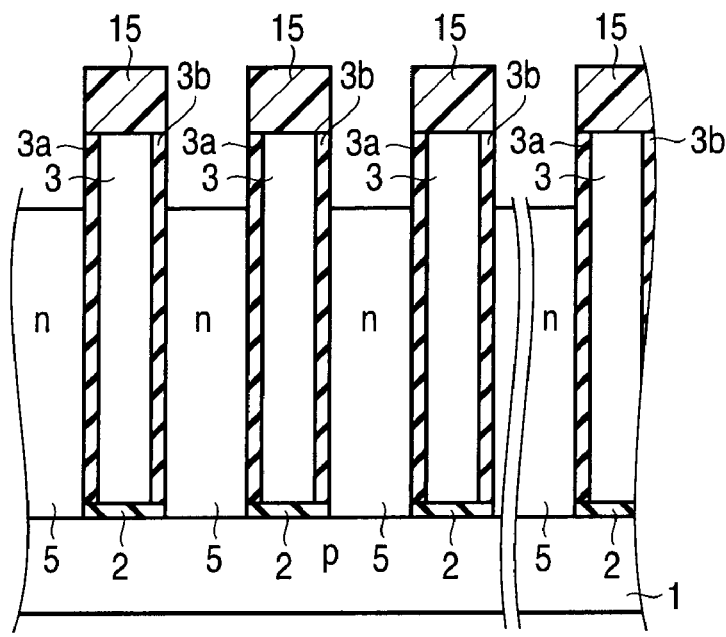
F I G. 20A
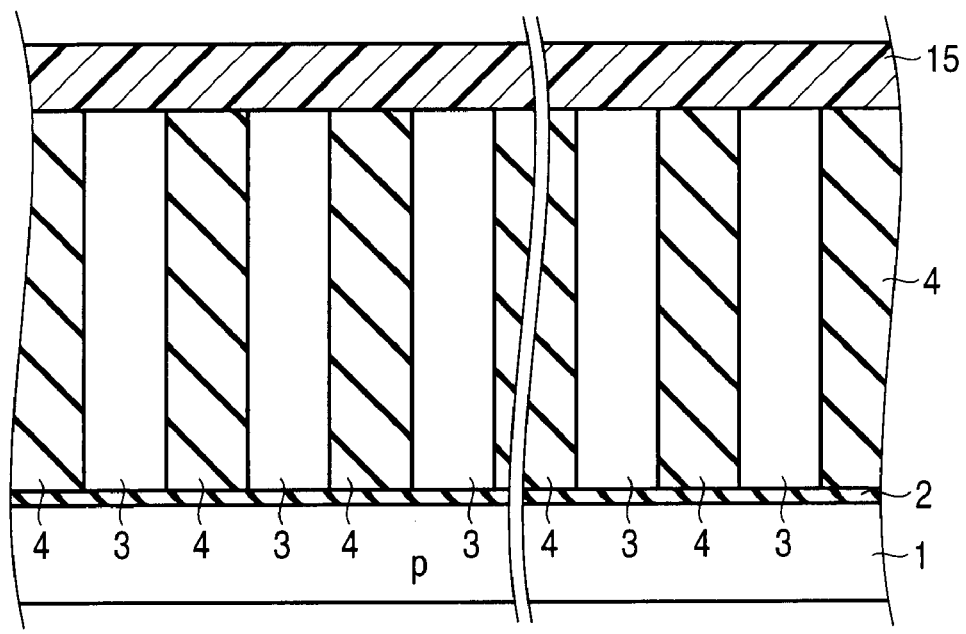
F I G. 20B

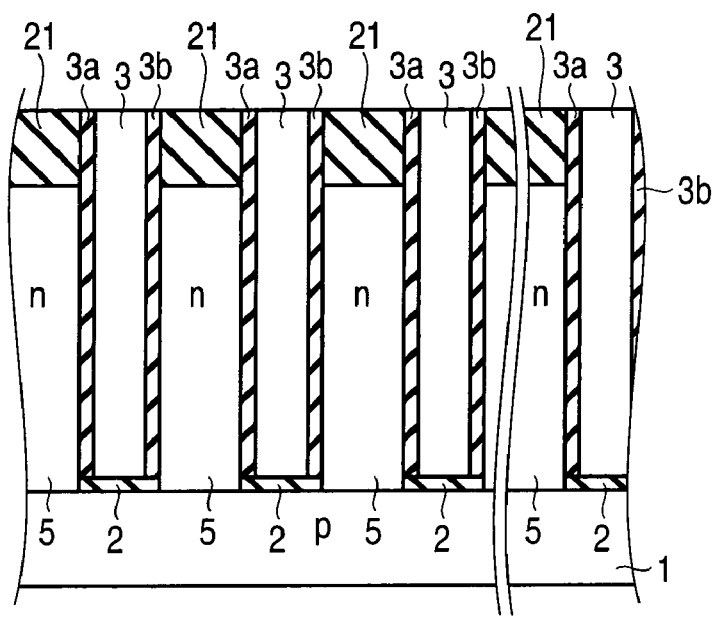
F I G. 21A
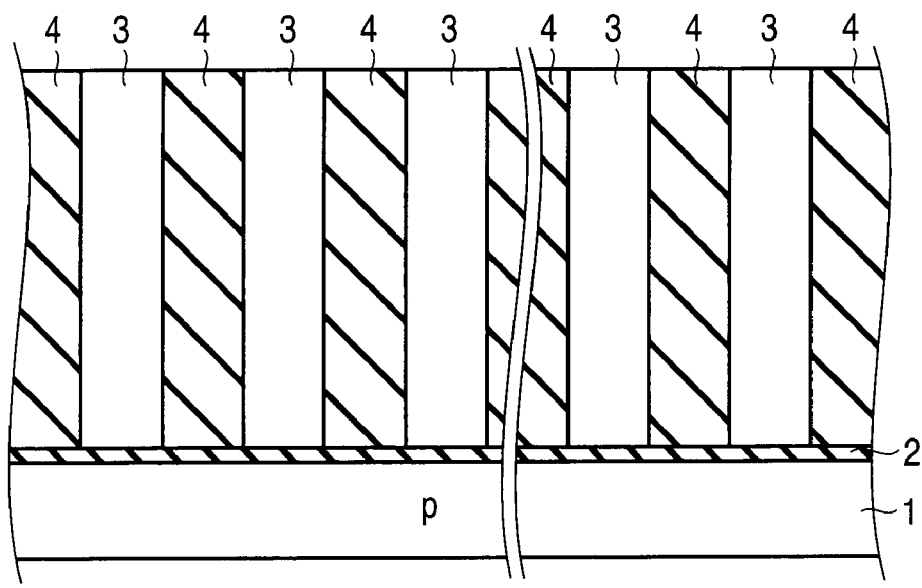
F I G. 21B

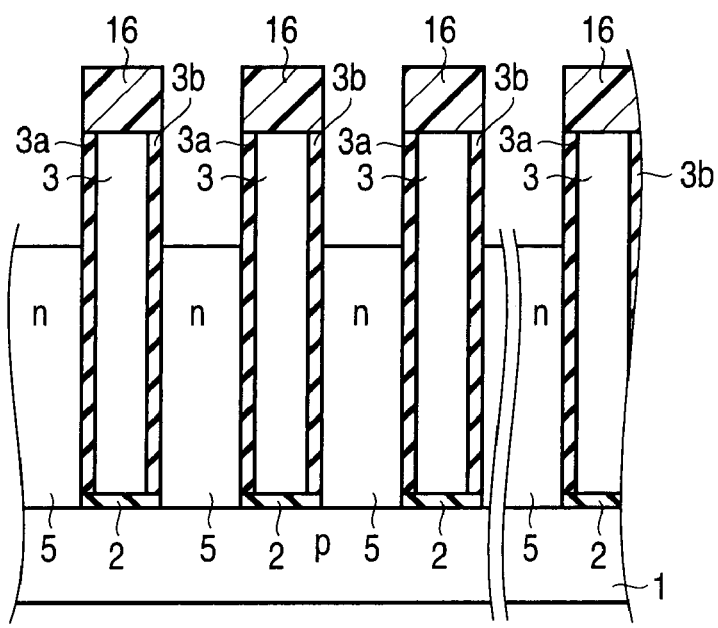
F I G. 23A
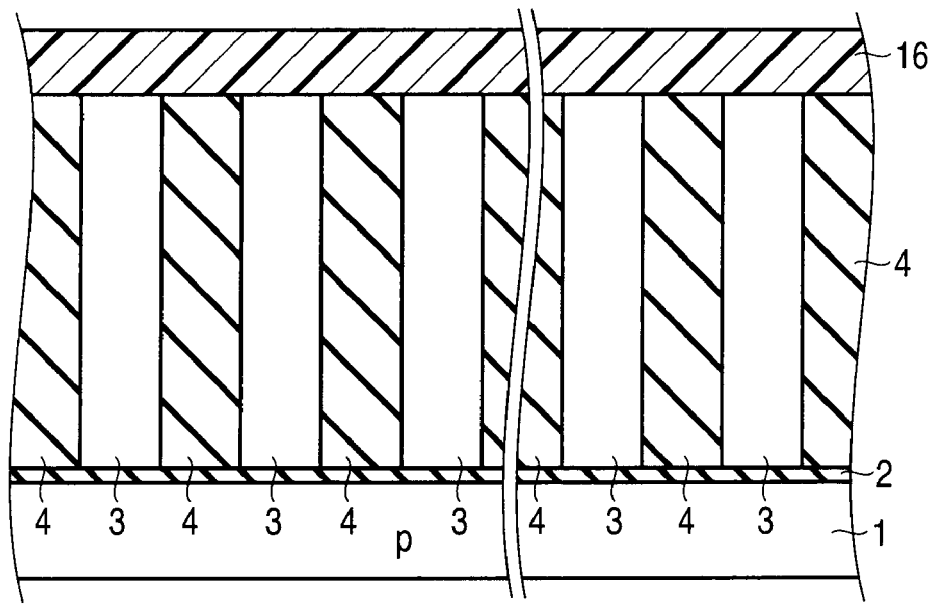
F I G. 23B

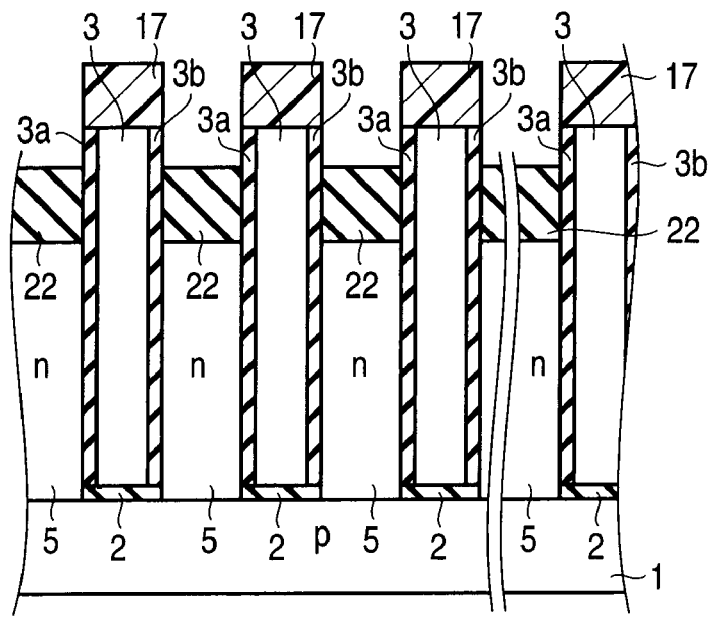
F I G. 24A
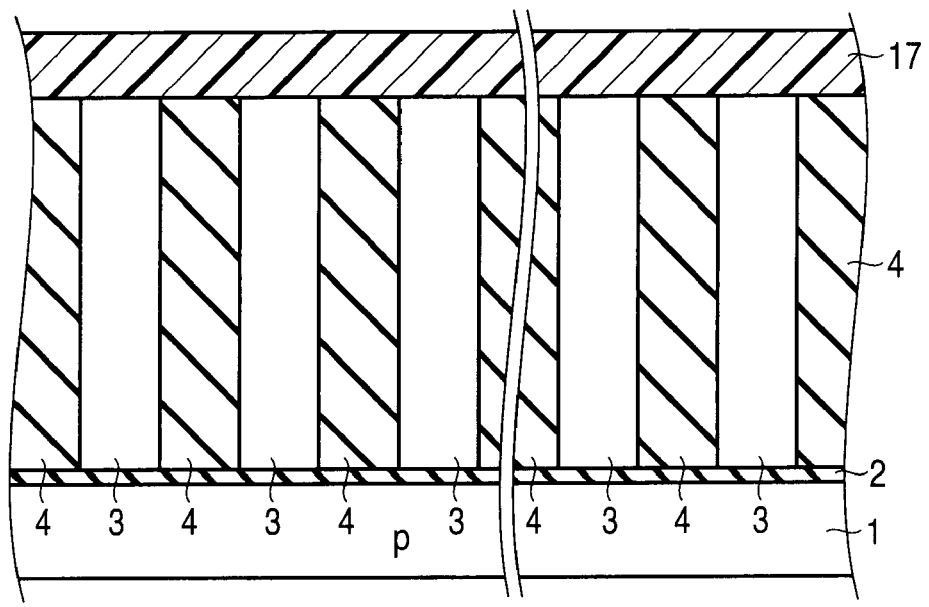
F I G. 24B

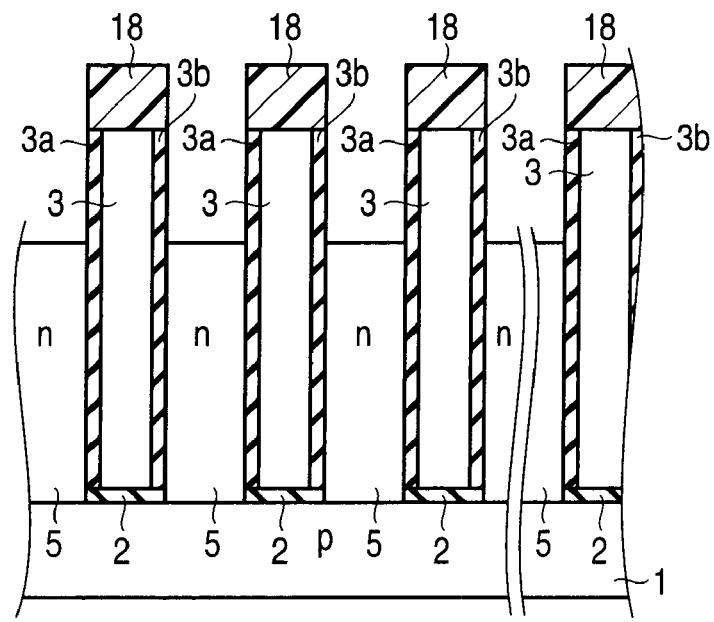
F I G. 26A
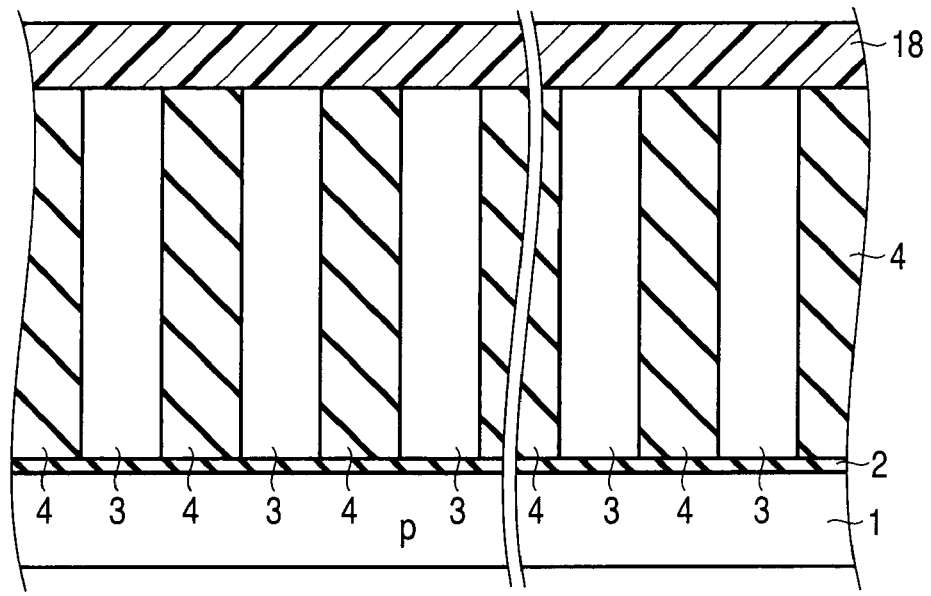
F I G. 26B

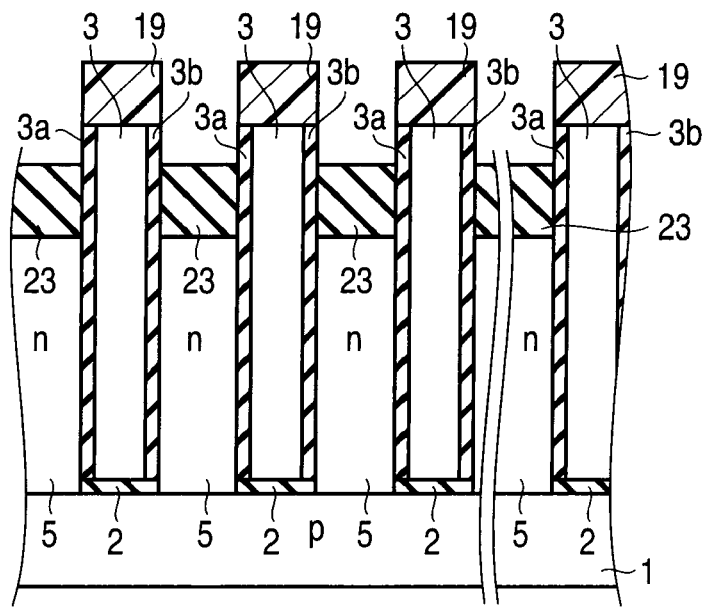
F I G. 27A
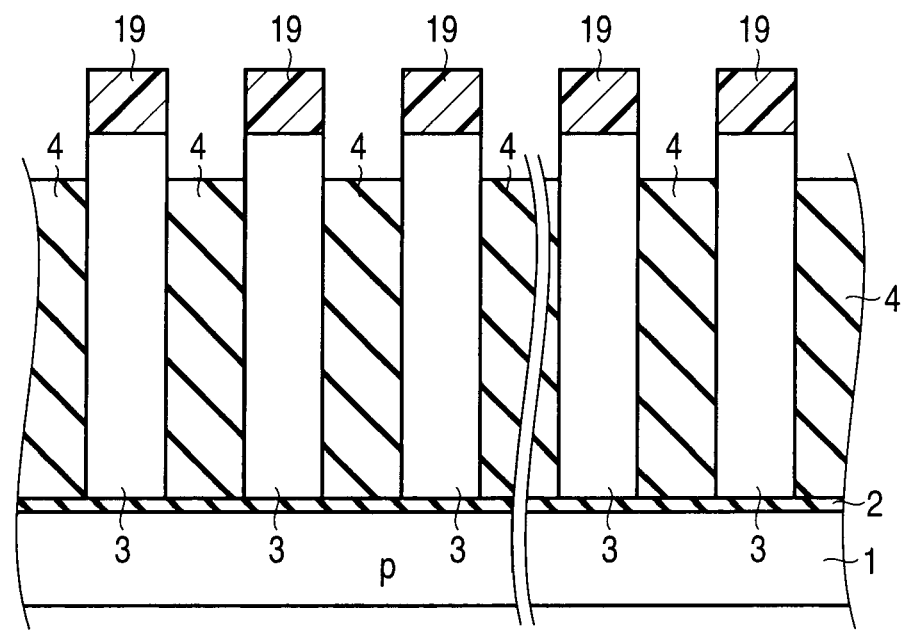
F I G. 27B

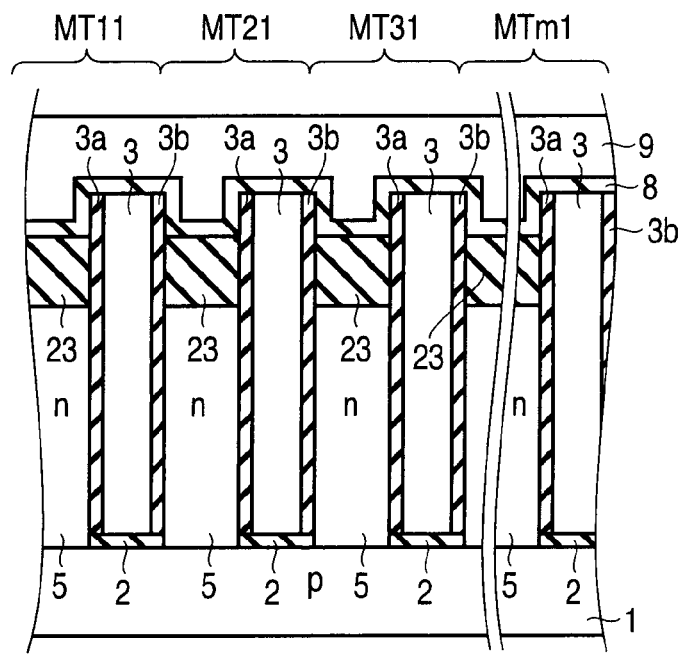
F I G. 28A
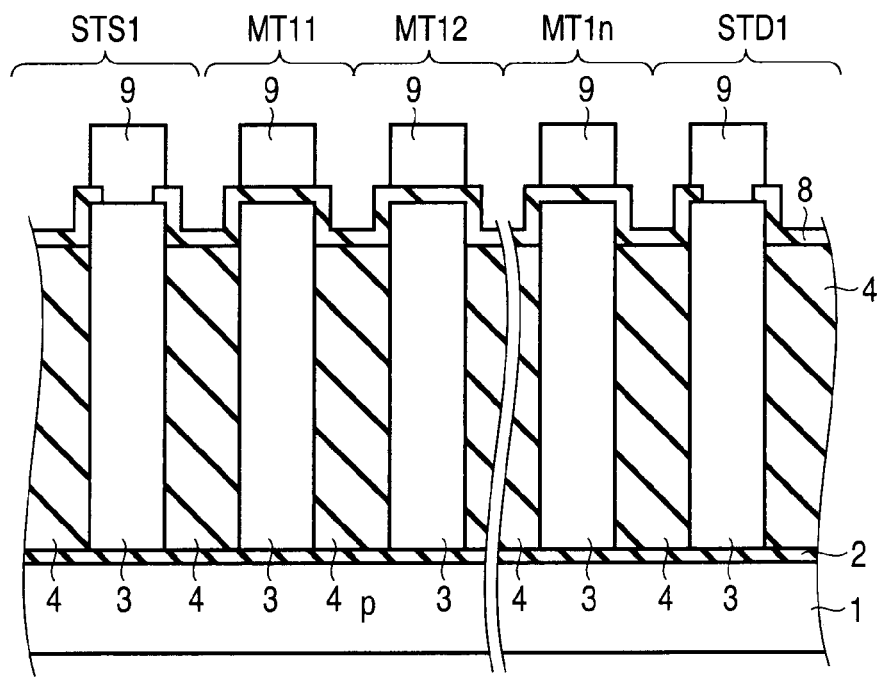
F I G. 28B

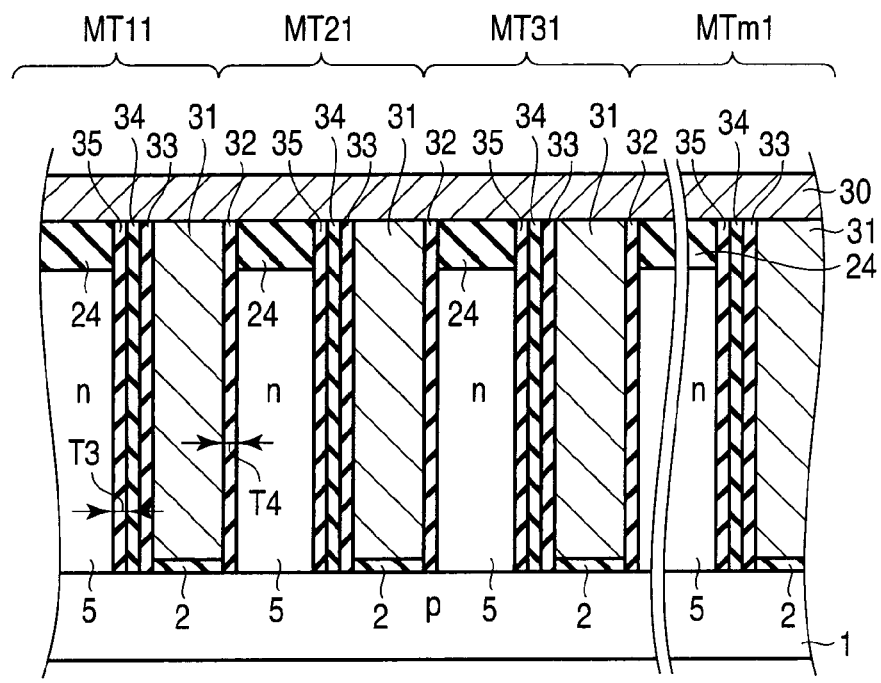
F I G. 30A
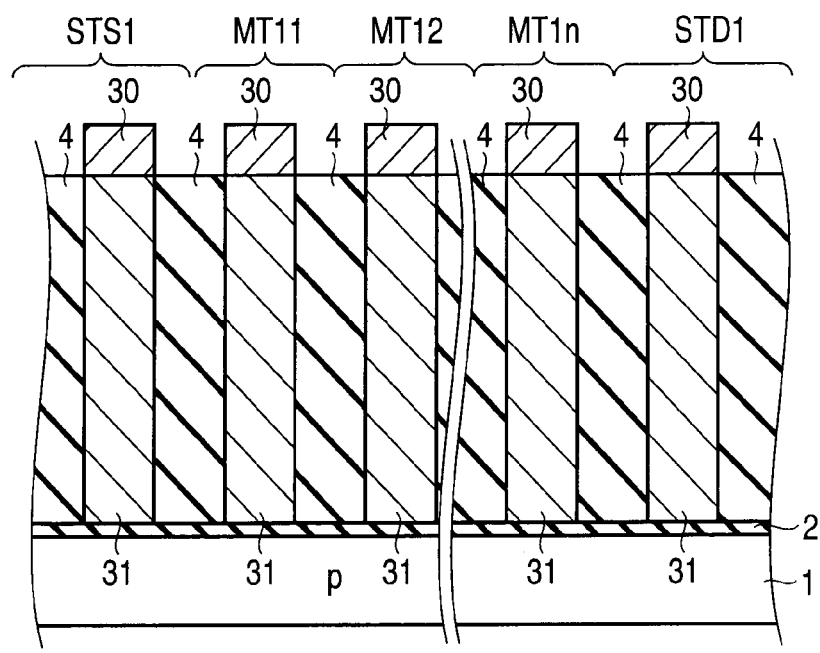
F I G. 30B

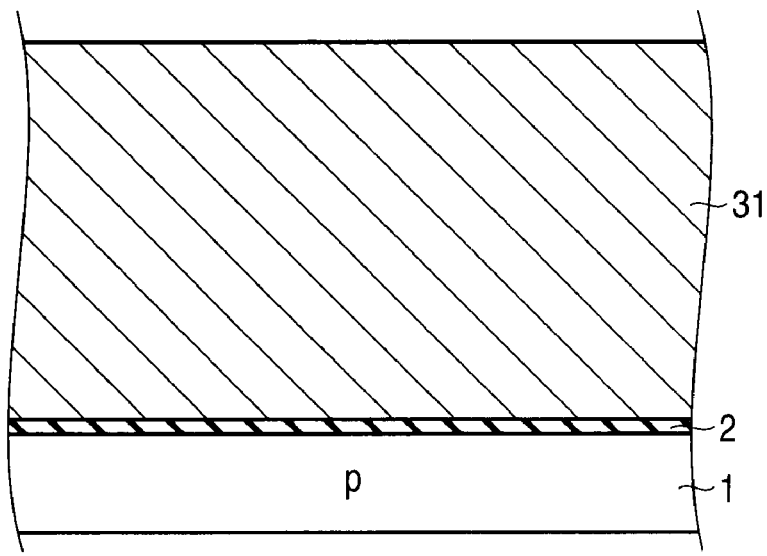
F I G. 31A
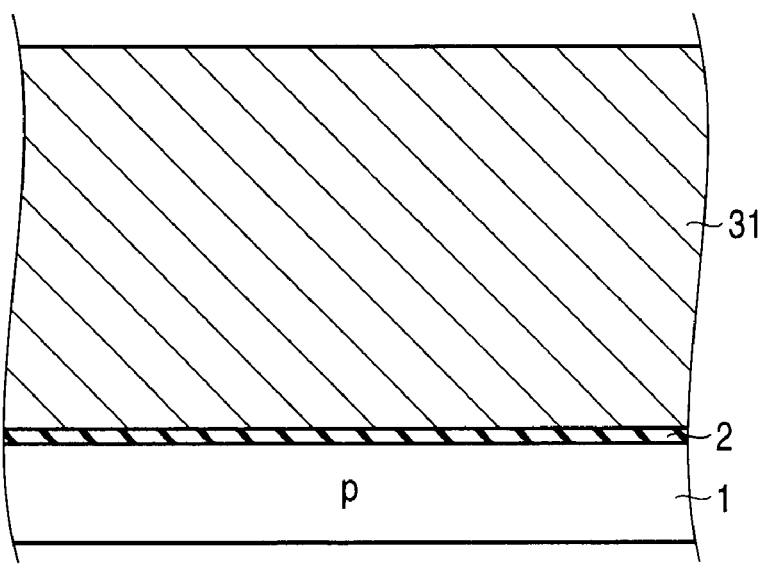
F I G. 31B

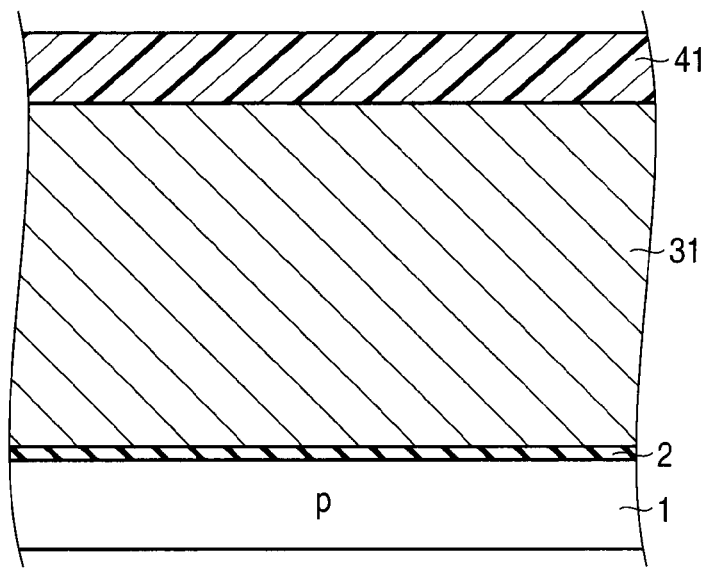
F I G. 32A
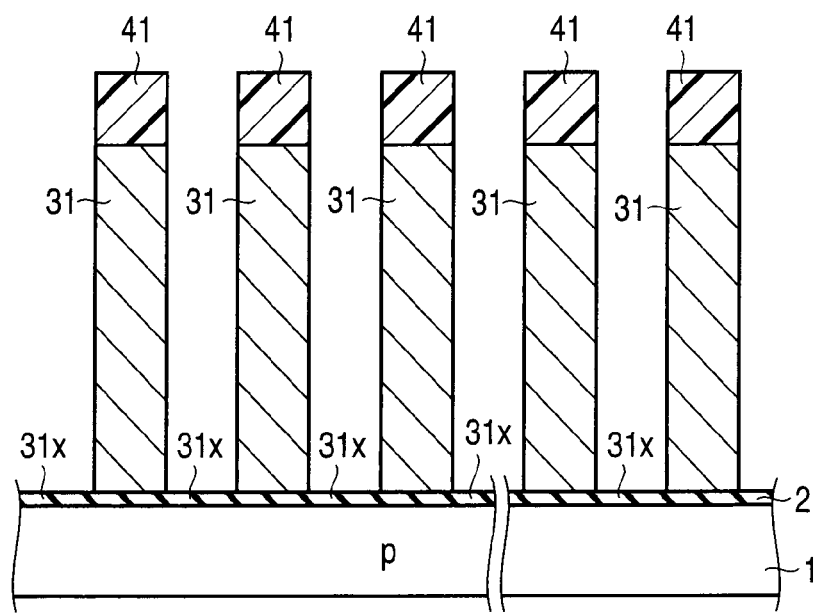
F I G. 32B

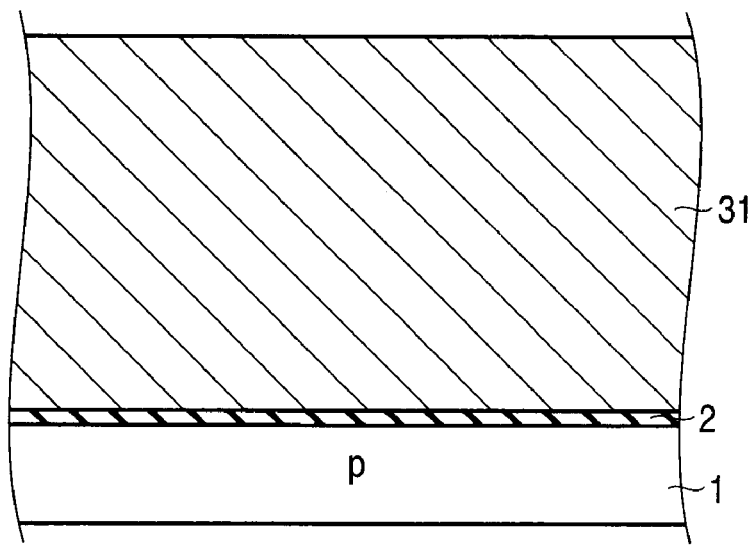
F I G. 33A
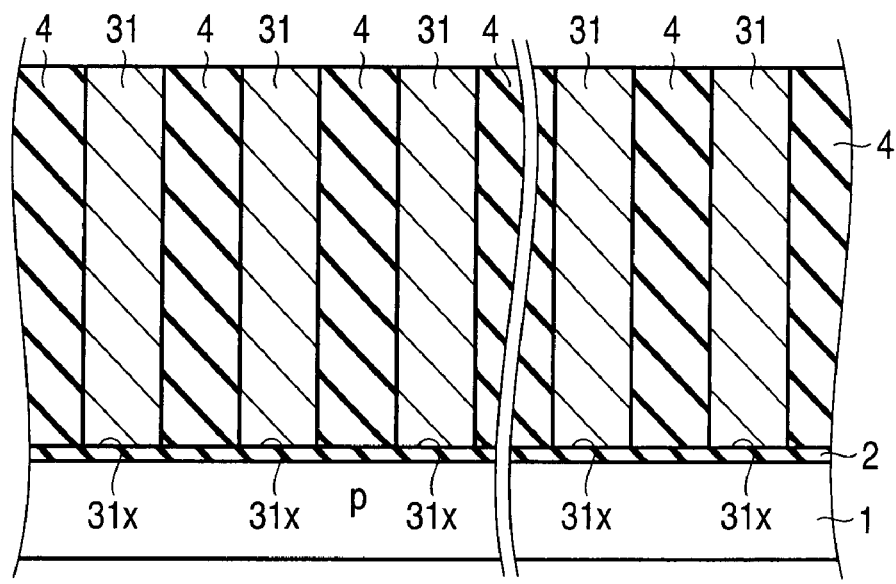
F I G. 33B

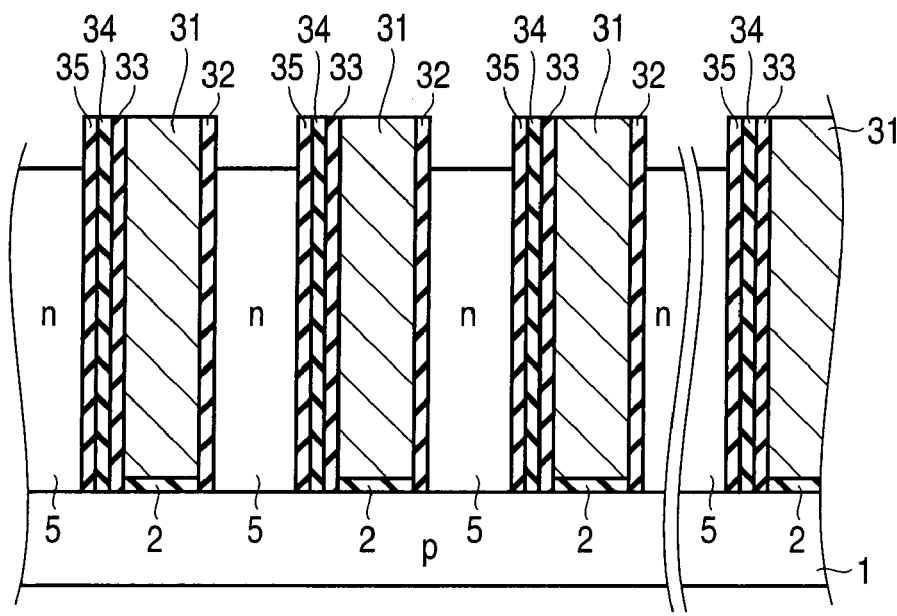
F I G. 36A
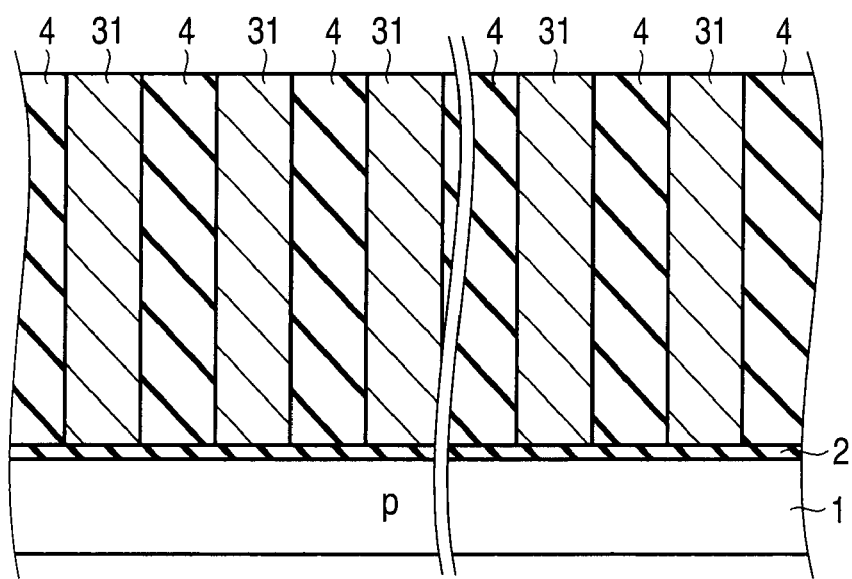
F I G. 36B

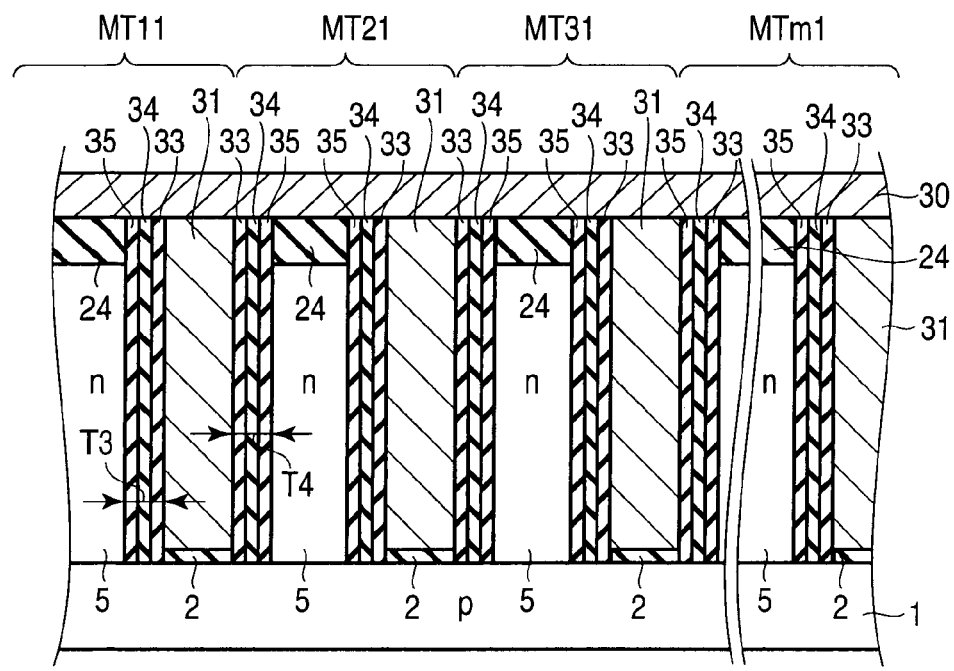
F I G. 39A
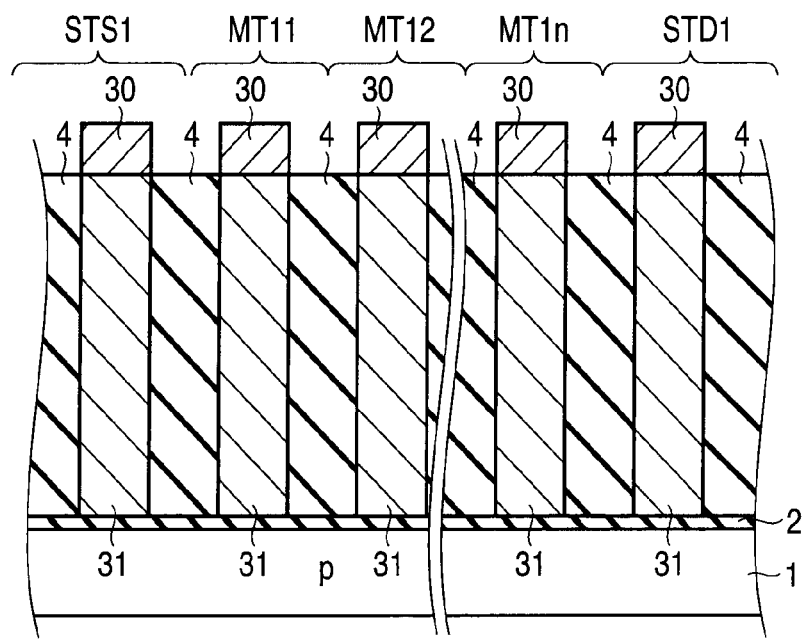
F I G. 39B

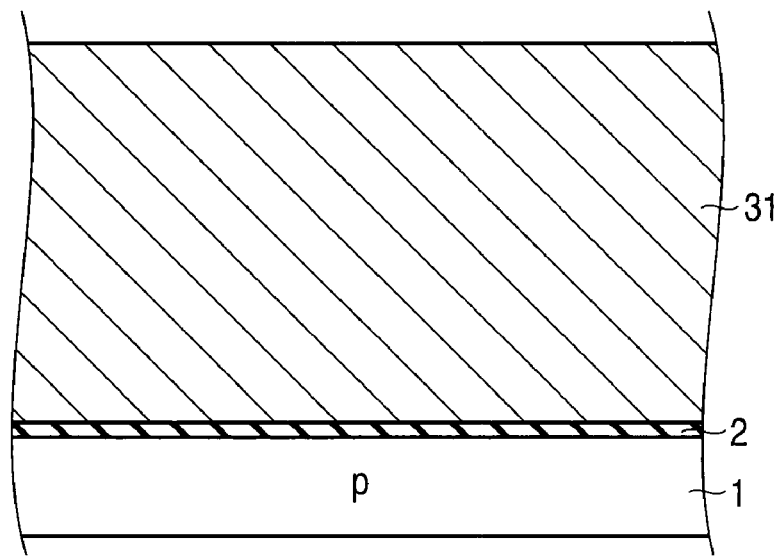
F I G. 40A
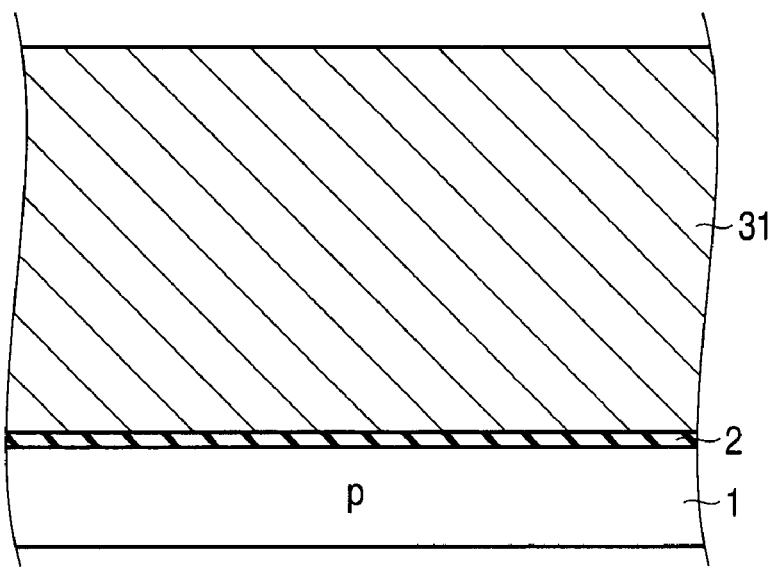
F I G. 40B

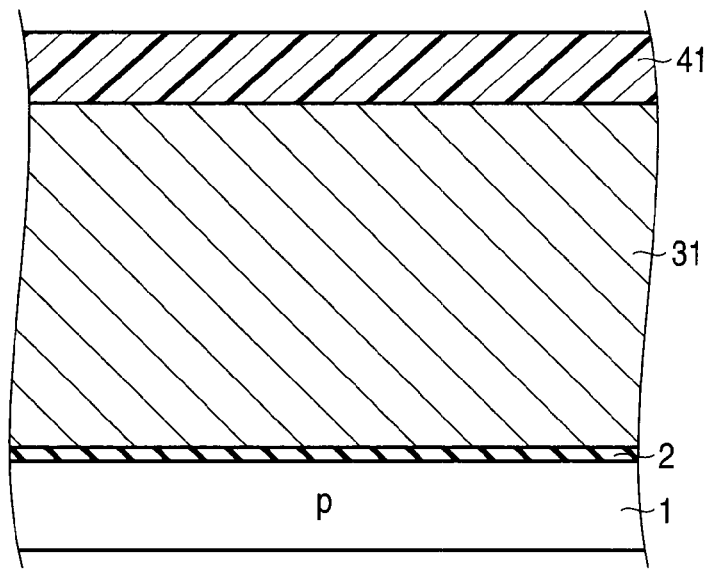
F I G. 41A
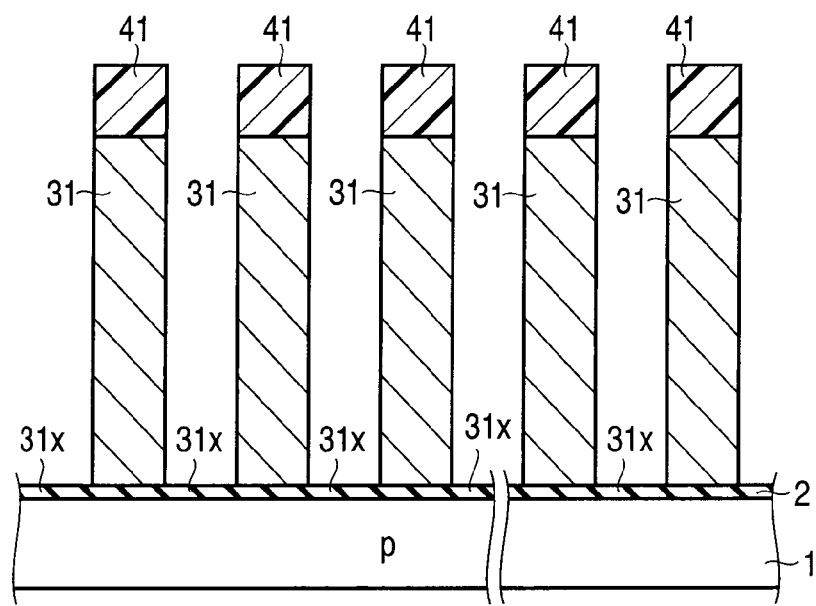
F I G. 41B

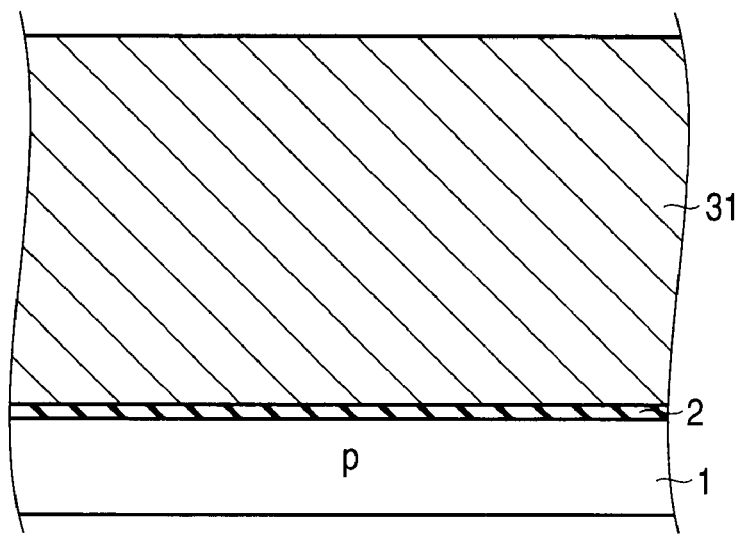
F I G. 42A
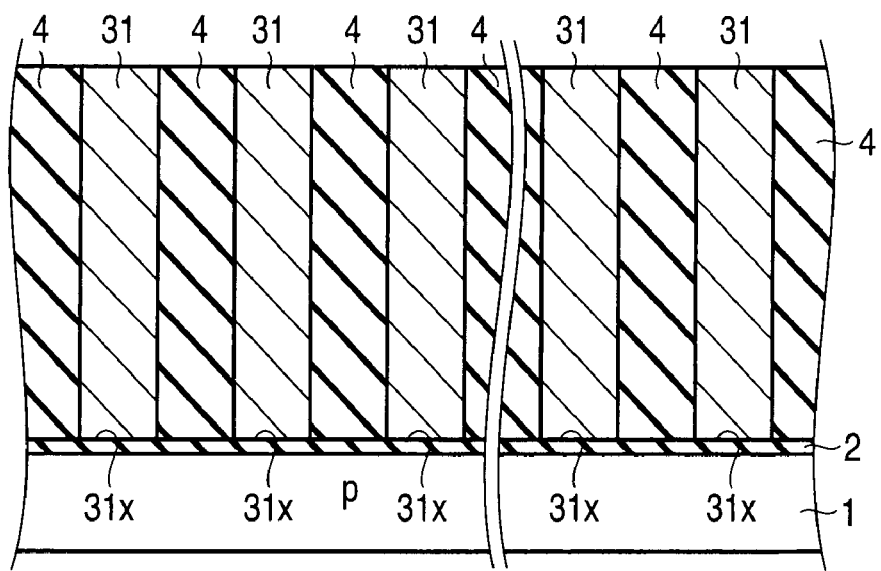
F I G. 42B

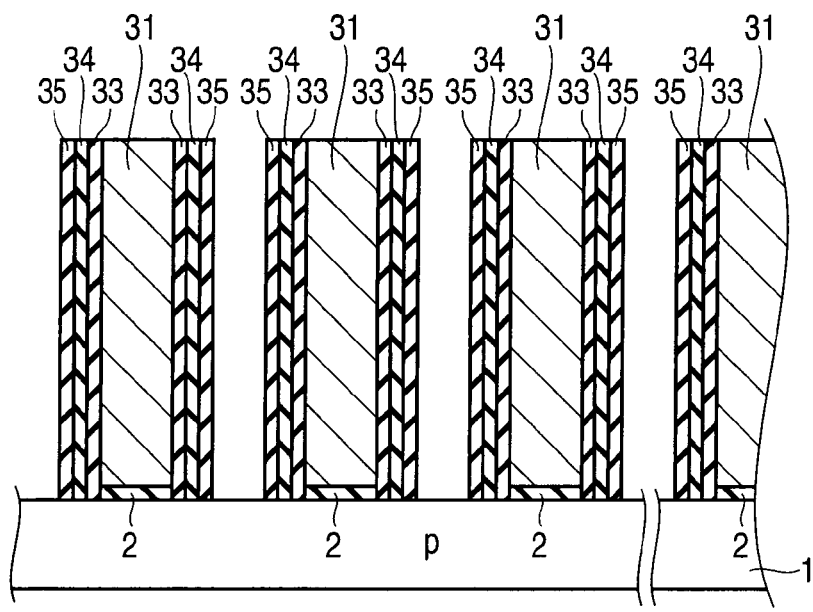
F I G. 44A
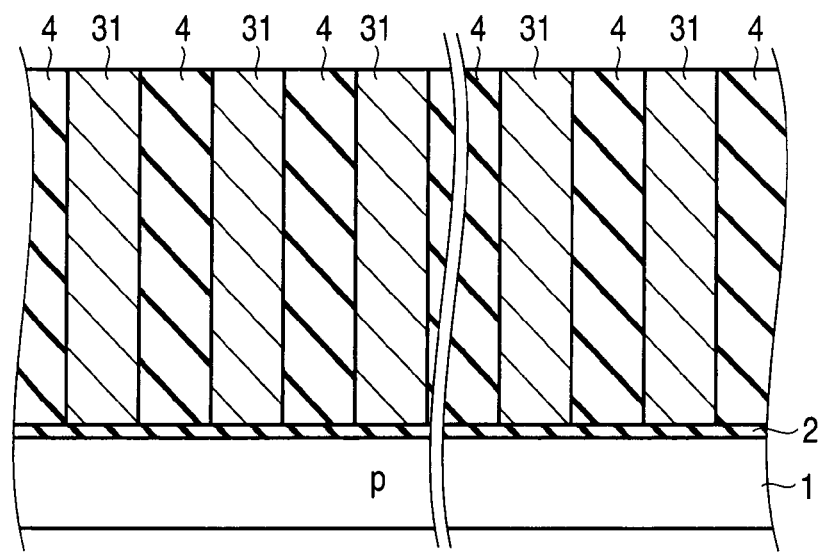
F I G. 44B

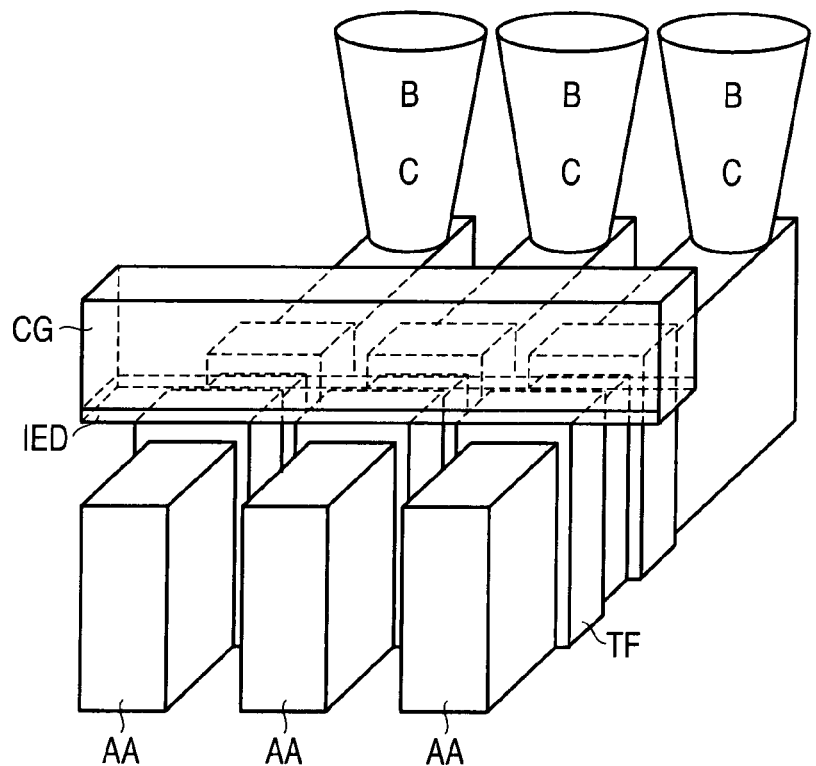
F I G. 47
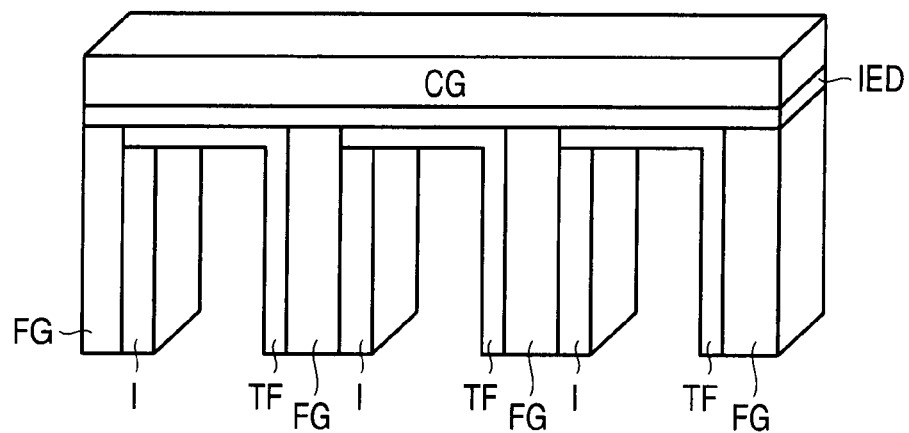
F I G. 48

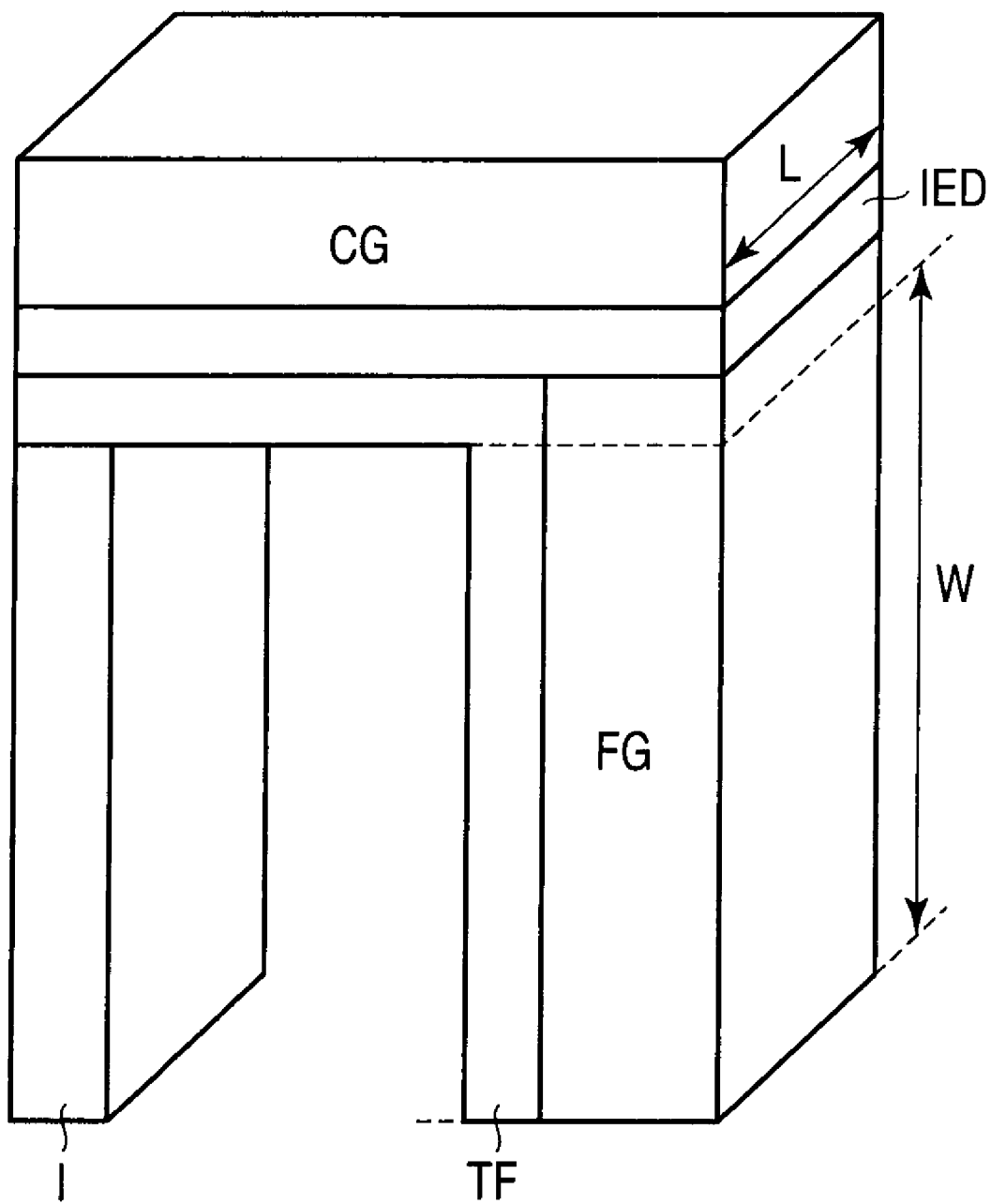
F I G. 49

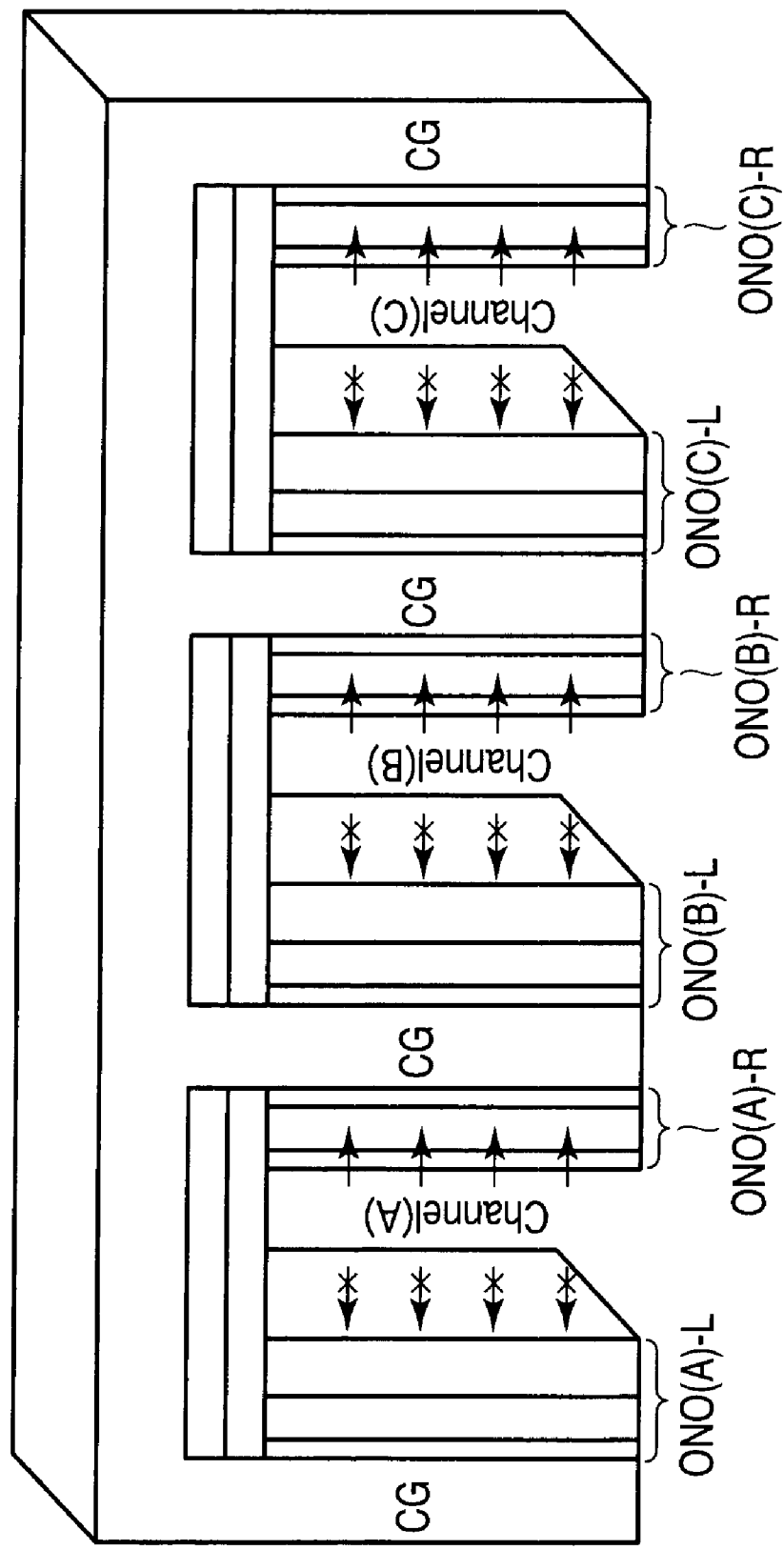
F I G. 51

SEMICONDUCTOR MEMORY AND METHOD OF MANUFACTURING THE SAME

CROSS-REFERENCE TO RELATED APPLICATIONS

This is a Continuation application of PCT Application No. PCT/JP2008/065039, filed Aug. 22, 2008, which was published under PCT Article 21(2) in Japanese.

This application is based upon and claims the benefit of priority from prior Japanese Patent Application No. 2007-216323, filed Aug. 22, 2007, the entire contents of which are incorporated herein by reference.

BACKGROUND OF THE INVENTION

1. Field of the Invention

The present invention relates to a semiconductor memory and a method of manufacturing the semiconductor memory.

2. Description of the Related Art

The functional level and storage capacity of a semiconductor memory have been increased by highly integrating memory cell transistors (see, e.g., JP-A 2000-174241 (KO-KAI)). This poses the problem that as the micropatterning of the gate of the memory cell transistor advances, the channel length decreases, and the short-channel effect increases.

Also, as the gate length and gate width decrease, the volume of a floating gate electrode reduces, and a threshold fluctuation when one electron accidentally leaks increases. For example, in the generation having a gate length of 20 nm, the volume of the floating gate electrode is about $(20 \text{ nm})^3$, and the calculated threshold fluctuation when one electron leaks is about 20 mV.

In addition, the decrease in gate width weakens the control power by the gate. For example, in the generation having a gate length of 20 nm, the gate width is also about 20 nm, and this makes it difficult to close the channel by the gate.

Furthermore, when using a depletion type (D-type) transistor including a channel region, source region, and drain region having the same conductivity type in order to suppress the short-channel effect, the channel region is pinched off by a depletion layer extending from the channel region side by sandwiching the channel region between a gate insulating film and buried insulating film. When the channel region is thinned to improve the pinch-off characteristic of the D-type transistor, it is sometimes impossible to secure a sufficient contact area by which etching for forming a contact hole penetrates the buried insulating film. As a consequence, the contact resistance rises.

BRIEF SUMMARY OF THE INVENTION

A semiconductor memory of an aspect of a present invention comprising a semiconductor substrate, unit arrays obtained by arranging memory cell transistors in a column direction, and arranged in a row direction, a buried insulating film formed on a part of an upper surface of the semiconductor substrate, and a semiconductor layer formed on another part of the upper surface of the semiconductor substrate. Each of the memory cell transistors comprises a first-conductivity-type source region, a first-conductivity-type drain region, and a first-conductivity-type channel region arranged in the semiconductor layer in the column direction, and a gate portion formed on a side surface of the channel region in the row direction.

A method of manufacturing a semiconductor memory of an aspect of a present invention comprising forming a buried insulating film on an upper surface of a semiconductor substrate, forming a floating gate electrode layer on an upper surface of the buried insulating film, forming a first trench in a row direction by selectively removing a portion of the floating gate electrode layer, burying a first element isolation insulating film in the first trench, forming a second trench in a column direction by selectively removing portions of the floating gate electrode layer and the first element isolation insulating film, and forming a floating gate electrode made of a portion of the residual floating gate electrode layer, forming a gate insulating film on a first side surface of the floating gate electrode in the row direction, forming a second element isolation insulating film on a second side surface of the floating gate electrode, which is opposite to the first side surface in the row direction, forming a first-conductivity-type semiconductor layer which defines a channel region, source region, and drain region of a memory cell transistor, such that the semiconductor layer is in contact with a side surface of the gate insulating film, in the second trench, depositing an inter-electrode dielectric on an upper end face of the floating gate electrode, and forming a control gate electrode on an upper surface of the inter-electrode dielectric.

A method of manufacturing a semiconductor memory of an aspect of a present invention comprising forming a buried insulating film on an upper surface of a semiconductor substrate, forming a gate electrode layer on an upper surface of the buried insulating film, forming a first trench in a row direction by selectively removing a portion of the gate electrode layer, burying a first element isolation insulating film in the first trench, forming a second trench in a column direction by selectively removing portions of the gate electrode layer and the first element isolation insulating film, and forming a gate electrode made of a portion of the residual gate electrode layer, stacking, in the row direction, a first oxide film, a nitride film defined as a charge storage layer, and a second oxide film on a first side surface of the gate electrode in the row direction, forming a second element isolation insulating film on a second side surface of the gate electrode, which is opposite to the first side surface in the row direction, and forming a first-conductivity-type semiconductor layer as a source region or a drain region in the second trench.

BRIEF DESCRIPTION OF THE SEVERAL VIEWS OF THE DRAWING

FIG. 2 is a sectional view of the first embodiment;

FIGS. 3 to 5 are sectional views of the first embodiment;

FIG. 6 is a graph for explaining the write operation of the first embodiment;

FIGS. 9A to 19A and 9B to 19B are sectional views showing a method of manufacturing the semiconductor memory of the first embodiment;

FIGS. 20A, 20B and 21A are sectional views showing a semiconductor memory of a second modification of the first embodiment;

FIGS. 21B, 22A and 22B are sectional views showing a semiconductor memory of a third modification of the first embodiment;

FIGS. 23A, 23B and 24A are sectional views showing a semiconductor memory of a fourth modification of the first embodiment;

FIGS. 24B, 25A and 25B are sectional views showing a semiconductor memory of a second modification of the first embodiment;

FIGS. 26A, 26B and 27A are sectional views showing a semiconductor memory of a third modification of the first embodiment;

FIGS. 27B, 28A and 28B are sectional views showing a semiconductor memory of a fourth modification of the first embodiment;

FIGS. 30A and 30B are sectional views showing a semiconductor memory of the second embodiment;

FIGS. 31A to 37A and 31B to 37B are sectional views showing a method of manufacturing the semiconductor memory of the second embodiment;

FIGS. 39A and 39B are sectional views showing the third embodiment;

FIGS. 40A to 46A and 40B to 46B are sectional views showing a method of manufacturing the semiconductor memory of the third embodiment;

FIG. 47 is a perspective view of a memory cell array for explaining the effect of the first embodiment;

FIGS. 48 and 49 are perspective views of a memory cell for explaining the effect of the first embodiment;

FIG. 51 is a perspective view of a memory cell array for explaining the effects of the second and third embodiments.

DETAILED DESCRIPTION OF THE INVENTION

Embodiments of the present invention will be explained below with reference to the accompanying drawings. In the following description of the drawings, the same or similar reference symbols denote the same or similar parts. However, it should be noted that the figures are exemplary views, so the relationship between the thickness and the planar dimension, the ratio of the thicknesses of layers, and the like are different from actual ones. Accordingly, practical thicknesses and dimensions should be judged by referring to the following explanation. Also, the individual figures of course include portions having different dimensional relationships and different ratios.

Note also that the embodiments to be explained below exemplarily disclose apparatuses and methods for embodying the technical idea of the present invention, and the technical idea of the present invention does not specify the materials, shapes, structures, layouts, and the like of components to those described below. The technical idea of the present invention can variously be changed within the scope of the appended claims.

In the embodiments of the present invention, "the first conductivity type" and "the second conductivity type" are opposite conductivity types. That is, the second conductivity type is a p-type when the first conductivity type is an n-type, and the second conductivity type is the n-type when the first conductivity type is the p-type. In the following explanation, the first conductivity type is the p-type, and the second conductivity type is the n-type. However, the first and second conductivity types may also be the n-type and p-type, respectively. When the n-type and p-type are switched, the polarity of an application voltage also reverses.

First Embodiment

Figure 1:
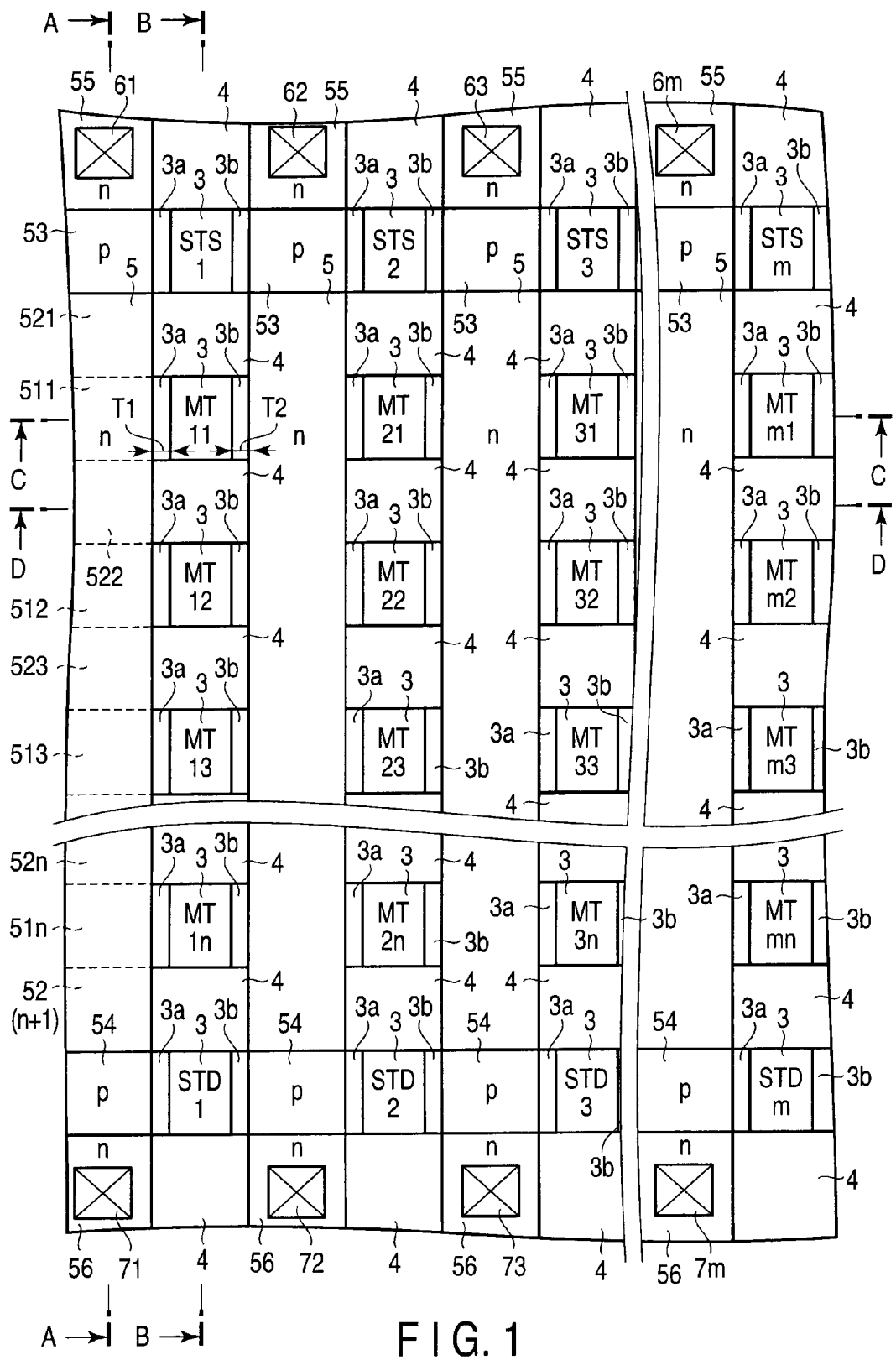
FIG. 1 is a plan view of a first embodiment.

A semiconductor memory according to the first embodiment of the present invention has a cell array in which, for example, m×n (m and n are integers) memory cell transistors $MT_{11}$, $MT_{12}$, ..., $MT_{1n}$, $MT_{21}$, $MT_{22}$, ..., $MT_{2n}$, $MT_{31}$, $MT_{32}$, ..., $MT_{3n}$, ..., $MT_{m1}$, $MT_{m2}$, ..., $MT_{mn}$ are arranged in a matrix as shown in FIG. 1.

Figure 4:
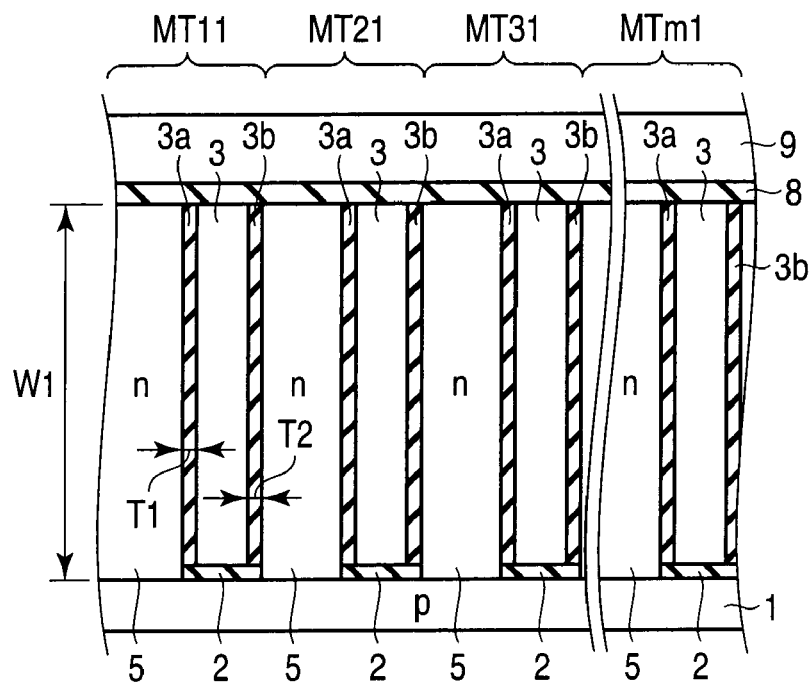
Figure 5:
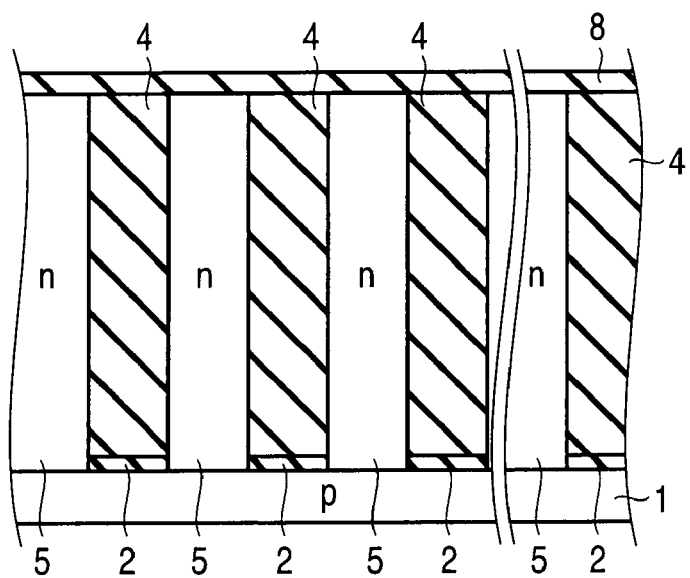

FIGS. 2 and 3 are respectively sectional views taken along lines A-A and B-B in the column direction of the matrix shown in FIG. 1. FIGS. 4 and 5 are respectively sectional views taken along lines C-C and D-D in the row direction of the matrix shown in FIG. 1. Note that FIG. 1 does not show inter-electrode dielectrics 8 and control gate electrodes 9 shown in FIGS. 2 to 5.

As shown in FIGS. 1 to 5, the semiconductor memory according to the first embodiment of the present invention includes a p-type semiconductor substrate 1, buried insulating films (BOX films) 2 formed on portions of the upper surface of the semiconductor substrate 1, and semiconductor layers 5 formed on other portions of the upper surface of the semiconductor substrate 1. The n-type source regions, n-type drain regions, and n-type channel regions of the plurality of memory cell transistors $MT_{11}$, $MT_{12}$, ..., $MT_{1n}$, $MT_{21}$, $MT_{22}$, ..., $MT_{2n}$, $MT_{31}$, $MT_{32}$, ..., $MT_{3n}$, ..., $MT_{m1}$, $MT_{m2}$, ..., $MT_{mn}$ are arranged in the semiconductor layers 5.

As shown in FIG. 2, a gate width W1 of each of the memory cell transistors $MT_{11}$, $MT_{12}$, ..., $MT_{1n}$ is arranged in the direction perpendicular to the upper surface of the semiconductor substrate 1, and a gate length L1 of each transistor is defined in the column direction parallel to the upper surface of the semiconductor substrate 1. The gate length L1 is about 30 to 70 nm, and the gate width W1 is about 30 to 200 nm.

As shown in FIGS. 1 to 5, each of the memory cell transistors $MT_{11}$, $MT_{12}$, ..., $MT_{1n}$ forming a unit array in the column direction is a stacked gate type D MIS transistor. The memory cell transistor $MT_{11}$ includes n-type source/drain regions 521 and 522, an n-type channel region 511 sandwiched between the source/drain regions 521 and 522, and a gate portion formed on the side surface of the channel region 511 in the row direction. The gate portion includes a gate insulating film (tunnel oxide film) 3a formed in the direction perpendicular to the upper surface of the semiconductor substrate 1 along the side surface of the channel region 511 in the row direction, a floating gate electrode 3 formed on the gate insulating film 3a on the side surface of the channel region 511 in the row direction, and a control gate electrode 9 formed on an inter-electrode dielectric 8 on the upper end face of the floating gate electrode 3.

The memory cell transistor $MT_{12}$ includes the n-type source/drain region 522, an n-type source/drain region 523, an n-type channel region 512 sandwiched between the source/drain regions 522 and 523, and a gate portion formed on the side surface of the channel region 512 in the row direction. The gate portion includes a gate insulating film 3a formed in the direction perpendicular to the upper surface of the semiconductor substrate 1 along the side surface of the channel region 512 in the row direction, a floating gate electrode 3 formed on the gate insulating film 3a on the side surface of the channel region 512 in the row direction, and a control gate electrode 9 formed on an inter-electrode dielectric 8 on the upper end face of the floating gate electrode 3.

The memory cell transistor $MT_{1n}$ includes n-type source/drain regions $52n$ and $52(n+1)$, an n-type channel region $51n$ sandwiched between the source/drain regions $52n$ and $52(n+1)$, and a gate portion formed on the side surface of the channel region $51n$ in the row direction. The gate portion includes a gate insulating film (tunnel oxide film) 3a formed in the direction perpendicular to the upper surface of the semiconductor substrate 1 along the side surface of the channel region $51n$ in the row direction, a floating gate electrode 3 formed on the gate insulating film 3a on the side surface of the channel region 51n in the row direction, and a control gate electrode 9 formed on an inter-electrode dielectric 8 on the upper end face of the floating gate electrode 3.

As shown in FIGS. 1 and 2, the plurality of memory cell transistors $MT_{11}$, $MT_{12}$, ..., $MT_{1n}$ forming the unit array in the column direction share the source/drain regions 521, 522, ..., 52(n+1) with adjacent memory cell transistors. "Share" means that between adjacent memory cell transistors, the drain region of one transistor is a common region that functions as the source region of the other. For example, the drain region 522 of the memory cell transistor $MT_{11}$ is defined as the source region 522 of the adjacent memory cell transistor $MT_{12}$. The source regions 521, 522, ..., 52n, channel regions 511, 512, ..., 51n, and drain regions 522, 523, ..., 52(n+1) respectively extend in the column direction to form unit arrays, and the corresponding source regions, channel regions, and drain regions of memory cell transistors in adjacent unit arrays are separated, thereby forming a plurality of parallel unit arrays.

As shown in FIGS. 1 and 3, the floating gate electrodes 3 and first element isolation insulating films 4 are alternately arranged in the column direction. The first element isolation insulating films 4 isolate the flowing gate electrodes 3 of the memory cell transistors $MT_{11}$, $MT_{12}$, ..., $MT_{1n}$ from each other.

Also, second element isolation insulating films 3b isolate the floating gate electrodes 3 of the memory cell transistors $MT_{11}$, $MT_{12}$, ..., $MT_{1n}$ and the semiconductor layers 5 on the right side (opposite to the side where the gate insulating films 3a exist) of the floating gate electrodes 3 from each other.

As the material of the semiconductor layer 5 shown in FIGS. 1, 2, 4, and 5, it is possible to use, e.g., Si, silicon germanium (SiGe), or silicon carbide (3C—SiC). The thickness of the semiconductor layer 5 in the direction perpendicular to the upper surface of the semiconductor substrate 1 is about 30 to 200 nm.

A silicon oxide film ($SiO_2$) or the like can be used as the material of the buried insulating film 2 shown in FIGS. 3 to 5. The thickness of the buried insulating film 2 in the direction perpendicular to the upper surface of the semiconductor substrate 1 is about 10 to 40 nm.

As the material of the gate insulating film 3a shown in FIGS. 1 and 4, it is possible to use, e.g., silicon nitride ($Si_3N_4$), tantalum oxide ($Ta_2O_5$), titanium oxide ($TiO_2$), alumina ($Al_2O_3$), and zirconium oxide ($ZrO_2$), in addition to $SiO_2$. By thinning the gate insulating film 3a, the bias to be applied to the control gate electrode 9 at the time of driving can be decreased. A thickness T1 of the gate insulating film 3a in the row direction is smaller than a thickness T2 of the second element isolation insulating film 3b in the row direction. The thickness T1 of the gate insulating film 3a in the row direction is about 1 to 20 nm. The thickness T2 of the second element isolation insulating film 3b in the row direction is about 1 to 20 nm.

As the material of the inter-electrode dielectric 8 shown in FIGS. 2 to 5, it is possible to use $Si_3N_4$, $Ta_2O_5$, $TiO_2$, $Al_2O_3$, $ZrO_2$, phosphosilicate glass (PSG), borophosphosilicate glass (BPSG), silicon oxynitride (SIGN), barium titanate ($BaTiO_3$), silicon oxyfluoride ($SiO_xF_y$), and an organic resin such as polyimide, or a stacked structure combining these materials. The thickness of the inter-electrode dielectric 8 in the direction perpendicular to the upper surface of the semiconductor substrate 1 is about 10 to 30 nm.

As shown in FIGS. 1 to 3, two select gate transistors $STS_1$ and $STD_1$ are arranged at the two ends of the unit array of the memory cell transistors $MT_{11}$, $MT_{12}$, ..., $MT_{1n}$ in the column direction. Each of the select gate transistors $STS_1$ and $STD_1$ is an enhancement MIS transistor. The select gate transistors $STS_1$ and $STD_1$ each have a gate width W2 defined in the direction perpendicular to the upper surface of the semiconductor substrate 1, and a gate length L1 defined in the column direction.

The select gate transistor $STS_1$ includes the n-type drain region 521 as a common region that also functions as the source region 521 of the memory cell transistor $MT_{11}$ positioned at one end of the unit array of the memory cell transistors $MT_{11}$, $MT_{12}$, ..., $MT_{1n}$ in the column direction, a p-type channel region 53 adjacent to the drain region 521 in the column direction, an n-type source region 55 adjacent to the channel region 53 in the column direction, and select gate electrodes 3 and 9 formed on the gate insulating film 3a on the side surface of the channel region 53 in the row direction. A source line contact plug 61 is buried in the source region 55. The side surface and bottom surface of the source line contact plug 61 are in contact with the source region 55.

The select gate transistor $STD_1$ includes the source region 52(n+1) as a common region that also functions as the drain region 52(n+1) of the memory cell transistor $MT_{1n}$ positioned at the other end of the unit array of the memory cell transistors $MT_{11}$, $MT_{12}$, ..., $M_{1n}$ in the column direction, a p-type channel region 54 formed adjacent to the source region 52(n+1) in the column direction, an n-type drain region 56 formed adjacent to the channel region 54 in the row direction, and select gate electrodes 3 and 9 formed on the gate insulating film 3a on the side surface of the channel region 54 in the row direction. A bit line contact plug 71 is buried in the drain region 56. The side surface and bottom surface of the bit line contact plug 71 are in contact with the drain region 56.

Also, the second element isolation insulating film 3b isolates the select gate electrodes 3 and 9 of the select gate transistors $STS_1$ and $STD_1$ from the semiconductor layers 5 on the right side (opposite to the side where the gate insulting film 3a exists) of the select gate electrodes 3 and 9.

The memory cell transistors $MT_{21}$, $MT_{22}$, $MT_{2n}$, $MT_{31}$, $MT_{32}$, ..., $MT_{3n}$, $MT_{m1}$, $MT_{m2}$, ..., $MT_{mn}$ have practically the same structure as that of the memory cell transistors $MT_{11}$, $MT_{12}$, ..., $MT_{1n}$ described above.

As shown in FIGS. 1 and 4, the semiconductor layers 5, gate insulating films 3a, floating gate electrodes 3, and second element isolation insulating films 3b are periodically arranged in the row direction. The second element isolation insulating films 3b isolate the memory cell transistors $MT_{11}$, $MT_{21}$, $MT_{31}$, ..., $MT_{m1}$ from each other. As shown in FIGS. 1 and 5, the semiconductor layers 5 and first element isolation insulating films 4 are alternately arranged in the row direction.

Note that although not shown, the semiconductor memory further includes cell array peripheral circuits outside the cell array including the plurality of memory cell transistors $MT_{11}$, $MT_{12}$, ..., $MT_{1n}$, $MT_{21}$, $MT_{22}$, ..., $MT_{2n}$, $MT_{31}$, $MT_{32}$, ..., $MT_{3n}$, ..., $MT_{m1}$, $MT_{m2}$, ..., $MT_{mn}$.

FIG. 6 is an equivalent circuit diagram of the semiconductor memory shown in FIGS. 1 to 5. As shown in FIG. 6, a cell array 100 includes a plurality of cell units 111, 112, 113, ..., 11m arrayed in a matrix in the row direction. The cell units 111, 112, 113, ..., 11m each include the memory cell transistors $MT_{11}$, $MT_{1n}$, memory cell transistors $MT_{21}$, $MT_{22}$, ..., $MT_{2n}$, ..., memory cell transistors $MT_{m1}$, $MT_{m2}$, ..., $MT_{mn}$ respectively arrayed in the column direction.

In the cell unit 111, for example, the memory cell transistors $MT_{11}$, $MT_{12}$, ..., $MT_{1n}$ and select gate transistors $STS_1$ and $STD_1$ are connected in series. In the cell unit 112, a select gate transistor $STS_2$, the memory cell transistors $MT_{21}$, $MT_{22}$, ..., $MT_{2n}$, and a select gate transistor $STD_2$ are connected in series. In the cell unit 113, a select gate transistor $STS_3$, the memory cell transistors $MT_{31}$, $MT_{32}$, ..., $MT_{3n}$, and a select gate transistor $STD_3$ are connected in series. In the cell unit 11m, a select gate transistor $STS_m$, the memory cell transistors $MT_{m1}$, $MT_{m2}$, ..., $MT_{mn}$, and a select gate transistor $STD_m$ are connected in series.

As shown in FIG. 6, a common source line SL is connected to the sources of the select gate transistors $STS_1$, $STS_2$, ..., $STS_m$. A source line driver 103 for supplying a voltage to the source line SL is connected to it. A row decoder 101 is connected to a common select gate line SGS of the select gate transistors $STS_1$, $STS_2$, $STS_3$, ..., $STS_m$, a common select gate line SGD of the select gate transistors $STD_1$, $STD_2$, $STD_3$, ..., $STD_m$, and a word line $WL_1$ of the memory cell transistors $MT_{11}$, $MT_{21}$, ..., $MT_{m1}$, a word line $WL_2$ of the memory cell transistors $MT_{12}$, $MT_{22}$, ..., $MT_{m2}$, ..., a word line $WL_n$ of memory cell transistors $MT_{1n}$, $MT_{2n}$, ..., $MT_{mn}$. The row decoder 101 obtains a row address decoded signal by decoding a row address signal, and selectively supplies an operating voltage to the word lines $WL_1$, $WL_2$, ..., $WL_n$ and select gate lines SGS and SGD.

Bit lines $BL_1$, $BL_2$, $BL_3$, ..., $BL_m$ are respectively connected to the drains of the select gate transistors $STD_1$, $STD_2$, $STD_3$, ..., $STD_m$. A sense amplifier 102 and column decoder 104 are connected to the bit lines $BL_1$, $BL_2$, $BL_3$, ..., $BL_m$. The column decoder 104 obtains a column address decoded signal by decoding a column address signal, and selects one of the bit lines $BL_1$, $BL_2$, $BL_3$, ..., $BL_m$ based on the column address decoded signal. The sense amplifier 102 amplifies data read out from a memory cell transistor selected by the row decoder 101 and column decoder 104.

The read operation of the semiconductor memory according to the first embodiment of the present invention will be explained below. When multilevel data is stored in the memory, a changed gate voltage is applied to the control gate electrode 9 of a memory cell transistor (e.g., the memory cell transistor $MT_{11}$) as a read target. In this state, the depletion layer in the channel region 511 immediately below the floating gate electrode 3 of the memory cell transistor $MT_{11}$ expands in accordance with the amount of electric charge stored in the floating gate electrode 3 of the memory cell transistor $MT_{11}$, and the memory cell transistor $MT_{11}$ is turned on or off.

Figure 7:
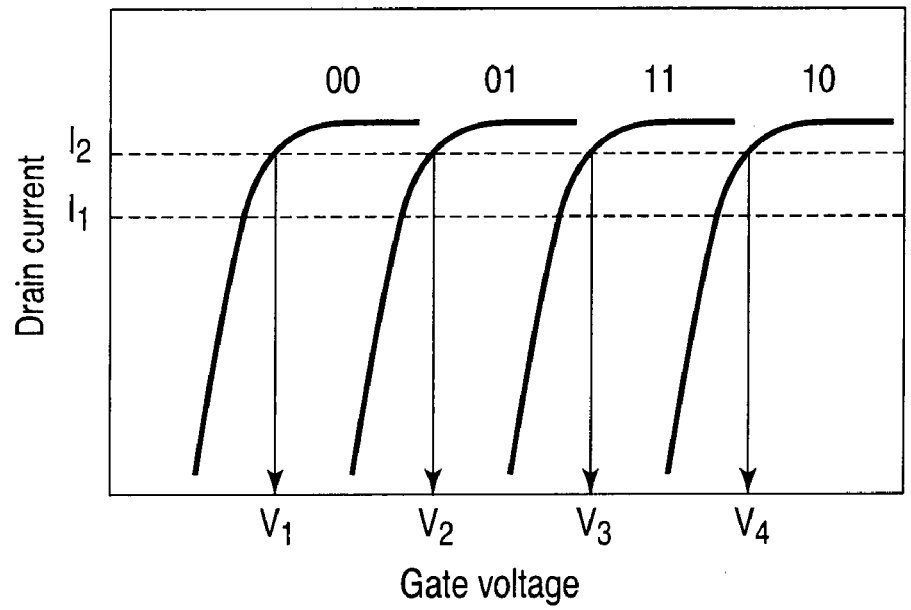
FIGS. 7 and 8 are schematic views for explaining the write operation of the first embodiment.

For example, as shown in FIG. 7, it is determined that the data is "00" when drain currents I1 and I2 flow at a gate voltage V1, "01" when the drain currents I1 and I2 flow at a gate voltage V2, "11" when the drain currents I1 and I2 flow at a gate voltage V3, and "10" when the drain currents I1 and I2 flow at a gate voltage V4.

The write operation of the semiconductor memory according to the first embodiment of the present invention will be explained below.

The write operation is performed from the memory cell transistors $MT_{11}$, $MT_{21}$, $MT_{31}$, ..., $MT_{m1}$ closest to the source side toward the memory cell transistors $MT_{1n}$, $MT_{2n}$, $MT_{3n}$, ..., $MT_{mn}$ closest to the bit line side.

That is, data is written in the order of $MT_{11} \rightarrow MT_{12} \rightarrow MT_{13}, ..., \rightarrow MT_{1n}$ in the first column, in the order of $MT_{21} \rightarrow MT_{22} \rightarrow MT_{23}, ..., \rightarrow MT_{2n}$ in the second column, in the order of $MT_{31} \rightarrow MT_{32} \rightarrow MT_{33}, ..., \rightarrow MT_{3n}$ in the third column, and in the order of $MT_{m1} \rightarrow MT_{m2} \rightarrow MT_{m3}, ..., \rightarrow MT_{mn}$ in the mth column.

The write operation is performed for, e.g., each column.

Let 91 be a common control gate electrode of the memory cell transistors $MT_{11}$, $MT_{21}$, $MT_{31}$, ..., $MT_{m1}$, 92 be a common control gate electrode of the memory cell transistors $MT_{12}$, $MT_{22}$, $MT_{32}$, ..., $MT_{m2}$, 93 be a common control gate electrode of the memory cell transistors $MT_{13}$, $MT_{23}$, $MT_{33}$, ..., $MT_{m3}$, and 9n be a common control gate electrode of the memory cell transistors $MT_{1n}$, $MT_{2n}$, $MT_{3n}$, ..., $MT_{mn}$.

Also, let 501, 502, 503, ..., 50m be the channel regions in the semiconductor layers 5 on the left side (where the gate insulating films 3a exist) of these memory cell transistors, in one-to-one correspondence with the plurality of semiconductor layers 5.

That is, let 501 be the channel regions of the memory cell transistors $MT_{11}$, $MT_{12}$, $MT_{13}$, ..., $MT_{1n}$, 502 be the channel regions of the memory cell transistors $MT_{21}$, $MT_{22}$, $MT_{23}$, ..., $MT_{2n}$, 503 be the channel regions of the memory cell transistors $MT_{31}$, $MT_{32}$, $MT_{33}$, ..., $MT_{3n}$, and 50n be the channel regions of the memory cell transistors $MT_{m1}$, $MT_{m2}$, $MT_{m3}$, ..., $MT_{mn}$.

Furthermore, let 71 be a bit line connected to the memory cell transistors $MT_{11}$, $MT_{12}$, $MT_{13}$, ..., $MT_{1n}$, 72 be a bit line connected to the memory cell transistors $MT_{21}$, $MT_{22}$, $MT_{23}$, ..., $MT_{2n}$, 73 be a bit line connected to the memory cell transistors $MT_{31}$, $MT_{32}$, $MT_{33}$, ..., $MT_{3n}$, and 7m be a bit line connected to the memory cell transistors $MT_{m1}$, $MT_{m2}$, $MT_{m3}$, ..., $MT_{mn}$.

Under the circumstances, when data write to the memory cell transistors $MT_{11}$, $MT_{12}$, $MT_{13}$, ..., $MT_{1n}$ in the first column is complete, data write to the memory cell transistors $MT_{21}$, $MT_{22}$, $MT_{23}$, ..., $MT_{2n}$ in the second column is performed.

The operation when data write to the memory cell transistor $MT_{21}$ in the second column is complete and data write to the memory cell transistor $MT_{22}$ is subsequently performed will be explained below.

Assume that programming (write execution) that raises the threshold voltage from the erased state is performed on the memory cell transistor $MT_{22}$.

In this operation, it is necessary to prevent the fluctuation in threshold voltage of (inhibit data write to) the memory cell transistors $MT_{12}$, $MT_{32}$, ..., $MT_{m2}$ sharing the control gate electrode (word line) 92 with the memory cell transistor $MT_{22}$.

First, a voltage that turns off the select gate transistors $STS_1$, $STS_2$, $STS_3$, ..., $STS_m$ on the source line side is applied to the common select gate electrode 9 of these transistors, and a voltage that turns on the select gate transistors $STD_1$, $STD_2$, $STD_3$, ..., $STD_m$ on the bit line side is applied to the common select gate electrode 9 of these transistors.

Then, a potential (e.g., 0 V) for executing write is applied to the channel region 502 of the memory cell transistor $MT_{22}$ via the bit line 72. Also, a positive bias potential (e.g., 2.5 V) is applied to the channel regions 501, 503, ..., 50n of the memory cell transistors $MT_{12}$, $MT_{32}$, ..., $MT_{m2}$ via the bit lines 71, 73, ..., 7m.

The source line common to all the memory cell transistors is set at 0 V.

When a transfer potential Vpass (e.g., 7 V) is applied to the control gate electrodes 91, 92, 93, ..., 9n, the channel regions 501, 503, ..., 50n of the memory cell transistors $MT_{12}$, $MT_{32}$, ..., $MT_{m2}$ to which the positive bias potential is applied are boosted by capacitive coupling.

Also, the bit-line-side select gate transistors $STD_1$, $STD_3$, ..., $STD_m$ connected to the memory cell transistors $MT_{12}$, $MT_{32}$, ..., $MT_{m2}$ cannot be kept ON any longer owing to this boosting, and are cut off. Accordingly, the channel regions 501, 503, ..., 50n maintain the boosted state.

By contrast, the channel region 502 of the memory cell transistor $MT_{22}$ to which the potential (e.g., 0 V) for executing write is applied is temporarily boosted by capacitive coupling, but does not cut off the bit-line-side select gate transistors $STD_1, STD_3, \ldots, STD_m$ connected to the memory cell transistors $MT_{12}, MT_{32}, \ldots, MT_{m2}$. As a consequence, the channel region 502 is fixed at the write execution potential again.

After that, a write potential Vpgm (e.g., 20 V) is applied to the control gate electrode 92.

In this state, the channel regions $501, 503, \ldots, 50n$ of the memory cell transistors $MT_{12}, MT_{32}, \ldots, MT_{m2}$ are in the boosted state.

This inhibits write to the memory cell transistors $MT_{12}, MT_{32}, \ldots, MT_{m2}$ because the potential difference between the floating gate electrode 3 and the channel regions $501, 503, \ldots, 50n$ is small.

On the other hand, the channel region 502 of the memory cell transistor $MT_{22}$ fixed to the potential (e.g., 0 V) for executing write maintains the potential for write execution even after the write potential Vpgm is applied.

In the memory cell transistor $MT_{22}$, therefore, the potential difference between the channel region 502 and the floating gate electrode 3 increases, and electrons are injected into the floating gate electrode 3 of the memory cell transistor $MT_{22}$ from the channel region 502, thereby executing write.

Similarly, when executing write to the memory cell transistor $MT_{23}$, the write potential Vpgm is applied to the control gate electrode 93 while the channel regions of the memory cell transistors $MT_{13}, MT_{33}, \ldots, MT_{m3}$ are maintained in the boosted state, and the channel region of the memory cell transistor $MT_{23}$ is maintained at the potential for write execution.

This makes it possible to execute write to only the memory cell transistor $MT_{23}$.

The film thickness T1 of the gate insulating film 3a is smaller than the film thickness T2 of the second element isolation insulating film 3b. In addition, since a p-type impurity is implanted in that portion of the floating gate electrode 3 which is in contact with the second element isolation insulating film 3b, the film thickness T2 of the second element isolation insulating film 3b and the extension of the depletion layer reduce the electric field. In the memory cell transistor $MT_{11}$, therefore, data can be written from the gate insulating film 3a to the floating gate electrode 3 while suppressing write from the second element isolation insulating film 3b to the floating gate electrode 3.

Figure 8:
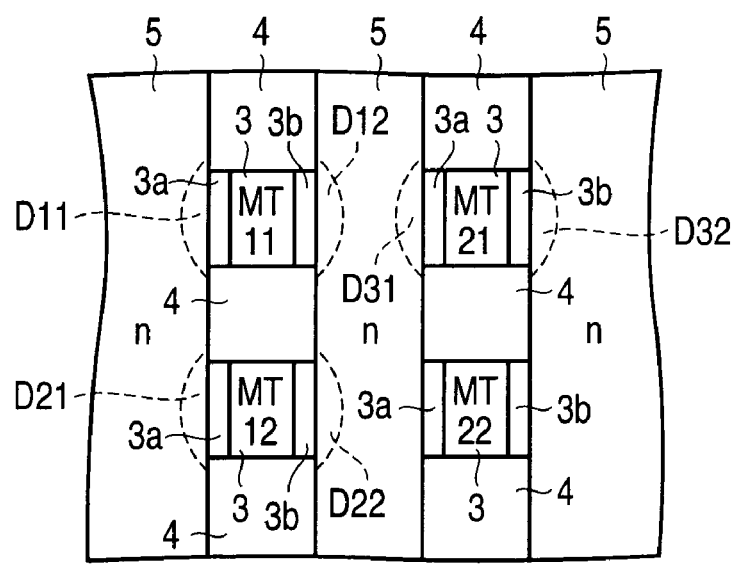

Also, as shown in, e.g., FIG. 8, when writing data "11" in the memory cell transistor $MT_{21}$ after data is written in the memory cell transistors $MT_{11}, MT_{12}, \ldots, MT_{1n}$, the extension of a depletion layer D12 from the memory cell transistor $MT_{11}$ adjacent to the memory cell transistor $MT_{21}$ to be written has the influence on the OFF characteristic of the memory cell transistor $MT_{21}$. As shown in FIG. 8, therefore, the data is written while the extension of the depletion layer D12 of the adjacent memory cell transistor $MT_{11}$ is sensed such that when the gate threshold voltage V3 is applied, the memory cell transistor $MT_{21}$ is turned on by the total sum of a depletion layer D31 from the memory cell transistor $MT_{21}$ and the depletion layer D12 from the memory cell transistor $MT_{11}$.

In the erase operation of the semiconductor memory according to the first embodiment of the present invention, data is erased at once by extracting carriers from the floating gate electrodes 3 to the semiconductor layers 5 via the gate insulating films 3a in the memory cell transistors $MT_{11}, MT_{12}, \ldots, MT_{1n}, MT_{21}, MT_{22}, \ldots, MT_{2n}, MT_{31}, MT_{32}, \ldots, MT_{3n}, \ldots, MT_{m1}, MT_{m2}, \ldots, MT_{mn}$.

In the semiconductor memory according to the first embodiment of the present invention, the memory cell transistors $MT_{11}, MT_{12}, \ldots, MT_{1n}, MT_{21}, MT_{22}, \ldots, MT_{2n}, MT_{31}, MT_{32}, \ldots, MT_{3n}, \ldots, MT_{m1}, MT_{m2}, \ldots, MT_{mn}$ are D transistors in which the channel region, source region, and drain region have the same conductivity type. Accordingly, the short-channel effect can be suppressed even when the channel length in the column direction is decreased.

In addition, the degree of freedom of design is given in the direction perpendicular to the upper surface of the semiconductor substrate 1. Therefore, the volume of the floating gate electrode 3 can be increased by thickening the floating gate electrode 3 in the direction perpendicular to the upper surface of the semiconductor substrate 1. This makes it possible to suppress the fluctuation in gate threshold value against the leak of one electron from the floating gate electrode 3.

Since the degree of freedom of design is given in the direction perpendicular to the upper surface of the semiconductor substrate 1, the gate width W1 can be increased by designing it independently of the downsizing of the gate length L1. Accordingly, the pinch-off characteristic can be improved by raising the dominating power of the gate by increasing the gate width W1.

Furthermore, the semiconductor layer 5 is not much restricted but has tolerance in the direction perpendicular to the upper surface of the semiconductor substrate 1. Therefore, the area of the bit line contact plug 71 in contact with the source region 55 and the area of the source line contact plug 61 in contact with the drain region 56 can be increased in the direction perpendicular to the upper surface of the semiconductor substrate 1. As a consequence, a contact defect can be improved.

A method of manufacturing the semiconductor memory according to the first embodiment of the present invention will be explained below.

FIGS. 9A, 10A, ..., 19A are sectional views taken along a line A-A in FIG. 1 and showing the steps in the column direction. FIGS. 9B, 10B, ..., 19B are sectional views taken along a line B-B in FIG. 1 and showing the steps in the row direction.

(a) As shown in FIGS. 9A and 9B, a single-crystal, p-type semiconductor substrate 1 is prepared. A buried insulating film 2 about 10 to 40 nm thick made of $SiO_2$ film or the like is formed on the upper surface of the semiconductor substrate 1 by, e.g., chemical vapor deposition (CVD) or thermal oxidation. Subsequently, a first semiconductor layer (floating gate electrode layer) 3 about 30 to 200 nm thick made of single-crystal Si is formed on the upper surface of the buried insulating film 2 by, e.g., solid-phase epitaxial growth.

(b) Then, the upper surface of the floating gate electrode layer 3 is spin-coated with a resist film 11, and an etching mask of the resist film 11 is formed by using photolithography. Portions of the floating gate electrode layer 3 are selectively removed in the row direction by reactive ion etching (RIE) using the etching mask. Consequently, first trenches 3x extending in the row direction are formed as shown in FIGS. 10A and 10B. After that, the resist films 11 are removed by using a resist remover or the like.

(c) First element isolation insulating films 4 are buried in the first trenches 3x by CVD or the like. The upper-surface level of the first element isolation insulating films 4 is lowered by CMP. Consequently, as shown in FIGS. 11A and 11B, the upper-surface level of the first element isolation insulating films 4 matches that of the floating gate electrode layers 3.

Figure 12A:
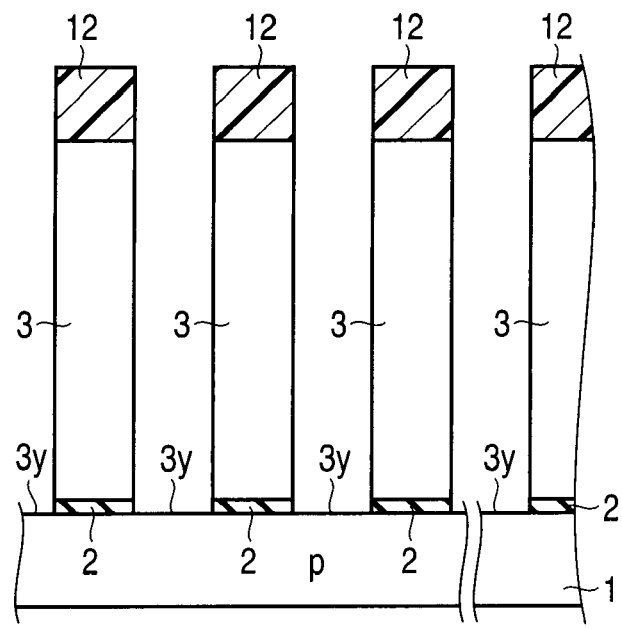
Figure 12B:
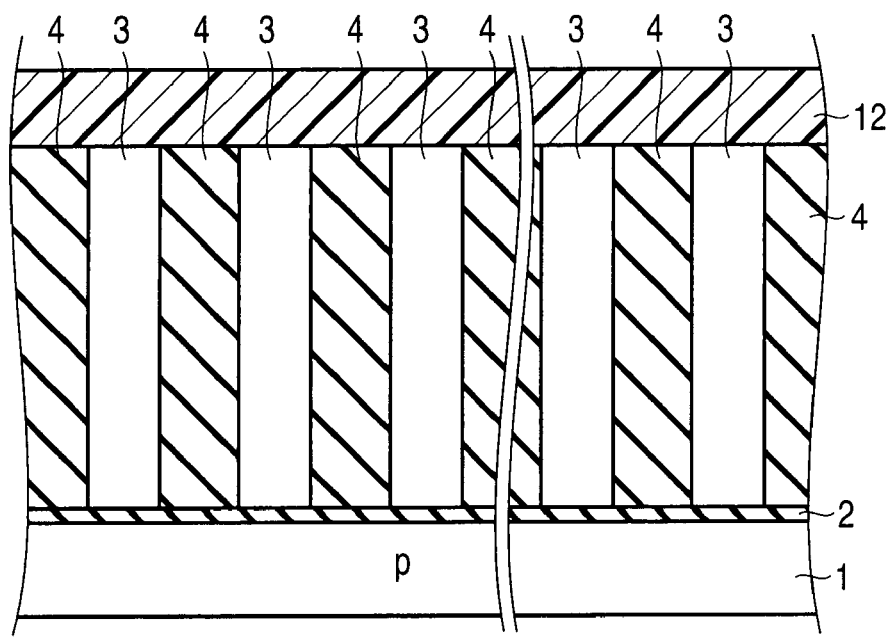

(d) The upper surfaces of the floating gate electrode layers 3 and first element isolation insulating films 4 are spin-coated with a resist film 12, and an etching mask of the resist film 12 is formed by using photolithography. Portions of the floating gate electrode layers 3 and first element isolation insulating films 4 are selectively removed in the column direction by RIE using the etching mask. Consequently, second trenches 3y extending in the column direction are formed as shown in FIGS. 12A and 12B.

(e) As shown in FIGS. 13A and 13B, a p-type impurity such as boron ($^{11}B^+$) is obliquely ion-implanted in the side surfaces of the floating gate electrodes 3. After that, the resist films 12 are removed by using, e.g., a resist remover. Then, as shown in FIGS. 14A and 14B, thermal oxidation is performed to form gate insulating films ($SiO_2$ films) 3a on the first side surfaces of the floating gate electrodes 3, and second element isolation insulating films ($SiO_2$ films) 3b on the second side surfaces of the floating gate electrodes 3. Since the p-type impurity is implanted in the second side surface of the floating gate electrode 3, the oxidation rate of the second side surface becomes higher than that of the first side surface in which no p-type impurity is implanted. This makes the gate insulating film 3a on the first side surface thinner than the second element isolation insulating film 3b. Also, since the floating gate electrode 3 is made of single-crystal Si, it is possible to suppress the film thickness variations of the gate insulating films 3a and second element isolation insulating films 3b caused by the thermal oxidation.

Figure 15A:
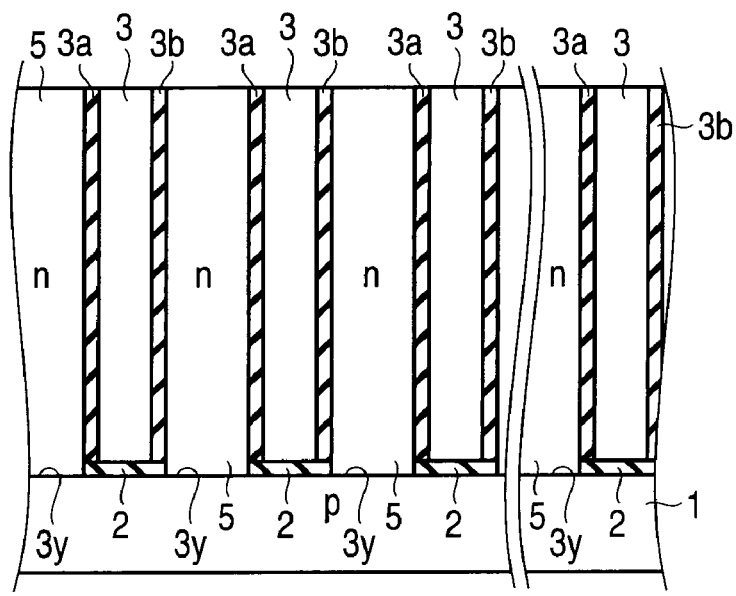
Figure 15B:
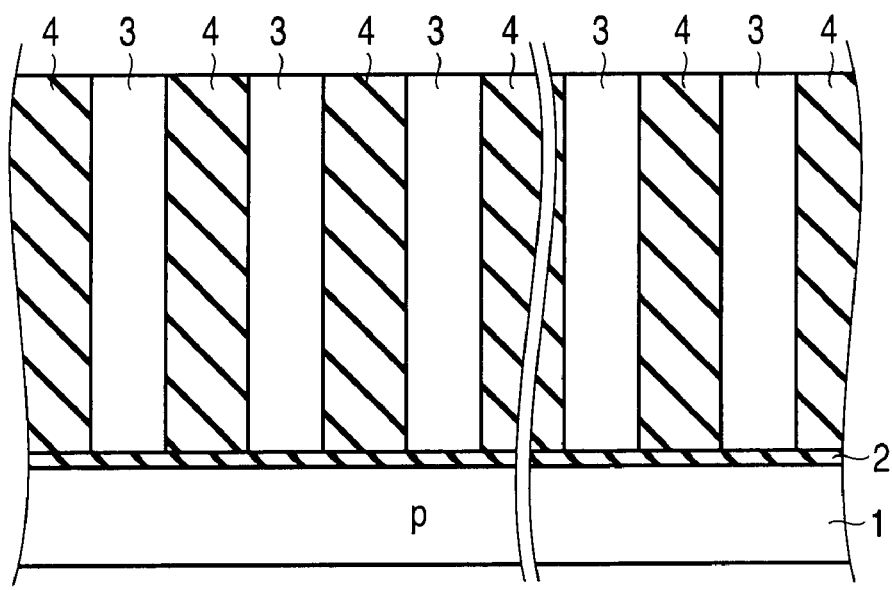

(f) As shown in FIGS. 15A and 15B, second semiconductor layers 5 in which the channel regions, source regions, and drain regions of the memory cell transistors $MT_{11}$, $MT_{12}$, ..., $MT_{1n}$ are defined are buried in the second trenches 3y by using, e.g., selective epitaxial growth (SEG) or lateral solid-phase epitaxy (L-SPE).

(g) Then, the upper end faces of the floating gate electrodes 3 are coated with a resist film (not shown), and the resist film is patterned by using photolithography. Subsequently, the patterned resist films are used as masks to ion-implant a p-type impurity such as $^{11}B^+$. The residual resist films are removed by using a resist remover or the like. After that, annealing is performed to activate the impurity ions implanted in the second semiconductor layers 5. Consequently, channel regions 53 of the select gate transistors $STS_1$, $STS_2$, ..., $STS_m$ and channel regions 54 of the select gate transistors $STD_1$, $STD_2$, ..., $STD_m$ shown in FIG. 1 are formed.

(h) As shown in FIGS. 16A and 16B, CVD or the like is performed to deposit an inter-electrode dielectric 8 on the upper surfaces of the floating gate electrodes 3, tunnel oxide films, first element isolation insulating films 4, and second element isolation insulating films. Subsequently, the upper surface of the inter-electrode dielectric 8 is coated with a resist film 13, and the resist film 13 is patterned by using photolithography. As shown in FIGS. 17A and 17B, the patterned resist films 13 are used as masks to form openings 8a and 8b in the inter-electrode dielectric 8 by, e.g., RIE.

(i) As shown in FIGS. 18A and 18B, a control gate electrode layer 9 about 10 to 200 nm thick made of polysilicon or the like that serves as a phosphorus-doped control gate electrode 9 is deposited on the upper surface of the inter-electrode dielectric 8 by CVD. In this step, the select gate electrodes 3 and 9 of the select gate transistors are connected through the openings 8a and 8b.

Figure 19A:
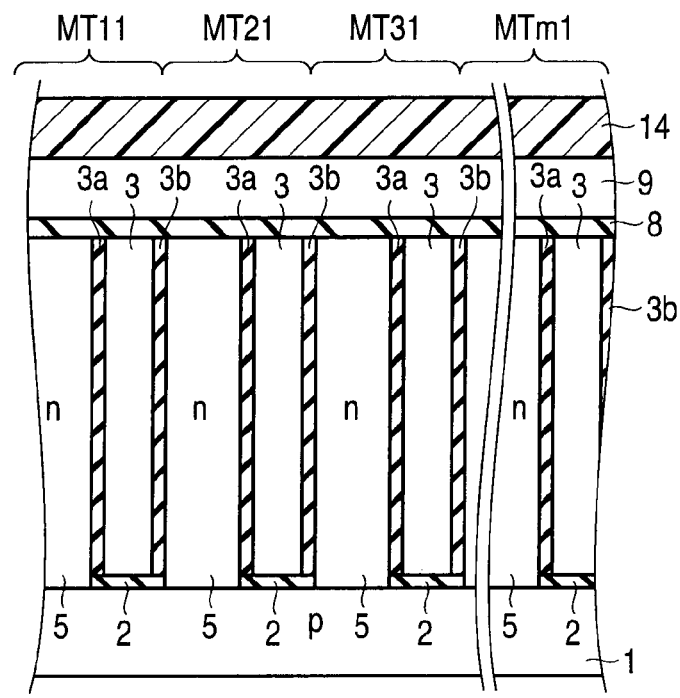
Figure 19B:
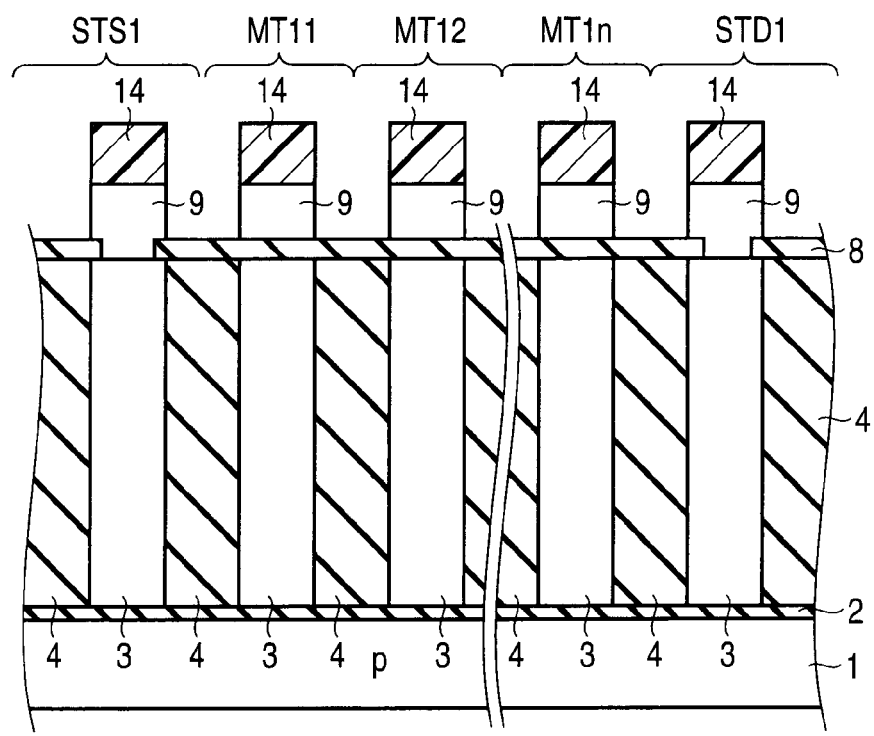

(j) The upper surface of the control gate electrode layer 9 is coated with a resist film 14, and the resist film 14 is patterned by using photolithography. Subsequently, as shown in FIGS. 19A and 19B, the patterned resist films 14 are used as masks to selectively remove portions of the control gate electrode layer 9 in the row direction by RIE, thereby forming control gate electrodes 9 and select gate electrodes 9.

(k) Then, an interlayer dielectric film is deposited by CVD or the like, the upper surface of the interlayer dielectric film is coated with a resist film, and the resist film is patterned by using photolithography. The patterned resist films are used as masks to form openings (contact holes) extending through the interlayer dielectric film and reaching the source regions 55 and drain regions 56 by RIE or the like. After that, source line contact plugs 61, 62, 63, ..., 6m and bit line contact plugs 71, 72, ..., 7m shown in FIG. 1 are buried in the source regions 55 and drain regions 56 in the openings (contact holes) by, e.g., CVD. Finally, predetermined interconnections, insulating films, and the like are formed and deposited to complete the semiconductor memory.

(First Modification)

A modification of a method of manufacturing the semiconductor memory will be explained below as the first modification of the first embodiment of the present invention.

In the embodiment of the present invention as shown in FIGS. 14A and 14B, the gate insulating films (tunnel oxide films) 3a are formed on the side surfaces of the floating gate electrodes 3 by thermal oxidation. If the floating gate electrode 3 is made of polysilicon, the surface orientation variation of polysilicon sometimes makes the film thickness of the gate insulating film 3a nonuniform. To suppress the film thickness variation, therefore, the floating gate electrode 3 must be made of a single crystal. Accordingly, the floating gate electrodes 3 made of single-crystal Si are formed by solid-phase epitaxial growth or the like.

By contrast, in the first modification of the first embodiment of the present invention, the gate insulating films (tunnel oxide films) 3a may also be formed by, e.g., radical oxidation, atomic layer deposition (ALD), low-pressure CVD (LP-CVD), or plasma CVD, instead of thermal oxidation, in the procedure shown in FIGS. 14A and 14B. By using radical oxidation, ALD, LP-CVD, plasma CVD, or the like, it is possible, even when the floating gate electrode 3 is made of polysilicon, to suppress the film thickness variation of the gate insulating film 3a caused by the surface orientation variation of polysilicon, and obtain the gate insulating film 3a having a uniform film thickness.

Also, in the procedure shown in FIGS. 9A and 9B, polysilicon may also be deposited as the floating gate electrode layer 3 by, e.g., LP-CVD, instead of forming the floating gate electrode layer 3 made of single-crystal Si by, e.g., solid-phase epitaxial growth. In this case, the gate insulating film (tunnel oxide film) 3a having a uniform film thickness can be obtained by using, e.g., radical oxidation or ALD in place of thermal oxidation.

Furthermore, in the procedure shown in FIGS. 9A and 9B, single-crystal Si may also be obtained by solid-phase growth after amorphous silicon is deposited as the first semiconductor layer 3. In this case, it is possible to form the gate insulating film (tunnel oxide film) 3a having a uniform film thickness by suppressing the film thickness variation by thermal oxidation as described above.

(Second Modification)

A modification of a method of manufacturing the semiconductor memory will be explained below as the second modification of the first embodiment of the present invention.

After the same procedures as those shown in FIGS. 9A and 9B to 15A and 15B, the upper surfaces of the second semiconductor layers 5 are coated with a resist film 15, and the resist film 15 is patterned by using photolithography. As shown in FIG. 20, the patterned resist films 15 are used as masks to perform, e.g., RIE, thereby making the upper-surface level of the second semiconductor layers 5 lower than that of the gate insulating films 3a, floating gate electrodes 3, and second element isolation insulating films 3b.

Then, an auxiliary insulating film 21 is deposited and removed in the direction of depth by CMP, thereby matching the upper-surface level of the auxiliary insulating films 21 with that of the gate insulating films 3a, floating gate electrodes 3, and second element isolation insulating films 3b as shown in FIG. 21.

Figure 22A:
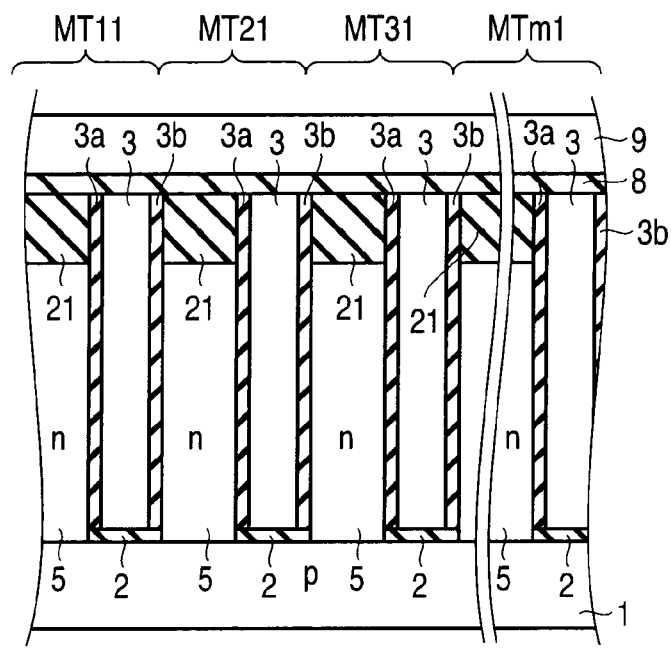
Figure 22B:
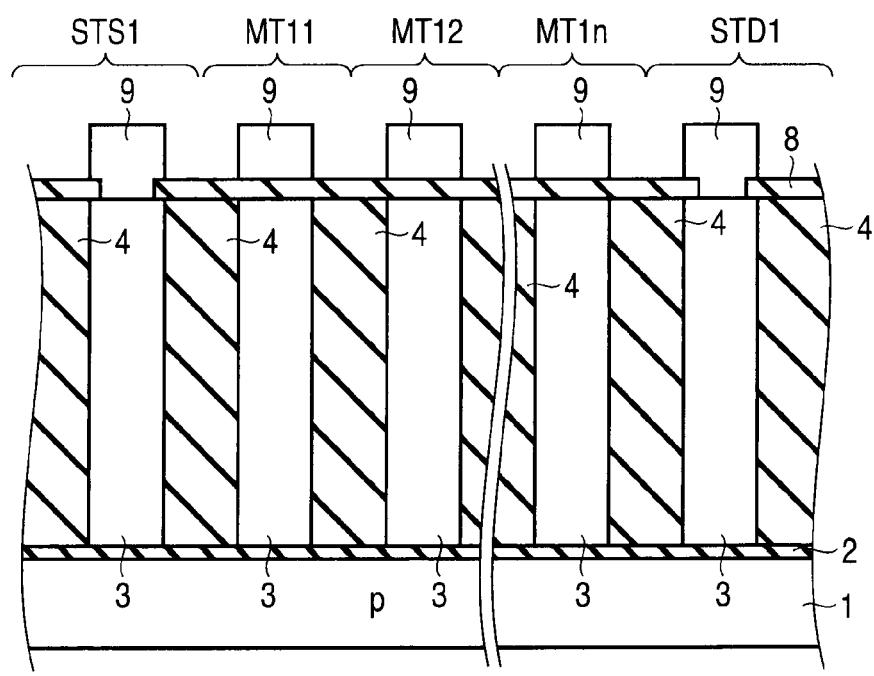

After that, the structure of a semiconductor memory as shown in FIGS. 22A and 22B is formed following the same procedures as those shown in FIGS. 16A and 16B to 19A and 19B.

As shown in FIGS. 22A and 22B, the auxiliary insulating films 21 are formed between the second semiconductor layers 5 and the inter-electrode dielectrics 8. This makes it possible to increase the distance between the second semiconductor layer 5 and the control gate electrode 9, and reduce the influence of the potential of the control gate electrode 9 on the second semiconductor layer 5.

(Third Modification)

A modification of a method of manufacturing the semiconductor memory will be explained below as the third modification of the first embodiment of the present invention.

After the same procedures as those shown in FIGS. 9A and 9B to 15A and 15B, the upper surfaces of the second semiconductor layers 5 are coated with a resist film 16, and the resist film 16 is patterned by using photolithography.

As shown in FIGS. 23A and 23B, the patterned resist films 16 are used as masks to perform, e.g., RIE, thereby making the upper-surface level of the second semiconductor layers 5 lower than that of the gate insulating films 3a, floating gate electrodes 3, and second element isolation insulating films 3b.

Then, an auxiliary insulating film 22 is deposited and removed in the direction of depth by CMP, thereby matching the upper-surface level of the auxiliary insulating films 22 with that of the gate insulating films 3a, floating gate electrodes 3, and second element isolation insulating films 3b.

Subsequently, the upper surfaces of the auxiliary insulating films 22, gate insulating films 3a, floating gate electrodes 3, and second element isolation insulating films 3b are coated with a resist film 17, and the resist film 17 is patterned by using photolithography. The patterned resist films 17 are used as masks to remove the auxiliary insulating films 22 in the direction of depth by, e.g., RIE, thereby making the upper-surface level of the auxiliary insulating films 22 lower than that of the gate insulating films 3a, floating gate electrodes 3, and second element isolation insulating films 3b as shown in FIGS. 24A and 24B.

Figure 25A:
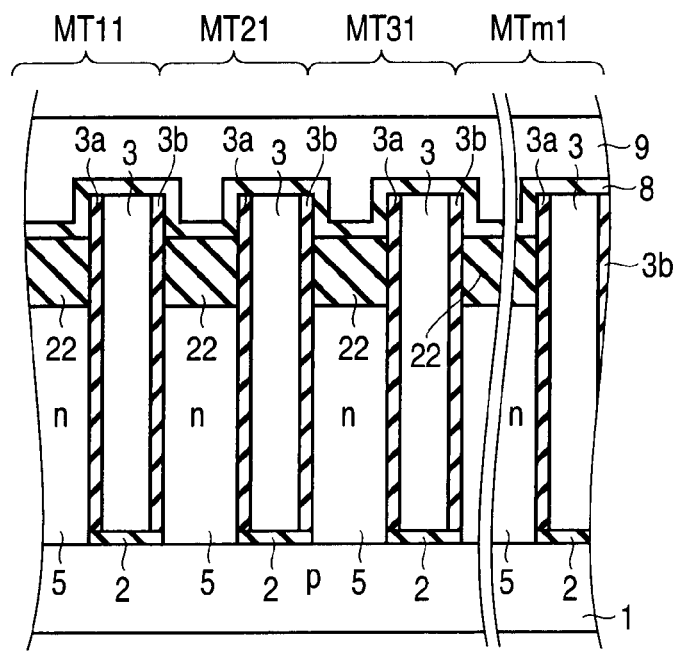
Figure 25B:
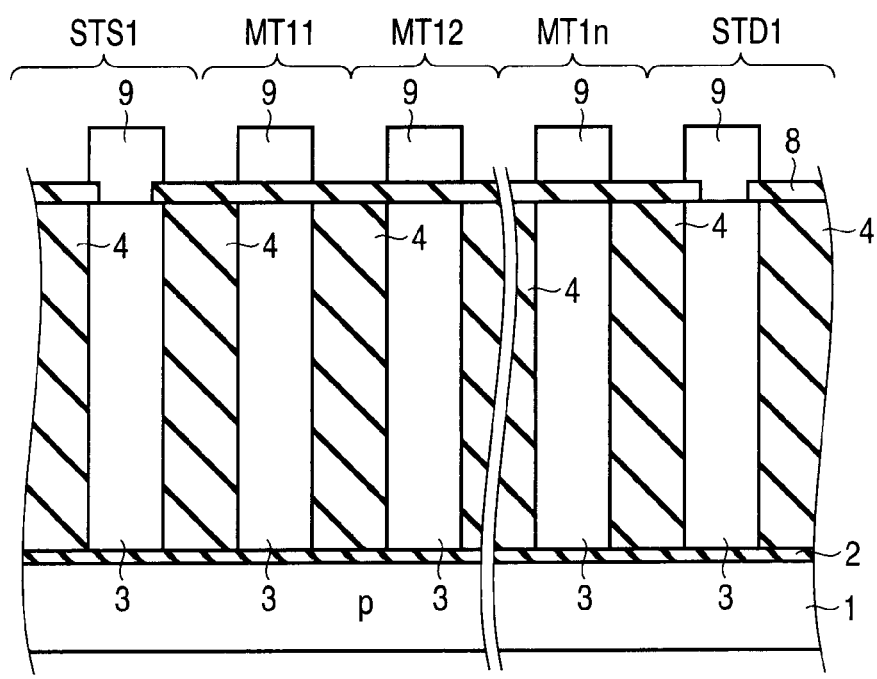

After that, the structure of a semiconductor memory as shown in FIGS. 25A and 25B is formed following the same procedures as those shown in FIGS. 16A and 16B to 19A and 19B.

As shown in FIGS. 25A and 25B, not only the upper end face of the floating gate electrode 3 faces the control gate electrode 9 with the inter-electrode dielectric 8 being interposed between them, but also portions of the side surfaces of the floating gate electrode 3 face the control gate electrode 9 with the inter-electrode dielectric 8, gate insulating film 3a, and second element isolation insulating film 3b being interposed between them. Since this increases the surface area in which the control gate electrode 9 faces the floating gate electrode 3, the coupling ratio can be increased.

(Fourth Modification)

A modification of a method of manufacturing the semiconductor memory will be explained below as the fourth modification of the first embodiment of the present invention.

After the same procedures as those shown in FIGS. 9A and 9B to 15A and 15B, the upper surfaces of the second semiconductor layers 5 are coated with a resist film 18, and the resist film 18 is patterned by using photolithography.

As shown in FIGS. 26A and 26B, the patterned resist films 18 are used as masks to perform, e.g., RIE, thereby making the upper-surface level of the second semiconductor layers 5 lower than that of the gate insulating films 3a, floating gate electrodes 3, and second element isolation insulating films 3b.

Then, an auxiliary insulating film 23 is deposited and removed in the direction of depth by CMP, thereby matching the upper-surface level of the auxiliary insulating films 23 with that of the gate insulating films 3a, floating gate electrodes 3, and second element isolation insulating films 3b. Subsequently, the upper surfaces of the auxiliary insulating films 23, gate insulating films 3a, floating gate electrodes 3, and second element isolation insulating films 3b are coated with a resist film 19, and the resist film 19 is patterned by using photolithography. The patterned resist films 19 are used as masks to remove the auxiliary insulating films 23 in the direction of depth by, e.g., RIE, thereby making the upper-surface level of the auxiliary insulating films 23 lower than that of the gate insulating films 3a, floating gate electrodes 3, and second element isolation insulating films 3b as shown in FIG. 27A. At the same time, the upper-surface level of the first element isolation insulating films 4 is made lower than that of the first semiconductor layers 3, as shown in FIG. 27B.

After that, the structure of a semiconductor memory as shown in FIGS. 28A and 28B is formed following the same procedures as those shown in FIGS. 16A and 16B to 19A and 19B.

As shown in FIG. 28A, not only the upper end face of the floating gate electrode 3 faces the control gate electrode 9 with the inter-electrode dielectric 8 being interposed between them, but also portions of the side surfaces of the floating gate electrode 3 in the row direction face the control gate electrode 9 with the inter-electrode dielectric 8, gate insulating film 3a, and second element isolation insulating film 3b being interposed between them. In addition, as shown in FIG. 28B, portions of the side surfaces of the floating gate electrode 3 in the column direction face the control gate electrode 9 with the inter-electrode dielectric 8 being interposed between them. Since this increases the surface area in which the control gate electrode 9 faces the floating gate electrode 3, the coupling ratio can be increased.

(Fifth Modification)

When the source line contact plugs $61, 62, \ldots, 6m$ and bit line contact plugs $71, 72, \ldots, 7m$ are arranged straight as shown in FIG. 1, the process variations or the like may short-circuit adjacent ones of the source line contact plugs $61, 62, \ldots, 6m$ and adjacent ones of the bit line contact plugs $71, 72, \ldots, 7m$.

Figure 29:
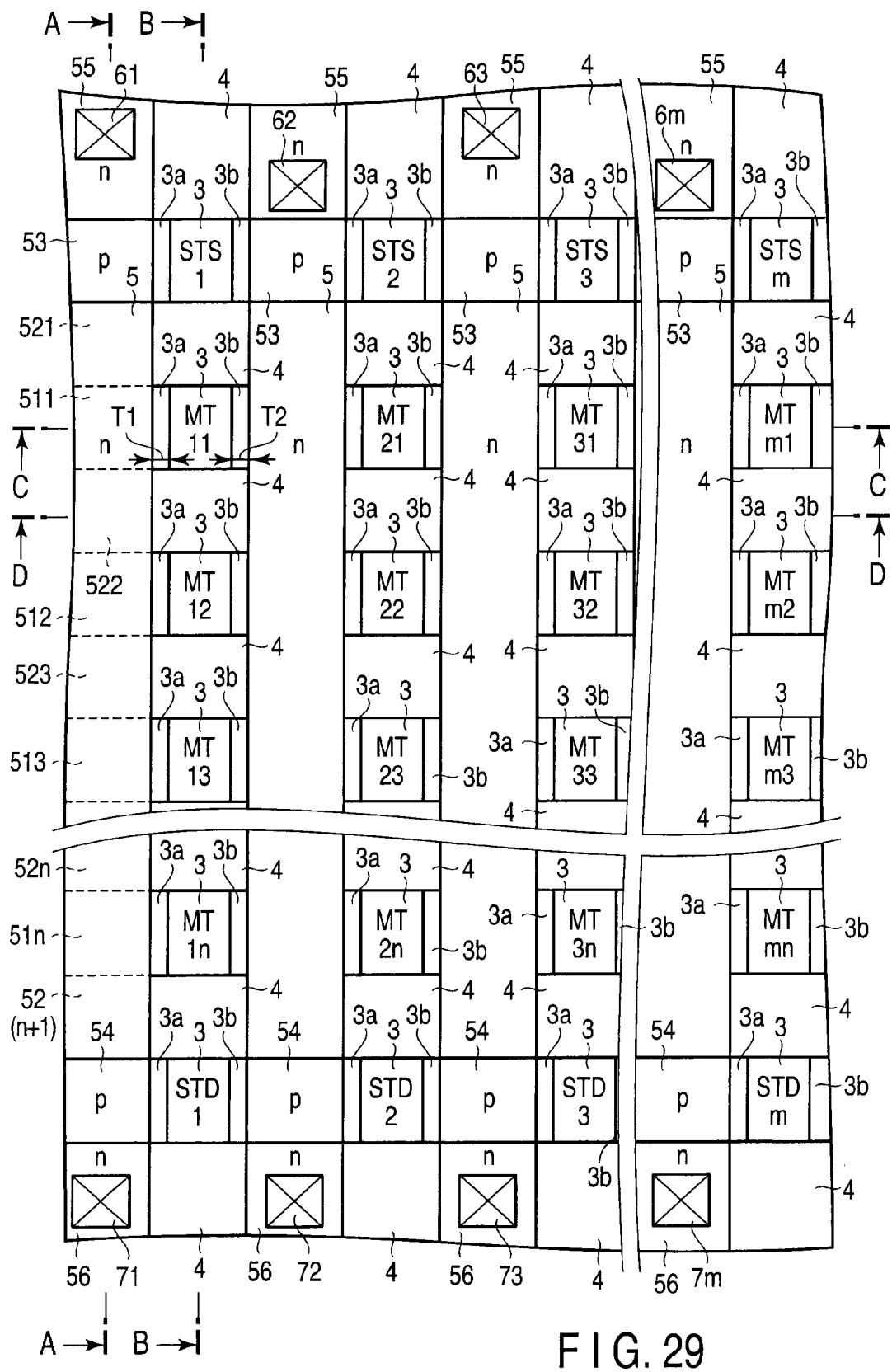
FIG. 29 is a sectional view showing a semiconductor memory of a fifth modification of the first embodiment.

As the fifth modification of the first embodiment of the present invention, therefore, as shown in FIG. 29, the source line contact plugs $61, 62, \ldots, 6m$ and bit line contact plugs $71, 72, \ldots, 7m$ are staggered in the row direction, such that adjacent ones of the source line contact plugs $61, 62, \ldots, 6m$ and adjacent ones of the bit line contact plugs $71, 72, \ldots, 7m$ are arranged in different positions in the column direction. This makes it possible to prevent shortcircuits between adjacent ones of the source line contact plugs $61, 62, \ldots, 6m$ and adjacent ones of the bit line contact plugs $71, 72, \ldots, 7m$.

Second Embodiment

As a semiconductor memory according to the second embodiment of the present invention, a memory in which a memory cell transistor has a metal/oxide film/nitride film/oxide film/silicon (MONOS) structure will be explained below.

FIG. 30A is a sectional view taken along a line C-C in FIGS. 1 and 29. FIG. 30B is a sectional view taken along a line B-B in FIGS. 1 and 29.

As shown in FIG. 30A, each of memory cell transistors $MT_{11}$, $MT_{21}$, $MT_{31}$, ..., $MT_{m1}$ is a D MIS transistor having the MONOS structure. The memory cell transistor $MT_{11}$ includes an n-type channel region, n-type source region, and n-type drain region formed in a second semiconductor layer 5, and a gate portion formed on the side surface of the channel region in the row direction.

The gate portion includes a multilayered gate insulating film including an oxide film 35, nitride film 34, and oxide film 33 stacked upright on the upper surface of a semiconductor substrate 1 along the side surface of the channel region in the row direction, and a gate electrode 31 formed on the multilayered gate insulating film on the side surface of the channel region in the row direction. The nitride film 34 functions as a charge storage layer. The gate electrode 31 is connected to a gate interconnection 30. Second element isolation insulating films 32 isolate the memory cell transistors $MT_{11}$, $MT_{12}$, $MT_{31}$, ..., $MT_{m1}$ from each other in the row direction.

As shown in FIG. 30B, the gate electrodes 31 of the memory cell transistors $MT_{11}$, $MT_{12}$, ..., $MT_{1n}$ and first element isolation insulating films 4 are alternately arranged in the column direction.

As shown in FIG. 30A, a film thickness T3 of the oxide film 35 in the row direction is smaller than a film thickness T4 of the second element isolation insulating film 32 in the row direction. Therefore, a voltage is hardly applied to the second element isolation insulating film 32 and readily applied to the oxide film 35. This enables selective data write.

The film thickness of the second element isolation insulating film 32 is preferably larger than that of the multilayered gate insulating film including the oxide film 33, nitride film 34, and oxide film 35. As long as this condition is met, the structure of the second element isolation insulating film 32 may also be the same as the structure (ONO structure) of the multilayered gate insulating film.

The semiconductor memory according to the second embodiment of the present invention can achieve practically the same effects as those of the stacked gate structure although the memory has the MONOS structure.

A method of manufacturing the semiconductor memory according to the second embodiment of the present invention will be explained below.

FIGS. 31A, 32A, ..., 37A are sectional views taken along a line A-A in FIG. 1 and showing the steps in the column direction. FIGS. 31B, 32B, ..., 37B are sectional views taken along a line B-B in FIG. 1 and showing the steps in the row direction.

(a) As shown in FIGS. 31A and 31B, a single-crystal, p-type semiconductor substrate 1 is prepared. A buried insulating film 2 about 30 to 40 nm thick made of an $SiO_2$ film or the like is formed on the upper surface of the semiconductor substrate 1 by, e.g., CVD or thermal oxidation. A metal film (gate electrode layer) 31 is deposited on the upper surface of the buried insulating film 2 by, e.g., sputtering.

(b) Then, the upper surface of the gate electrode layer 31 is spin-coated with a resist film 41, and an etching mask of the resist film 41 is formed by using photolithography. Portions of the gate electrode layer 31 are selectively removed in the row direction by RIE using the etching mask. Consequently, first trenches 31x extending in the row direction are formed as shown in FIGS. 32A and 32B. After that, the resist films 41 are removed by using a resist remover or the like.

(c) First element isolation insulating films 4 are buried in the first trenches 31x by CVD or the like. The upper-surface level of the first element isolation insulating films 4 is lowered by CMP. Consequently, as shown in FIGS. 33A and 33B, the upper-surface level of the first element isolation insulating films 4 matches that of the gate electrode layers 31.

Figure 34A:
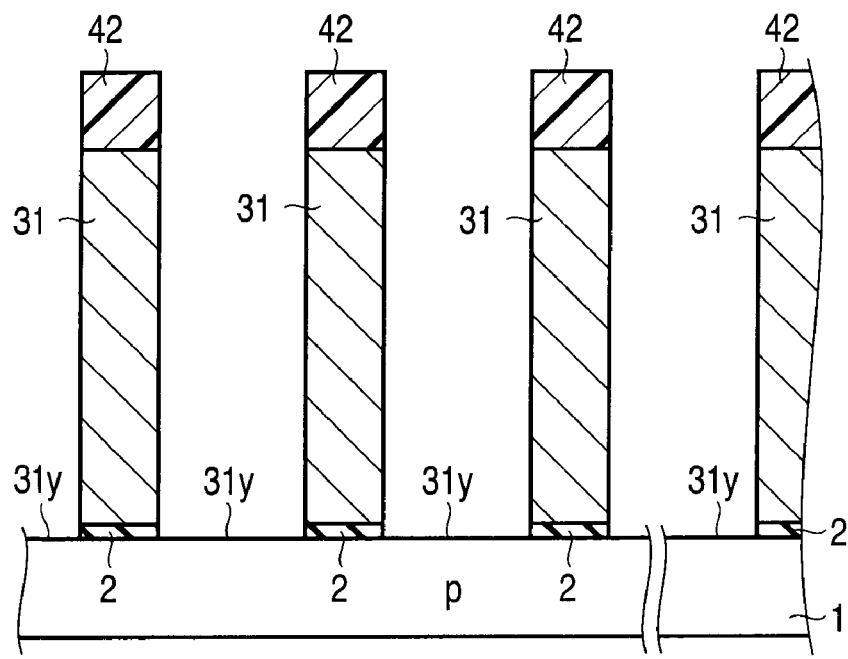
Figure 34B:
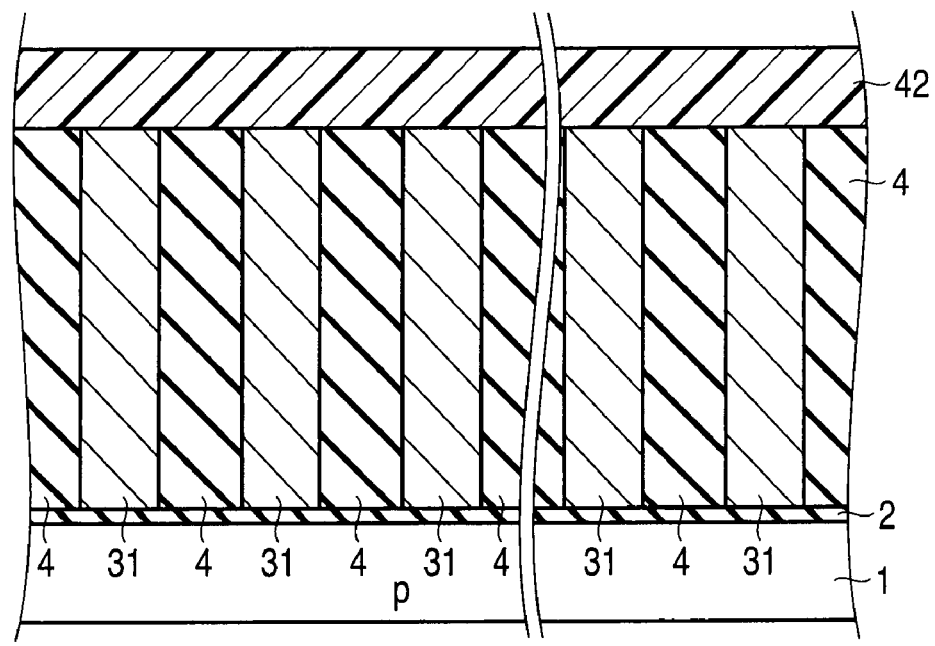

(d) The upper surfaces of the gate electrode layers 31 and first element isolation insulating films 4 are spin-coated with a resist film 42, and an etching mask of the resist film 42 is formed by using photolithography. Portions of the gate electrode layers 31 and first element isolation insulating films 4 are selectively removed in the column direction by RIE using the etching mask. Consequently, second trenches 31y extending in the column direction are formed as shown in FIGS. 34A and 34B.

Figure 35A:
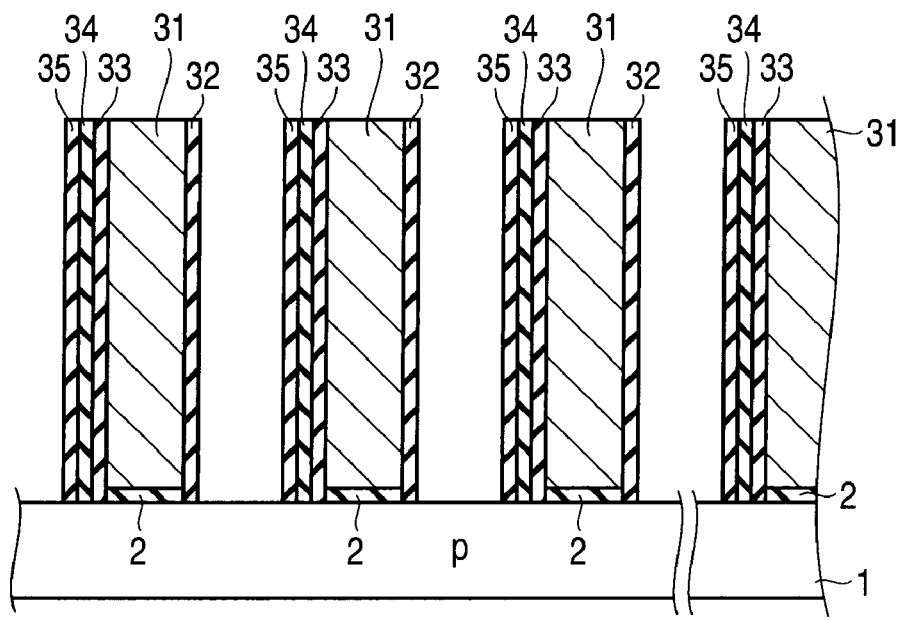
Figure 35B:
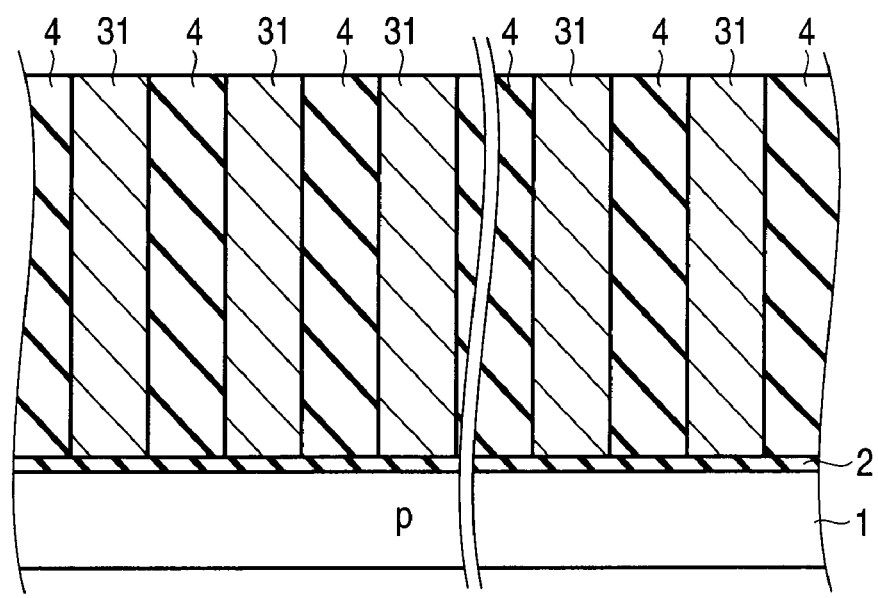

(e) As shown in FIGS. 35A and 35B, a first oxide film 33, a nitride film 34 as a charge storage layer, and a second oxide film 35 are stacked on the first side surface of the gate electrode layer 31. Also, a second element isolation insulating film 32 thicker than the second oxide film 35 is formed on the second side surface of the gate electrode layer 31.

Figure 37A:
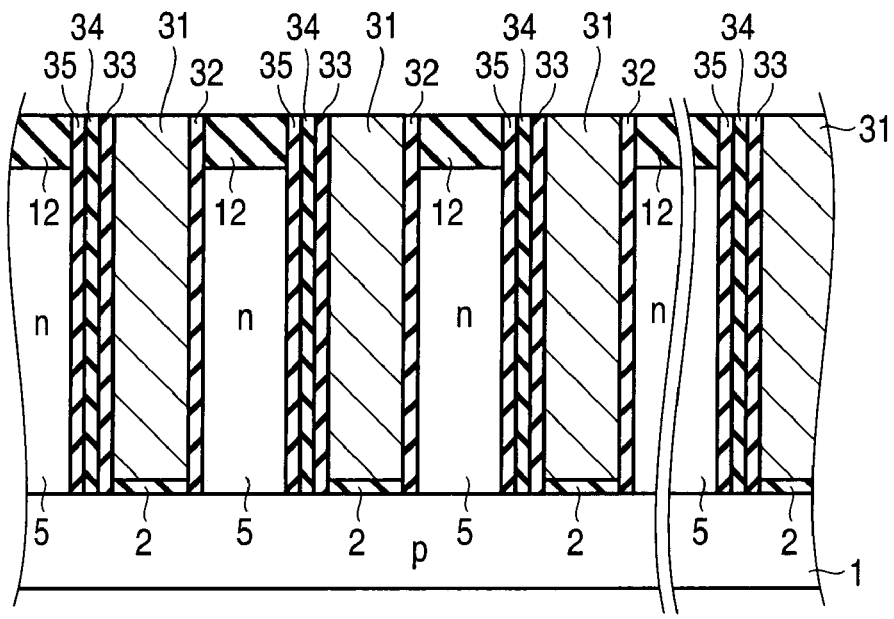
Figure 37B:
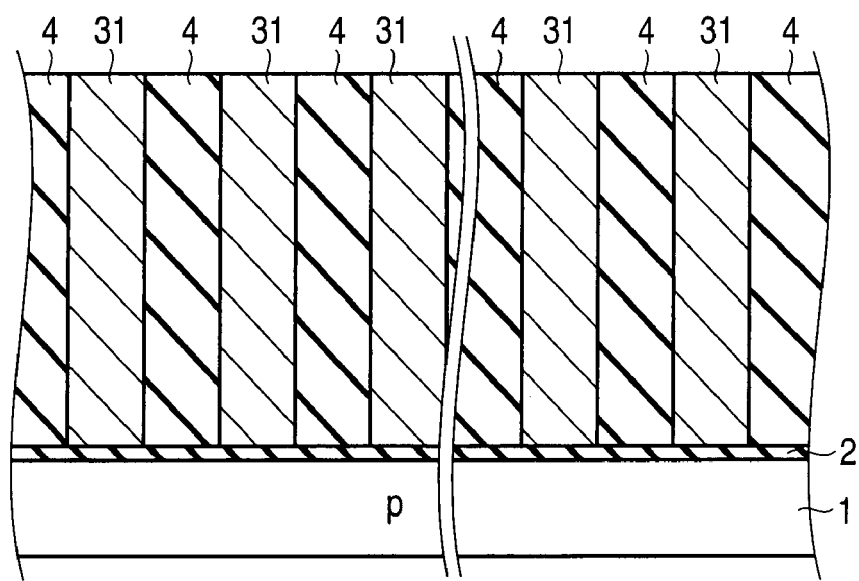

(f) As shown in FIGS. 36A and 36B, first-conductivity-type semiconductor layers 5 for forming the source and drain regions of memory cell transistors are formed in the second trenches 31y so as to be adjacent to the second oxide films. As shown in FIGS. 37A and 37B, auxiliary insulating films 12 are buried on the upper surfaces of the semiconductor layers 5. After that, gate interconnections 30 shown in FIGS. 30A and 30B are formed. Finally, predetermined interconnections, insulating films, and the like are formed and deposited to complete the semiconductor memory.

Third Embodiment

The third embodiment of the present invention is a modification of the second embodiment.

Similar to the second embodiment, a memory cell transistor has a metal/oxide film/nitride film/oxide film/silicon (MONOS) structure.

The third embodiment differs from the second embodiment in that a second element isolation insulating film has the same structure (ONO structure) as that of a multilayered gate insulating film.

Figure 38:
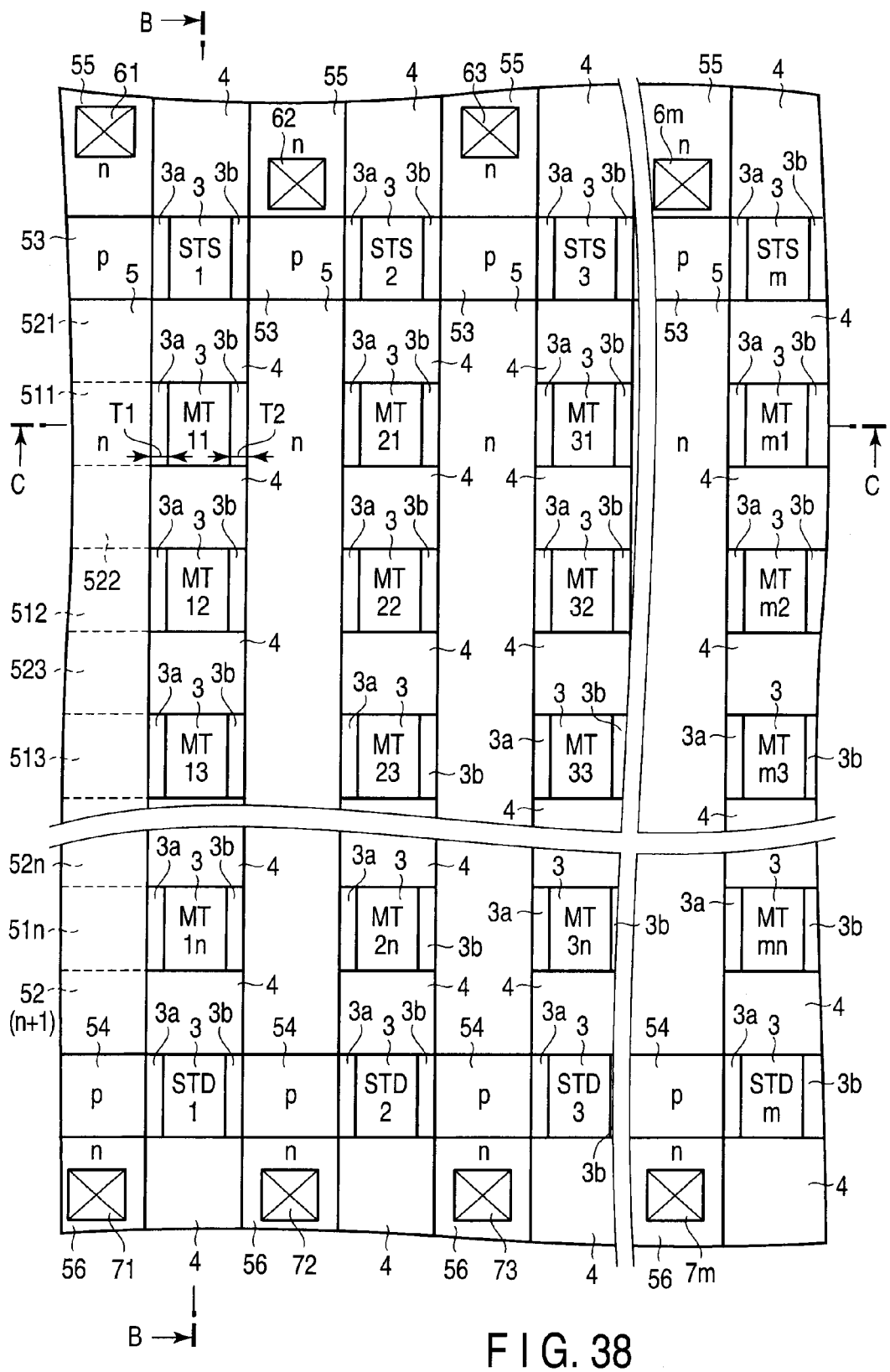
FIG. 38 is a plan view showing a third embodiment.

FIG. 38 is a plan view of the third embodiment. FIG. 39A is a sectional view taken along a line C-C in FIG. 38. FIG. 39B is a sectional view taken along a line B-B in FIG. 38.

Each of memory cell transistors $MT_{11}$, $MT_{21}$, $MT_{31}$, ..., $MT_{m1}$ is a D MIS transistor having the MONOS structure. The memory cell transistor $MT_{11}$ includes an n-type channel region, n-type source region, and n-type drain region formed in a second semiconductor layer 5, and a gate portion formed on the side surface of the channel region in the row direction.

The gate portion includes a multilayered gate insulating film including an oxide film 33, nitride film 34, and oxide film 35 stacked upright on the upper surface of a semiconductor substrate 1 along the side surface of the channel region in the row direction, and a gate electrode 31 formed on the multilayered gate insulating film on the side surface of the channel region in the row direction. The nitride film 34 functions as a charge storage layer. The gate electrode 31 is connected to a gate interconnection 30.

Second element isolation insulating films 32 each including an oxide film 33, nitride film 34, and oxide film 35 isolate the memory cell transistors $MT_{11}$, $MT_{12}$, $MT_{31}$, ..., $MT_{m1}$ from each other in the row direction. The important point is that a total thickness T4 of the oxide film 33, nitride film 34, and oxide film 35 as the second element isolation insulating film is larger than a total thickness T2 of the oxide film 33, nitride film 34, and oxide film 35 as the multilayered gate insulating film.

For example, when the thickness of the oxide film 33 as the second element isolation insulating film is larger than that of the oxide film 33 as the multilayered gate insulating film, the total thickness of the nitride film 34 and oxide film 35 as the second element isolation insulating film can be equal to that of the nitride film 34 and oxide film 35 as the multilayered gate insulating film.

Of the oxide film 33, nitride film 34, and oxide film 35 as the multilayered gate insulating film, therefore, the oxide film 33 can function as a tunnel insulating film, and the nitride film 34 can function as a charge storage layer. Also, all of the oxide film 33, nitride film 34, and oxide film 35 as the second element isolation insulating film can function as element isolation insulating films.

A method of manufacturing the semiconductor memory according to the third embodiment of the present invention will be explained below.

FIGS. 40A, 41A, ..., 46A illustrate sections taken along a line A-A in FIG. 38. FIGS. 40B, 41B, ..., 46B illustrate sections taken along a line B-B in FIG. 38.

(a) As shown in FIGS. 40A and 40B, a single-crystal, p-type semiconductor substrate 1 is prepared. A buried insulating film 2 about 30 to 40 nm thick made of an $SiO_2$ film or the like is formed on the upper surface of the semiconductor substrate 1 by, e.g., CVD or thermal oxidation. A metal film (gate electrode layer) 31 is deposited on the upper surface of the buried insulating film 2 by, e.g., sputtering.

(b) Then, the upper surface of the gate electrode layer 31 is spin-coated with a resist film 41, and an etching mask of the resist film 41 is formed by using photolithography. Portions of the gate electrode layer 31 are selectively removed in the row direction by RIE using the etching mask. Consequently, first trenches 31x extending in the row direction are formed as shown in FIGS. 41A and 41B. After that, the resist film 41 is removed by using a resist remover or the like.

(c) First element isolation insulating films 4 are buried in the first trenches 31x by CVD or the like. The upper-surface level of the first element isolation insulating films 4 is lowered by CMP. Consequently, as shown in FIGS. 42A and 42B, the upper-surface level of the first element isolation insulating films 4 matches that of the gate electrode layers 31.

Figure 43A:
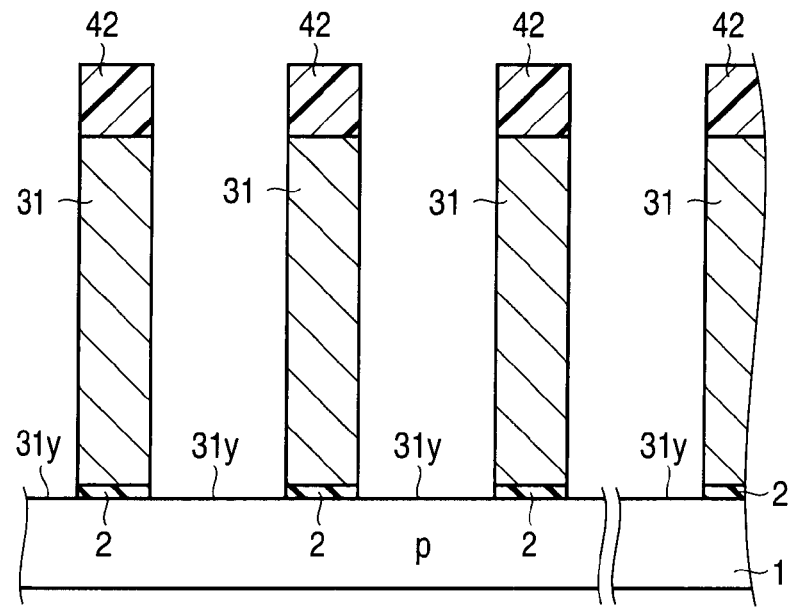
Figure 43B:
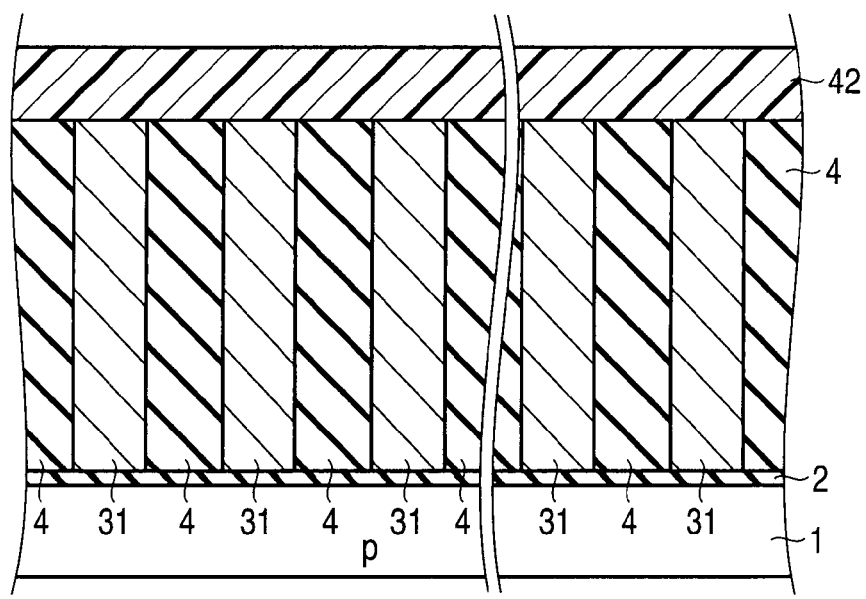

(d) The upper surfaces of the gate electrode layers 31 and first element isolation insulating films 4 are spin-coated with a resist film 42, and an etching mask of the resist film 42 is formed by using photolithography. Portions of the gate electrode layers 31 and first element isolation insulating films 4 are selectively removed in the column direction by RIE using the etching mask. Consequently, second trenches 31y extending in the column direction are formed as shown in FIGS. 43A and 43B.

(e) As shown in FIGS. 44A and 44B, an oxide film 33, a nitride film 34 as a charge storage layer, and an oxide film 35 are stacked on the first side surface of the gate electrode layer 31. Also, an oxide film 33 thicker than the oxide film 33 on the first side surface, a nitride film 34, and an oxide film 35 are stacked on the second side surface of the gate electrode layer 31.

Figure 45A:
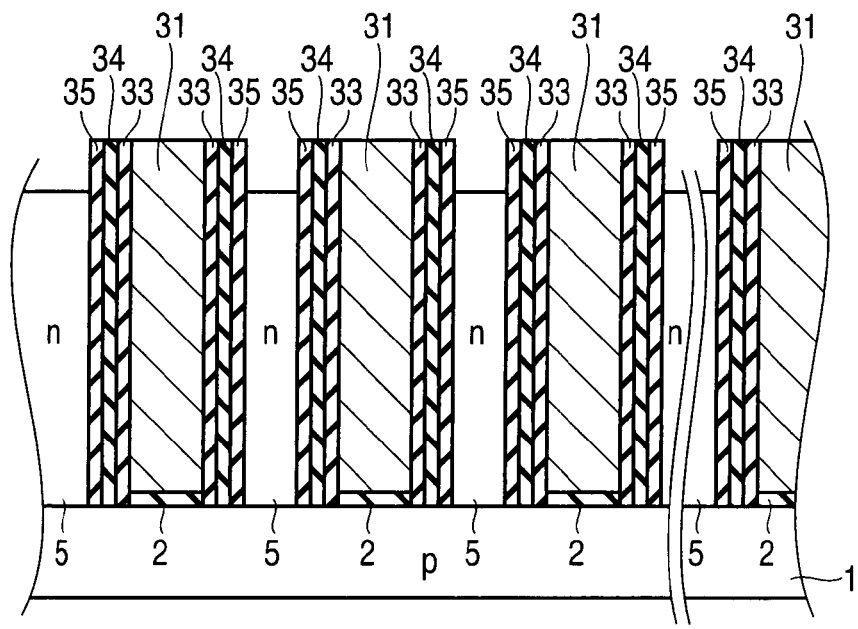
Figure 45B:
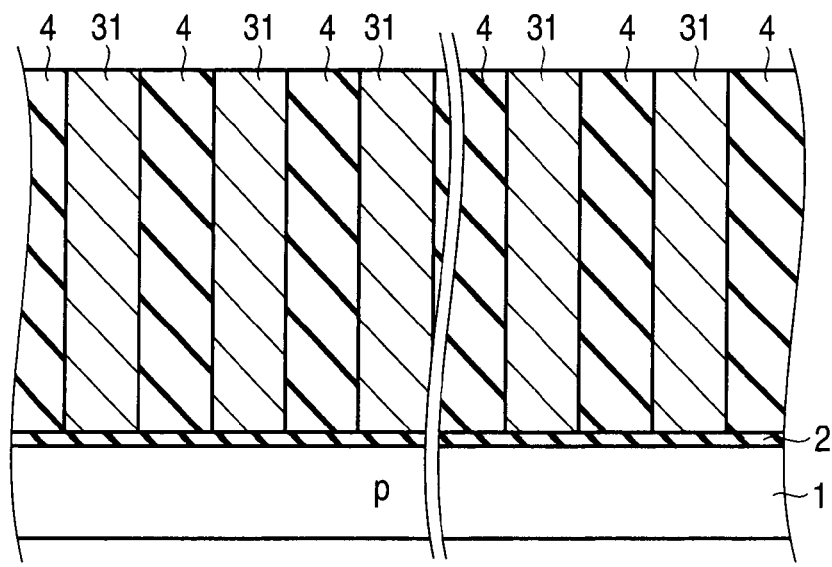
Figure 46A:
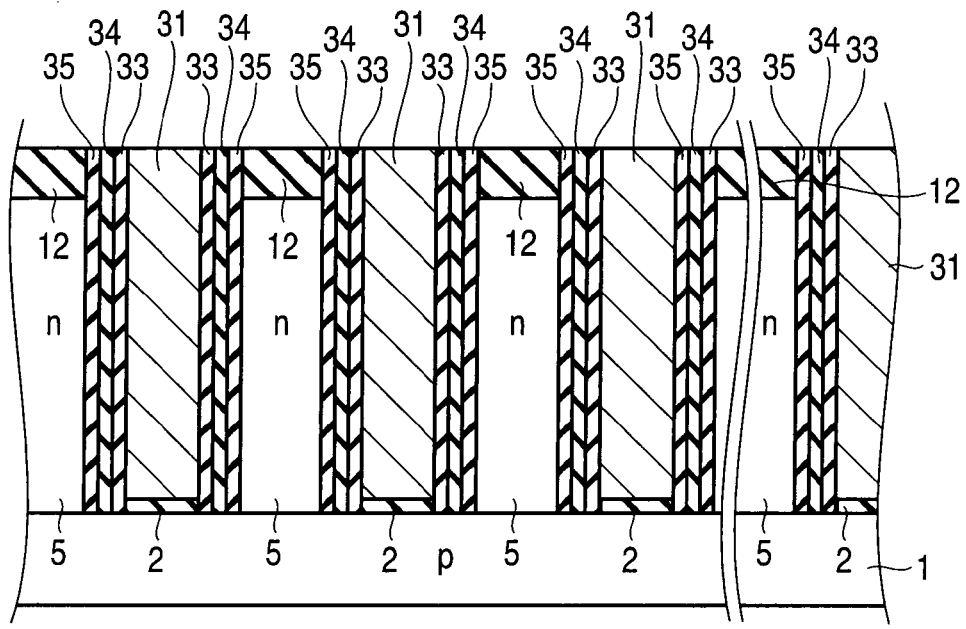
Figure 46B:
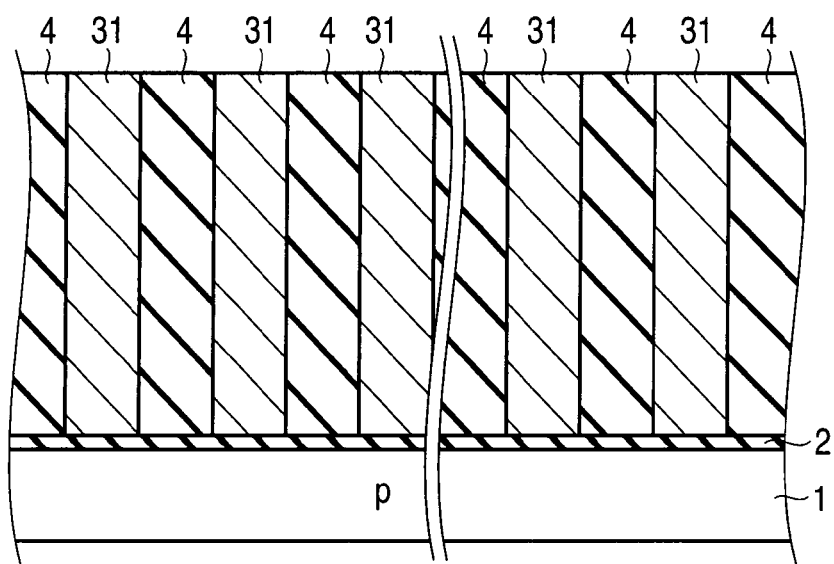

(f) As shown in FIGS. 45A and 45B, first-conductivity-type semiconductor layers 5 for forming the source and drain regions of memory cell transistors are formed in the second trenches 31y. As shown in FIGS. 46A and 46B, auxiliary insulating films 12 are buried on the upper surfaces of the semiconductor layers 5. After that, gate interconnections 30 shown in FIGS. 39A and 39B are formed. Finally, predetermined interconnections, insulating films, and the like are formed and deposited to complete the semiconductor memory.

Other Embodiments

Although the present invention has been described by the first to third embodiments, it should not be understood that the description and drawings forming a part of this disclosure limit the invention. From this disclosure, various alternative embodiments, examples, and operating techniques will become apparent to those skilled in the art.

For example, in the explanation of the first to third embodiments of the present invention, the m×n memory cell transistors $MT_{11}, MT_{12}, \ldots, MT_{1n}, MT_{21}, MT_{22}, \ldots, MT_{2n}, MT_{31}, MT_{32}, \ldots, MT_{3n}, MT_{m1}, MT_{m2}, \ldots, MT_{mn}$ are disclosed. In reality, however, the cell array may also be formed by a larger number of memory cell transistors.

Also, the buried insulating film 2 may also be formed on the upper surface of a p-type well region (p-well) formed in the upper portion of an n-type semiconductor substrate, instead of the p-type semiconductor substrate 1.

Furthermore, in the first to third embodiments of the present invention, the operation of writing quaternary data in the memory cell transistors $MT_{11}, MT_{12}, \ldots, MT_{1n}, MT_{21}, MT_{22}, \ldots, MT_{2n}, MT_{31}, MT_{32}, \ldots, MT_{3n}, MT_{m1}, MT_{m2}, \ldots, MT_{mn}$ has been explained. However, it is also possible to write multilevel data such as binary data, ternary data, or data having five values or more.

In the second and third embodiments of the present invention, the multilayered gate insulating film including the oxide film 35, nitride film 34, and oxide film 33 has been explained. However, the multilayered gate insulating film may also have a multilayered structure formed by four layers or more including a charge storage layer.

As described above, the present invention of course includes various embodiments and the like not described in this specification. Accordingly, the technical scope of the present invention is determined solely by the specified items of the invention according to the scope of the appended claims appropriate from the above explanation.

(Effects)

The effects of the present invention will be explained below.

FIG. 47 shows the semiconductor memory according to the first embodiment.

A plurality of active areas AA having a fin shape are arranged at a predetermined pitch in the first direction, and extend in the second direction perpendicular to the first direction. Bit line contacts BC connect the active areas AA to bit lines BL.

A control gate electrode (word line) CG runs in the first direction. A structure immediately below the control gate electrode CG is as shown in FIG. 48. Referring to FIG. 48, the active areas are not shown and replaced with spaces in order to facilitate understanding the structure.

A tunnel insulating film TF is formed at one end (the right side) of a floating gate electrode FG in the first direction. An insulating film I thicker than the tunnel insulating film TF is formed at the other end (the left side) of the floating gate electrode FG in the first direction. That is, the tunnel insulating film TF contributes to the injection/release of electric charge with respect to the floating gate electrode FG, but the insulating film I does not contribute to the injection/release of electric charge with respect to the floating gate electrode FG.

The tunnel insulating film TF and insulating film I can simultaneously be formed by using a thermal oxidation rate difference produced by impurity implantation. That is, for example, a thin tunnel insulting film TF and thick insulating film I can simultaneously be formed by performing thermal oxidation once by implanting an impurity in the surface region of the active area AA on the side of the insulating film I such that the impurity amount is larger than that on the side of the tunnel insulating film TF.

The control gate electrode CG is formed on an inter-electrode dielectric IED on the floating gate electrodes FG.

In the semiconductor memory having the above structure, depletion memory cells are formed along the active areas AA, and ON/OFF is controlled by the extension of depletion layers in the active areas AA. This makes it possible to suppress the short-channel effect of the unit array (e.g., the NAND string), and suppress the threshold variations of the memory cells.

Also, as shown in FIG. 49, a channel width W of the memory cell can be increased by increasing the height of the active area AA, i.e., the height of the fin. This increases the gate dominating ratio. Note that L is the gate length.

Furthermore, electric charge is injected in and released from only one end (the right side) of the floating gate electrode FG in the first direction. This facilitates controls the write and erase operations, and prevents a write error.

When performing the write or erase operation in a structure in which the tunnel insulating films TF are formed on the both ends (the right and left sides) of the floating gate electrode FG (i.e., in a structure in which the tunnel insulating film TF is formed instead of the insulating film I), electric charge is injected in or released from a memory cell selected in a selected active area (a memory cell at one end of the selected active area AA), and at the same time electric charge is injected in or released from an unselected memory cell in the selected active area AA (a memory cell at the other end of the selected active area AA).

Accordingly, the arrangement as described above is also possible. When performing data write or erase in this structure, however, control must be performed so that data of the unselected memory cell at the other end of the selected active area AA is temporarily saved in a memory circuit such as a latch circuit.

Furthermore, it is possible to increase the volume of the floating gate electrode FG by increasing the height of the active area AA, thereby decreasing a relative threshold voltage fluctuation caused by an electric charge leak. Also, the contact resistance between the active area AA and the bit line contact BC reduces in a structure in which the bottom of the bit line contact BC reaches the interior or bottom of the active area AA.

Figure 50:
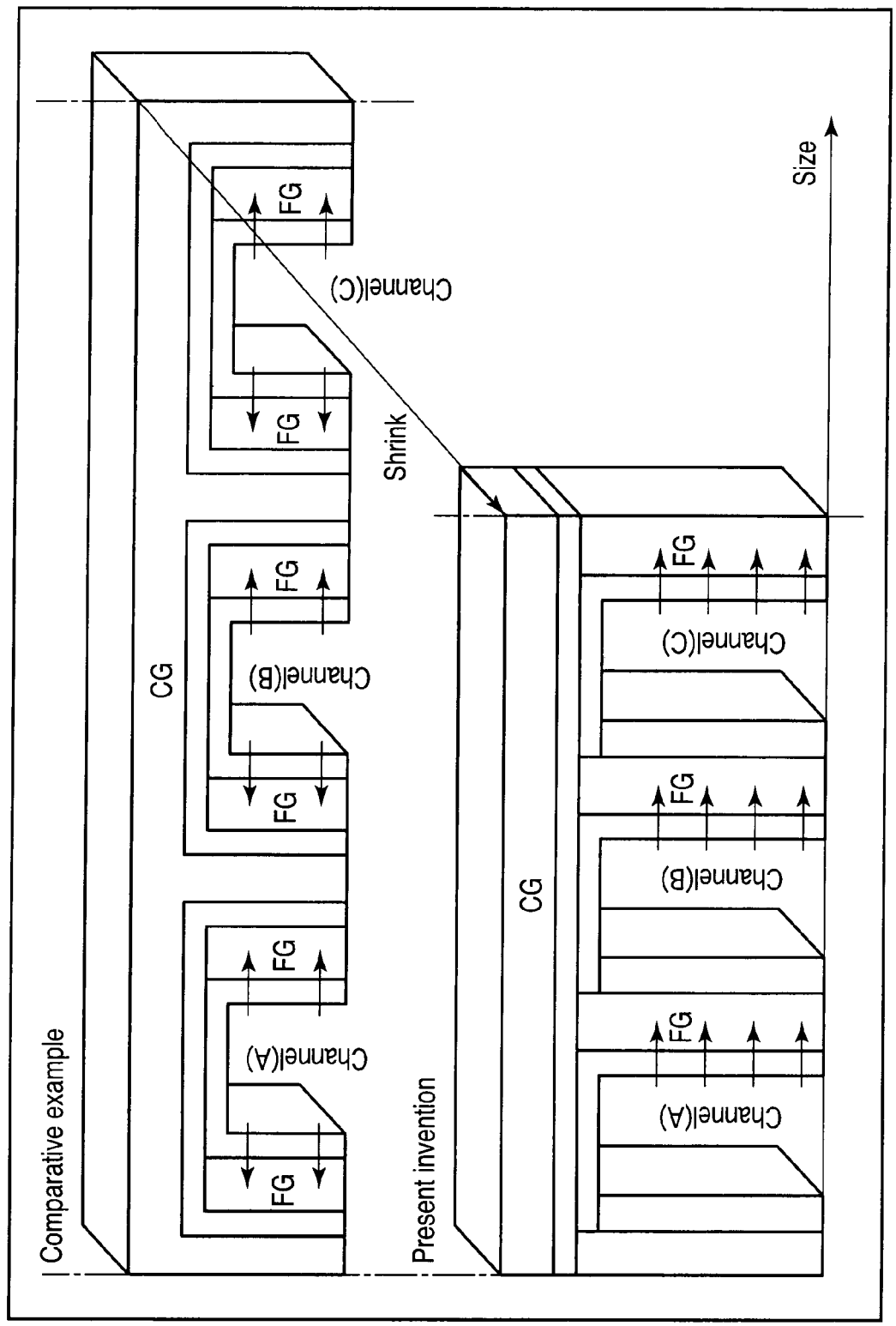
FIG. 50 is a view for comparing cell sizes of a comparative example and a present invention.

FIG. 50 shows the effect of downsizing according to the first embodiment.

A comparative example is characterized in that a control gate electrode CG exists between active areas (equivalent to spaces between floating gate electrodes FG). In this structure, two floating gate electrodes FG on the two sides of the active area form one memory cell.

In the structure of the present invention, one floating gate electrode FG on the right side of the active area (channel) forms one memory cell. In this structure, the volume of the floating gate electrode FG can be made equal to that of the comparative example by increasing the height of the floating gate electrode FG.

As described above, the present invention can greatly decrease the lateral size per memory cell while ensuring a sufficient gate width, by extending the floating gate electrode FG of the memory cell in the direction of height.

FIG. 51 shows the semiconductor memory according to the second and third embodiments.

In the second and third embodiments, the memory cell has the MONOS structure. ONO (Oxide/Nitride/Oxide) films exist on the two sides of the active area (equivalent to the space between the control gate electrodes CG) owing to the manufacturing process. These two ONO films are different in thickness of the oxide film in contact with the active area. Therefore, electric charge is injected in and released from a charge storage layer (nitride) at only one end (the right side) of the active area.

That is, in each of ONO films ONO(A)-R, ONO(B)-R, and ONO(C)-R at one end (the right side) of the active area, the oxide film in contact with the active area (channel) is thin, so electric charge is injected in and released from the charge storage layer (nitride). By contrast, in each of ONO films ONO(A)-L, ONO(B)-L, and ONO(C)-L at the other end (the left side) of the active area, the oxide film in contact with the active area (channel) is thick, so no electric charge is injected in and released from the charge storage layer (nitride).

Note that the oxide film of each of the ONO films ONO(A)-R, ONO(B)-R, and ONO(C)-R on the side of the control gate electrode CG is called a blocking insulating film, and blocks a leakage current in data write and erase.

The same effects as those of the first embodiment described above can be obtained in this arrangement as well. It is also possible to form ONO films having the same thickness at the two ends (the right and left sides) of the active area AA in the first direction and form memory cells on the two sides of these ONO films by using the control (the temporal saving of data of an unselected memory cell) explained in the effects of the first embodiment described above.

The present invention is effective to a NAND flash memory and an application using the same.

What is claimed is:

1. A semiconductor memory comprising:
   a semiconductor substrate;
   unit arrays obtained by arranging memory cell transistors in a column direction, and arranged in a row direction;
   a buried insulating film formed on a part of an upper surface of the semiconductor substrate; and
   a semiconductor layer formed on another part of the upper surface of the semiconductor substrate,
   wherein each of the memory cell transistors comprises:
   a first-conductivity-type source region, a first-conductivity-type drain region, and a first-conductivity-type channel region arranged in the semiconductor layer in the column direction;
   a gate portion formed on a side surface of the channel region in the row direction;
   a gate insulating film formed in the direction perpendicular to the upper surface of the semiconductor substrate along the side surface of the channel region in the row direction;
   a floating gate electrode formed on an upper surface of the buried insulating film, and formed on the gate insulating film on the side surface of the channel region in the row direction;
   an inter-electrode dielectric formed on an upper end face of the floating gate electrode;
   a control gate electrode formed on an upper surface of the inter-electrode dielectric, and extending in the row direction; and
   a first element isolation insulating film formed between the floating gate electrodes of the memory cell transistors.

2. The memory according to claim 1, wherein a gate width of the memory cell transistor is defined in a direction perpendicular to the upper surface of the semiconductor substrate, and a gate length of the memory cell transistor is defined in the column direction.

3. The memory according to claim 1, further comprising a second element isolation insulating film formed on a side surface of the floating gate electrode, which is opposite to a side surface adjacent to the gate insulating film.

4. The memory according to claim 3, wherein a film thickness of the gate insulating film in the row direction is smaller than that of the second element isolation insulating film in the row direction.

5. The memory according to claim 4, wherein the control gate electrode and the inter-electrode dielectric are formed on the upper surface of the semiconductor layer, and the memory further comprises an auxiliary insulating film formed between an upper surface of the semiconductor layer and the inter-electrode dielectric.

6. The memory according to claim 5, wherein an upper surface of the semiconductor layer is lower than that of the floating gate electrode, and an upper surface of the floating gate electrode and a side surface of the floating gate electrode face the control gate electrode.

7. The memory according to claim 6, further comprising a first select gate transistor formed at one end of the unit array.

8. The memory according to claim 7, wherein the first select gate transistor comprises:

a second-conductivity-type channel region, a first-conductivity-type source region, and a first-conductivity-type drain region formed on the upper surface of the semiconductor substrate; and a select gate electrode formed on the upper surface of the buried insulating film, and formed on a side surface of the channel region of the first select gate transistor.

9. The memory according to claim 8, further comprising a bit line contact plug buried such that a side surface and a bottom surface are in contact with the drain region of the first select gate transistor.

10. The memory according to claim 9, further comprising a second select gate transistor formed at the other end of the unit array.

11. The memory according to claim 10, wherein the second selection transistor comprises:

a second-conductivity-type channel region, a first-conductivity-type source region, and a first-conductivity-type drain region formed on the upper surface of the semiconductor substrate; and a select gate electrode formed on the upper surface of the buried insulating film, and formed on a side surface of the channel region of the second selection transistor.

12. The memory according to claim 11, further comprising a source line contact plug buried such that a side surface and a bottom surface are in contact with the source region of the second select gate transistor.

13. The memory according to claim 12, wherein the source line contact plug is formed in each unit array, and the source line contact plugs adjacent to each other in the row direction are formed in different positions in the column direction.

14. The memory according to claim 1, wherein the gate portion comprises:

a first oxide film, a nitride film as the charge storage layer, and a second oxide film stacked in the direction perpendicular to the upper surface of the semiconductor substrate along the side surface of the channel region in the row direction; and a gate electrode formed on the first oxide film, the nitride film, and the second oxide film on the side surface of the channel region in the row direction.

\* \* \* \* \*